US012557365B2

(12) United States Patent
Chien et al.

(10) Patent No.: US 12,557,365 B2
(45) Date of Patent: Feb. 17, 2026

(54) INTEGRATED CIRCUIT STRUCTURE AND METHOD FOR FABRICATING THE SAME

(71) Applicant: TAIWAN SEMICONDUCTOR MANUFACTURING COMPANY, LTD., Hsinchu (TW)

(72) Inventors: Ting-Jung Chien, Nantou County (TW); Jiun-Ming Kuo, Taipei (TW); Shih-Hao Fu, Taoyuan (TW); Yuan-Ching Peng, Hsinchu (TW); Yen-Po Lin, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 975 days.

(21) Appl. No.: 17/586,062

(22) Filed: Jan. 27, 2022

(65) Prior Publication Data

US 2023/0238448 A1    Jul. 27, 2023

(51) Int. Cl.
*H10D 64/01*   (2025.01)
*H10D 30/69*   (2025.01)
*H10D 62/10*   (2025.01)

(52) U.S. Cl.
CPC ......... *H10D 64/017* (2025.01); *H10D 30/797* (2025.01); *H10D 62/115* (2025.01); *H10D 62/119* (2025.01)

(58) Field of Classification Search
CPC ............. H10D 64/017; H10D 30/0273; H10D 30/797; H10D 62/119; H10D 62/115
See application file for complete search history.

(56) References Cited

U.S. PATENT DOCUMENTS

| 2017/0005195 A1* | 1/2017 | Ching | H10D 62/115 |
| 2021/0083090 A1* | 3/2021 | Wang | H10D 62/119 |
| 2022/0037521 A1* | 2/2022 | You | H10D 62/235 |

\* cited by examiner

*Primary Examiner* — Latanya N Crawford Eason
(74) *Attorney, Agent, or Firm* — Maschoff Brennan

(57) ABSTRACT

A method for fabricating an integrated circuit structure is provided. The method includes forming an epitaxial stack over a semiconductor substrate, wherein the epitaxial stack comprises a plurality of first epitaxial layers and a plurality of second epitaxial layers alternately arranged over the semiconductor substrate; patterning the epitaxial stack into a first fin and a second fin, wherein from a top view the first fin extends along a first direction, and the second fin has a first fin line extending along the first direction and a second fin line extending along a second direction different from the first direction; forming a first gate structure over a first portion of the first fin; etching a recess in a second portion of the first fin adjacent the first portion of the first fin; and forming a source/drain feature in the recess.

20 Claims, 48 Drawing Sheets

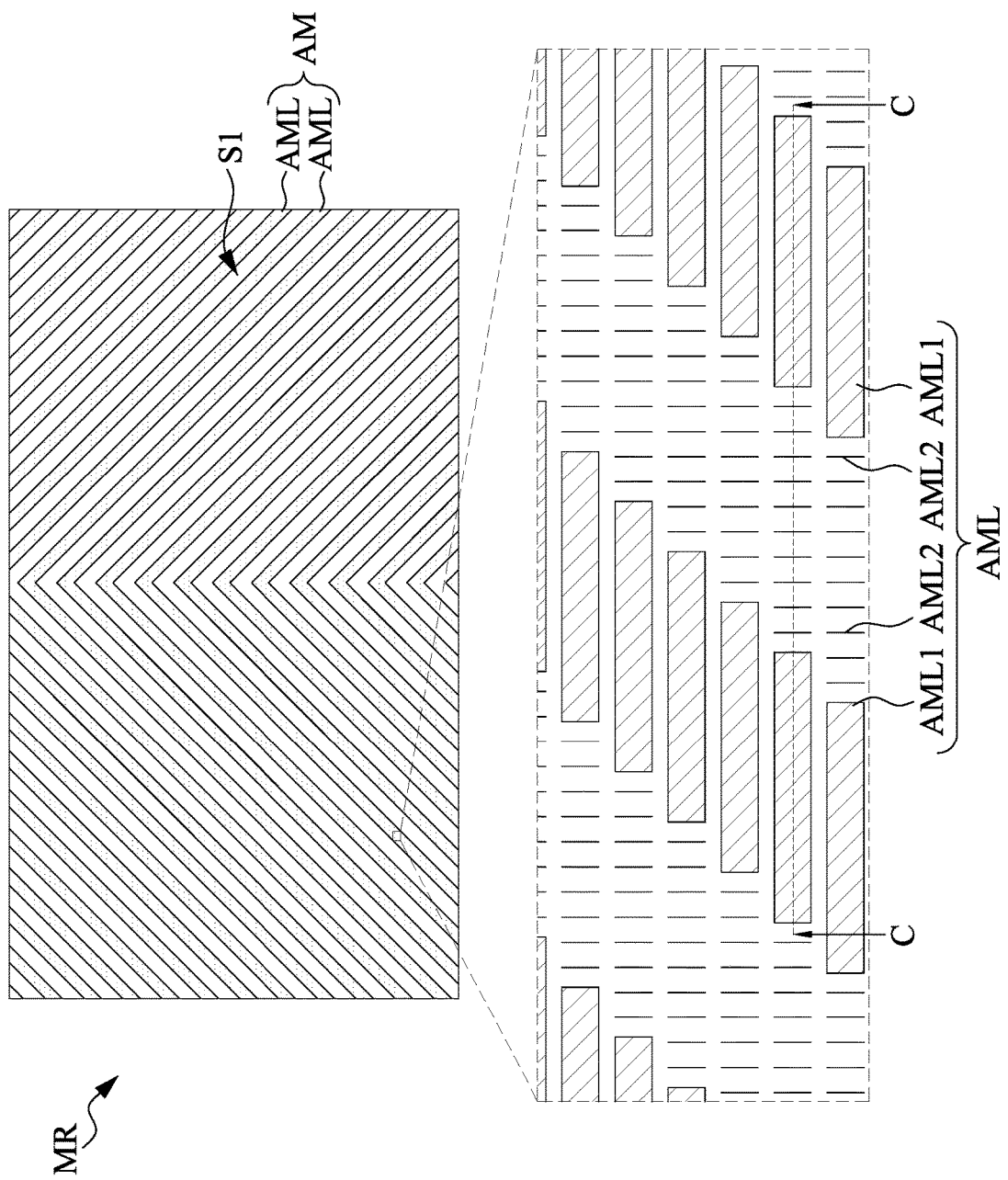

US 12,557,365 B2

INTEGRATED CIRCUIT STRUCTURE AND METHOD FOR FABRICATING THE SAME

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a gate-all-around (GAA) FET. In a GAA FET, all side surfaces of the channel region are surrounded by the gate electrode, which allows for fuller depletion in the channel region and results in less short-channel effects due to steeper sub-threshold current swing (SS) and smaller drain induced barrier lowering (DIBL).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 illustrates a schematic top view of a mark region of FIG. 1.

DETAILED DESCRIPTION

Figure 1:
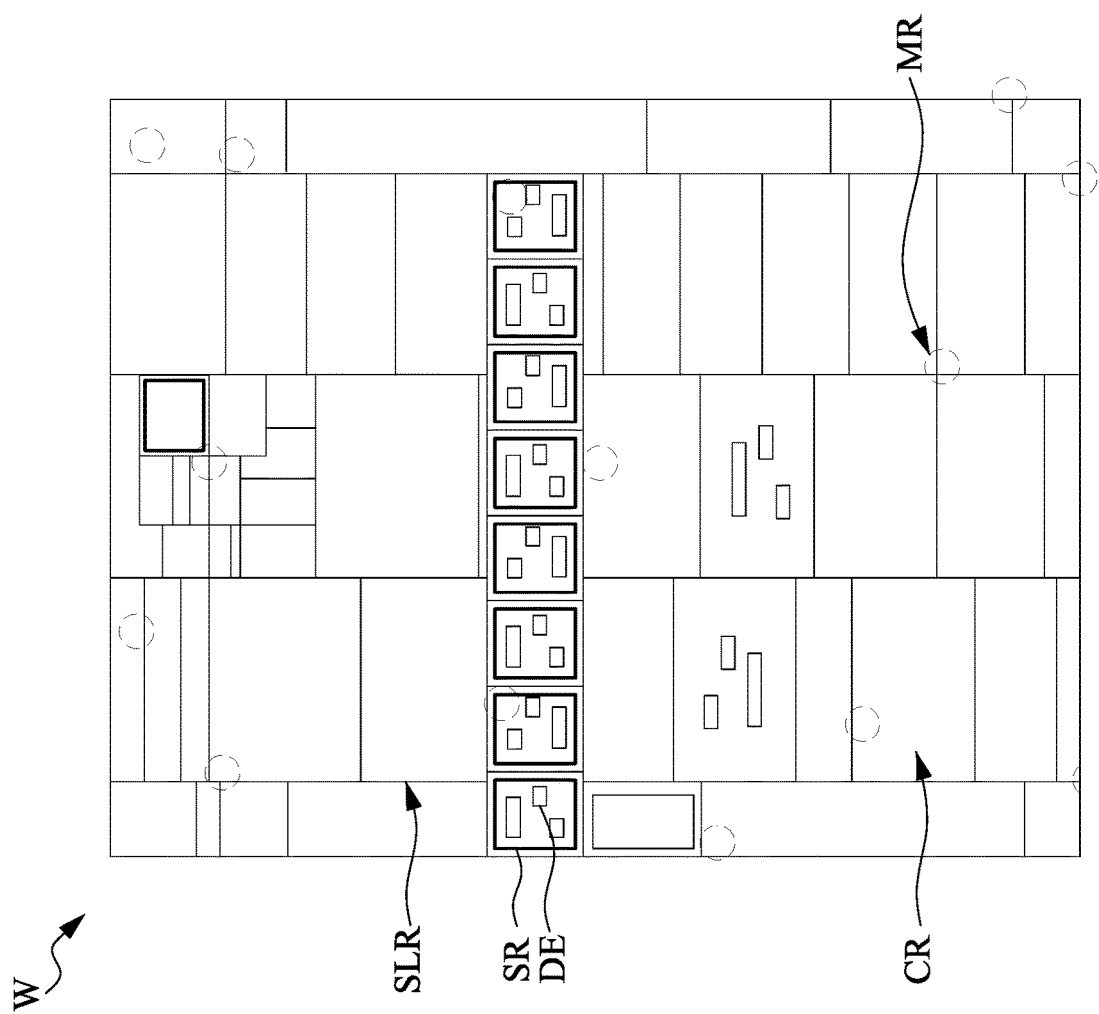
FIG. 1 is a schematic top view of a portion of a wafer according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

FIG. 1 is a schematic top view of a portion of a wafer W according to some embodiments of the present disclosure. The wafer W includes plural chip regions CR and plural scribe line regions (or scribe lines) SLR separating the chip regions CR from each other. Devices DE and seal rings SR may be located in each chip region CR, in which each of the seal rings SR surrounds one or more devices DE. In some embodiments, the device DE may include various devices or elements, such as a static random-access memory (SRAM) cells, transistors, resistors, capacitors, diodes, fuses, etc., but is simplified for a better understanding of the concepts of embodiments of the present disclosure. Alignment marks may be located in the scribe line regions SLR or other regions, in which mark regions MR indicates positions of the alignment marks. The alignment marks can be used for mask alignment and/or overly measurement in optical based measurements and/or electron-beam based measurements (e.g., scanning electron microscope (SEM)). In some embodiments, a die-saw process may be performed to chip the wafer W into plural individual dies/chips, and the scribe line regions SLR are used to separate chip regions CR apart in the die-saw process.

Figure 2A:
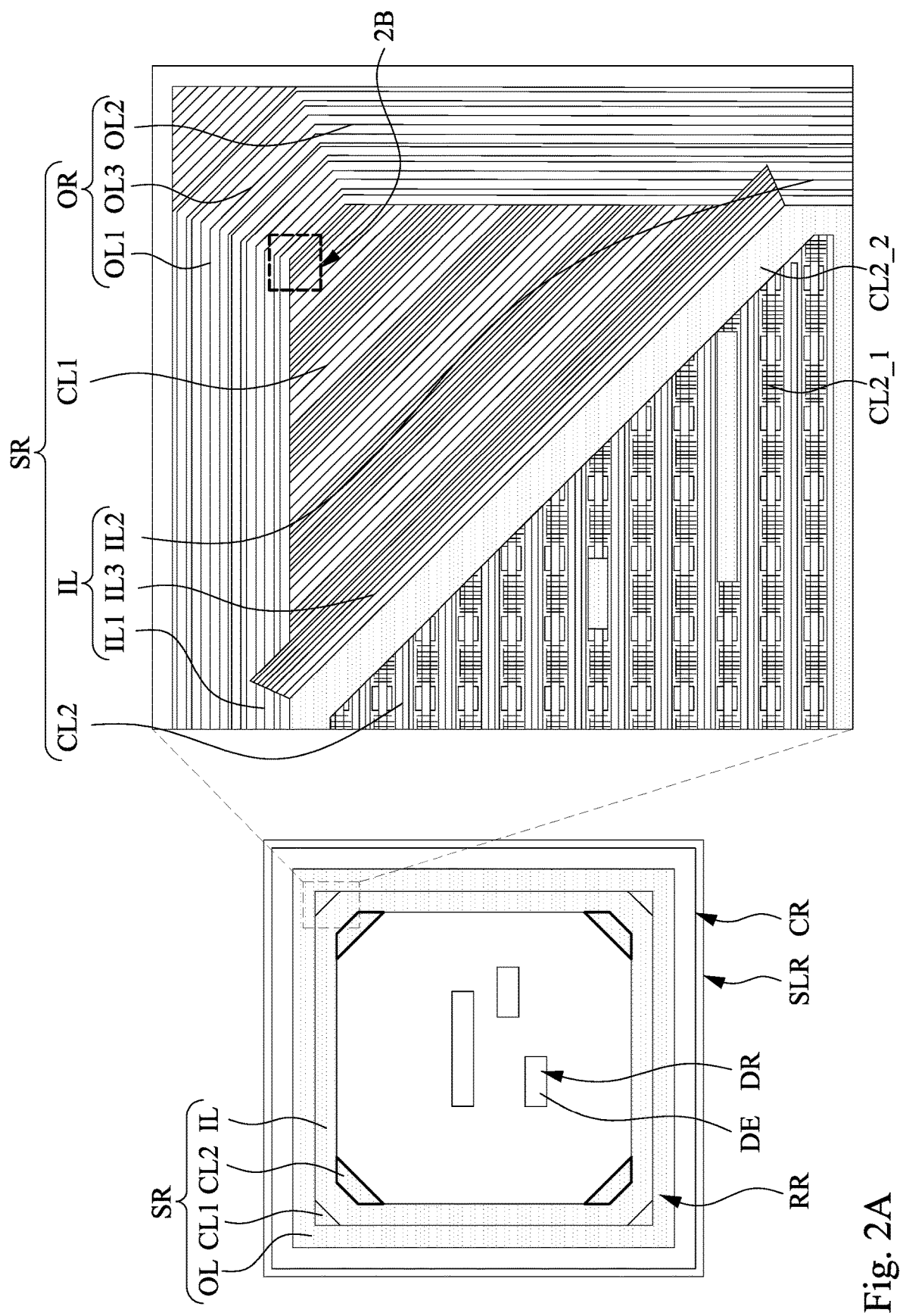
FIG. 2A illustrates a schematic top view of a chip region of FIG. 1.

FIG. 2A illustrates a schematic top view of the chip region CR of FIG. 1. The seal ring SR may include an outer ring OL, an inner ring IL, a corner portion CL1 between the inner ring IL and the outer ring OL, and a corner portion CL2 between the inner ring IL and the devices DE. As shown in FIG. 2A, the outer ring OL and the inner ring IL may respectively have a rectangular ring shape and an octagonal ring shape, and the corner portions CL1 may fill the spaces between the rectangular outer ring OL and the octagonal inner ring IL, and thus have a triangular shape. The corner portions CL2 may have a trapezoidal shape meeting the corners of the octagonal inner ring IL. In the context, the device DE is disposed in a device region DR, and the seal ring SR is disposed in a seal ring region RR.

Reference is made to the enlarged view of FIG. 2A. Each of the outer ring OL, the inner ring IL, and the corner portions CL1 and CL2 of the seal ring SR may include one or more lines. For example, the outer ring OL includes plural rings of horizontal lines OL1, vertical lines OL2, and slanted lines OL3 connecting the horizontal lines OL1 to the vertical lines OL2. In the examples, the horizontal lines OL1 extends along a first direction, the vertical lines OL2 extends along a second direction different from the first direction, and the slanted lines OL3 are slanted with respect to the first and second directions. The inner ring IL may include plural rings of horizontal lines ILL vertical lines IL2, and slanted lines IL3 connecting the horizontal lines IL1 to the vertical lines IL2. In the examples, the horizontal lines IL1 extends along a first direction, the vertical lines IL2 extends along a second direction different from the first direction, and the slanted lines IL3 are slanted with respect to the first and second directions. The lines ILL IL2, and IL3 may be respectively parallel with the lines OL1, OL2, and OL3. The corner portion CL1 may include plural lines extending in a direction parallel with the slanted lines OL3 and IL3. The corner portion CL2 may include a suitable pattern CL2_1 and a line CL2_2 surrounding the pattern CL2_1. The lines CL2_2, OL1, OL2, OL3, IL1, IL2, and IL3, the lines of the corner portion CL1, and the lines of the pattern CL2_1 may be designed with suitable widths depending on device requirement. In some embodiments, these lines may have a same width. For example, in FIG. 2A, the lines OL1, OL2, and OL3 of the outer ring OL, the lines ILL IL2, and IL3 of the inner ring IL, and the lines of the corner portion CL1 may have the same widths. In some embodiments, at least two of the lines of the seal ring SR may have different widths. For example, in FIG. 2A, a width of the line CL2_2 may be greater than that of the lines OL1, OL2, and OL3 of the outer ring OL, the lines ILL IL2, and IL3 of the inner ring IL, the lines of the corner portion CL1 and the lines of the pattern CL2_1. In FIG. 2A, an area of the line CL2_2 is indicated by a dotted pattern.

Figure 2B:
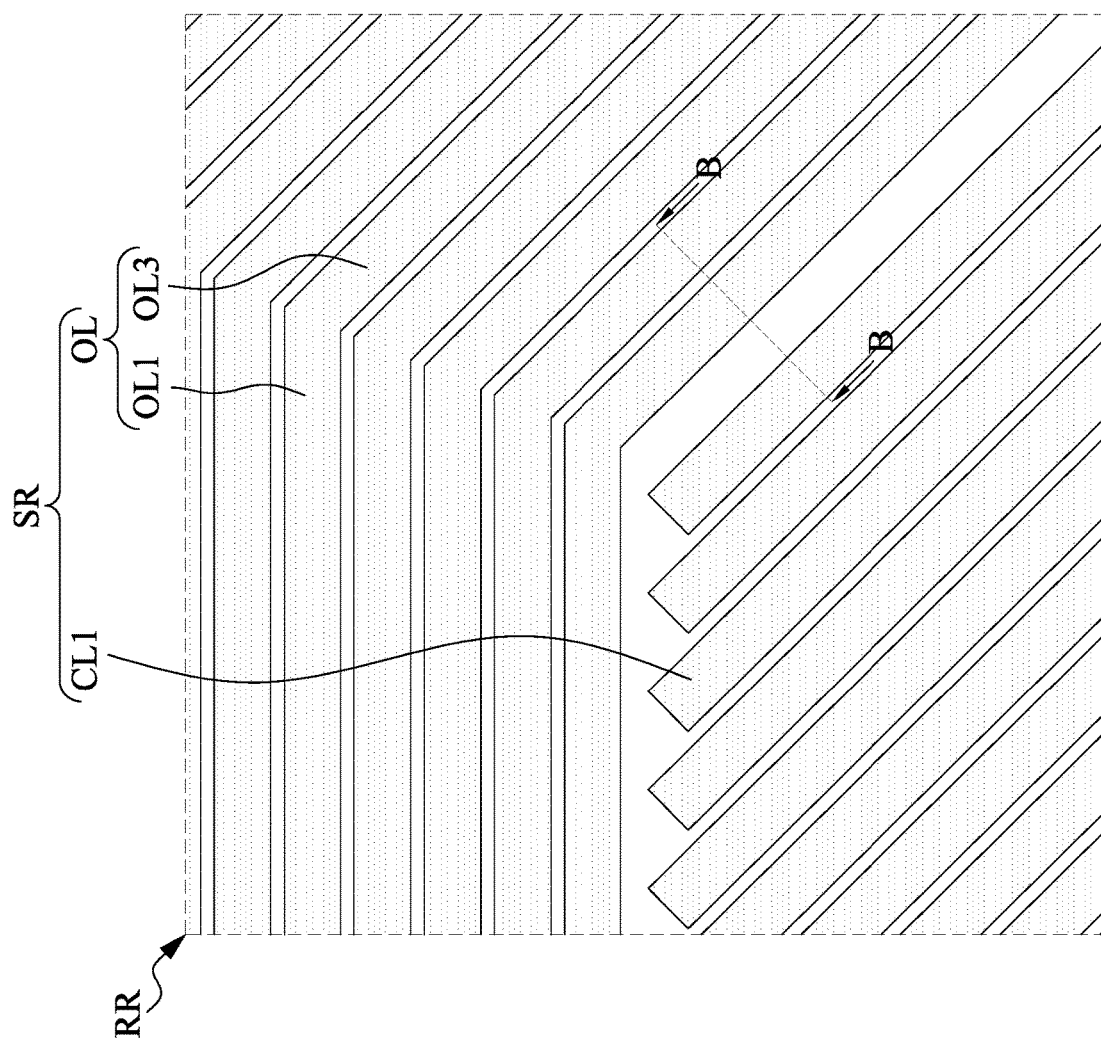
FIG. 2B is an enlarged view of a portion of FIG. 2A.

FIG. 2B is an enlarged view of a portion 2B of FIG. 2A. Reference is made to both FIGS. 2A and 2B. In the present embodiments, the lines ILL IL2, IL3, OL1, OL2, and OL3 and the lines of the corner portion CL1 may have substantially the same width. In some alternative embodiments, at least two or more of the lines ILL IL2, IL3, OL1, OL2, and OL3, and the lines of the corner portion CL1 may have different widths. As aforementioned, the lines of the corner portion CL1 may extend in a direction parallel with the slanted lines OL3. In the illustrated embodiments, the lines of the corner portion CL1 may be spaced apart from the lines of the inner rings IR and outer rings OR. In some alternative embodiments, the lines of the corner portion CL1 may be connected with the lines of the inner rings IR and outer rings OR.

FIG. 3 illustrates a schematic top view of the mark region MR of FIG. 1. An alignment mark AM in the mark region MR may include plural parallel alignment mark lines AML and plural spaces S1, in which two adjacent alignment mark lines AML are spaced apart from each other by one of the spaces S1. Each of the alignment mark lines AML may include plural main lines AML1 and plural dummy lines AML2. The main lines AML1 and the dummy lines AML2 may extend along the same direction. In some embodiments, a width of the main lines AML1 is greater than a width of the dummy lines AML2. In the present embodiments, the alignment mark lines AML are arranged as a V-shape. In some alternative embodiments, the alignment mark lines AML may have other suitable configuration.

Figure 4:
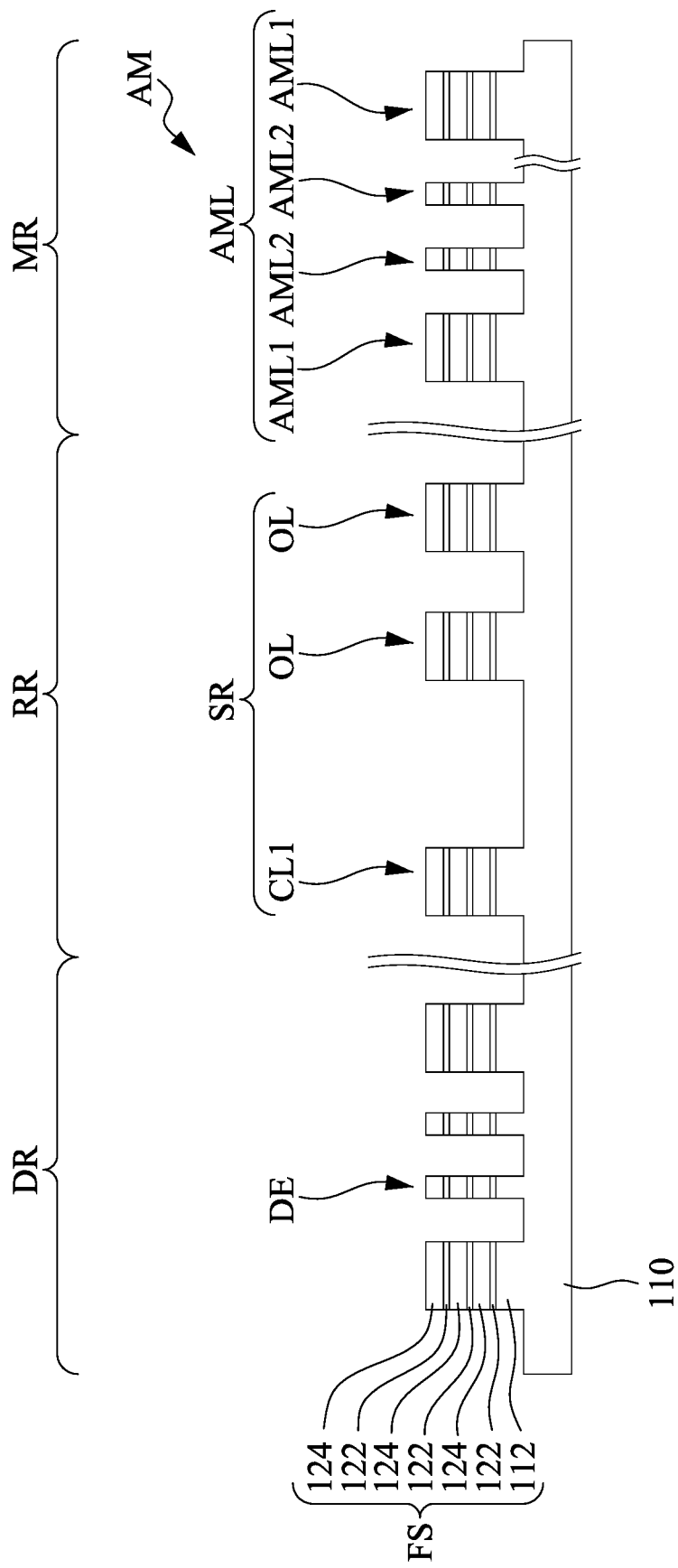
FIG. 4 is a schematic cross-sectional view showing the device region, the seal ring region, and the alignment mark region of the portion of the wafer of FIG. 1.

FIG. 4 is a schematic cross-sectional view showing the device region DR, the seal ring region RR, and the mark region MR of the portion of the wafer W of FIG. 1. In FIG. 4, the views of the seal ring region RR and the mark region MR are respectively taking along the line B-B of FIG. 2B and the line C-C of FIG. 3. In FIG. 4, a substrate 110 is illustrated, and plural fins FS are formed over the device region DR, the seal ring region RR, and the mark region MR of the substrate 110. Each of the fins FS may include a plurality of nanosheets. For example, each of the fins FS includes a base portion 112 and a stack of alternate epitaxial layers 122 and 124. In the present embodiments, the lines of the alignment mark AM (e.g., the main lines AML1 and dummy lines AML2 of the alignment mark lines AML) and the lines of the seal rings SR (e.g., the lines of corner portions CL1, CL2, the outer rings OL, and the inner rings IL)(referring to FIG. 2A) may include the fins FS having the stack of alternate epitaxial layers 122 and 124. Stated differently, the lines of the alignment mark AM and the seal rings SR have nanosheet structures same as that of the active transistors. Since the gate wraps the channel region, the nanosheet structures may have a large critical dimension compared to a fin structure. Through the configuration, a better process control can be achieved for less line collapse. Also, since the process for fabricating the alignment mark AM and the seal rings SR can be integrated with that of the nanosheet device, cost can be saved for less mask.

In FIG. 4, it is noted that widths of the lines of the alignment mark AM (e.g., the main lines AML1 and dummy lines AML2), the lines of the seal rings SR (e.g., the lines of corner portion CL1 and the outer rings OL), and the lines of devices DE may not be drawn to scale. The widths of the lines of the alignment mark AM, the lines of the seal rings SR, and the lines of devices DE may be enlarged or shrunk depending on design requirements. In some examples, the smallest width of the lines of the alignment mark AM (e.g., the dummy lines AML2) may be greater than a smallest width of the lines of devices DE. In some examples, the smallest width of the seal rings SR (e.g., the lines of the corner portions CL1, CL2, the outer rings OL, and the inner rings IL) may be greater than a smallest width of the lines of devices DE. The smallest width of the lines of the alignment mark AM (e.g., the dummy lines AML2) may be greater than, equal to, or less than the widths of the seal rings SR (e.g., the lines of corner portion CL1 and the outer rings OL).

FIGS. 5A-19B illustrate perspective views and cross-sectional views of intermediate stages in formation of an integrated circuit structure having multi-gate devices, in accordance with some embodiments of the present disclosure. As used herein, the term "multi-gate device" is used to describe a device (e.g., a semiconductor transistor) that has at least some gate material disposed on multiple sides of at least one channel of the device. In some examples, the multi-gate device may be referred to as a GAA device or a nanosheet device having gate material disposed on at least four sides of at least one channel of the device. The channel region may be referred to as a "nanowire," which as used herein includes channel regions of various geometries (e.g., cylindrical, bar-shaped) and various dimensions.

FIGS. 5A, 6A, 7A, 9A, 10A, 11A, 12A, and 13A are perspective views of intermediate stages in the device region (e.g., the device region DR in FIG. 2A) in the fabricating an integrated circuit structure in accordance with some embodiments of the present disclosure. FIGS. 5B, 6B, 7B, 9B, 10B, 11B, 12B, 13A, 14A, 15A, 16A, 17A, and 18A are top views of intermediate stages of fabricating the integrated circuit structure. FIGS. 5C, 6C, 7C, 8, 9C, 10C, 11C, 12C, 13B, 14B, 15B, 16B, 17B, 18B, and 19A are cross-sectional views of intermediate stages of fabricating the integrated circuit structure 100 along first cuts (e.g., cuts X1-X1, X2-X2, and X3-X3 in FIG. 5A). FIGS. 14C, 15C, 16C, 17C, 18C, and 19B are cross-sectional views of intermediate stages of fabricating the integrated circuit structure 100 along a second cut (e.g., cut Y-Y in FIG. 14A).

As with the other method embodiments and exemplary devices discussed herein, it is understood that parts of the integrated circuit structure may be fabricated by a CMOS technology process flow, and thus some processes are only briefly described herein. Further, the exemplary integrated circuit structure may include various other devices and features, such as other types of devices such as additional transistors, bipolar junction transistors, resistors, capacitors, inductors, diodes, fuses, static random access memory (SRAM) and/or other logic circuits, etc., but is simplified for a better understanding of the concepts of the present disclosure. In some embodiments, the exemplary integrated circuit structure includes a plurality of semiconductor devices (e.g., transistors), including PFETs, NFETs, etc., which may be interconnected.

Figure 5A:
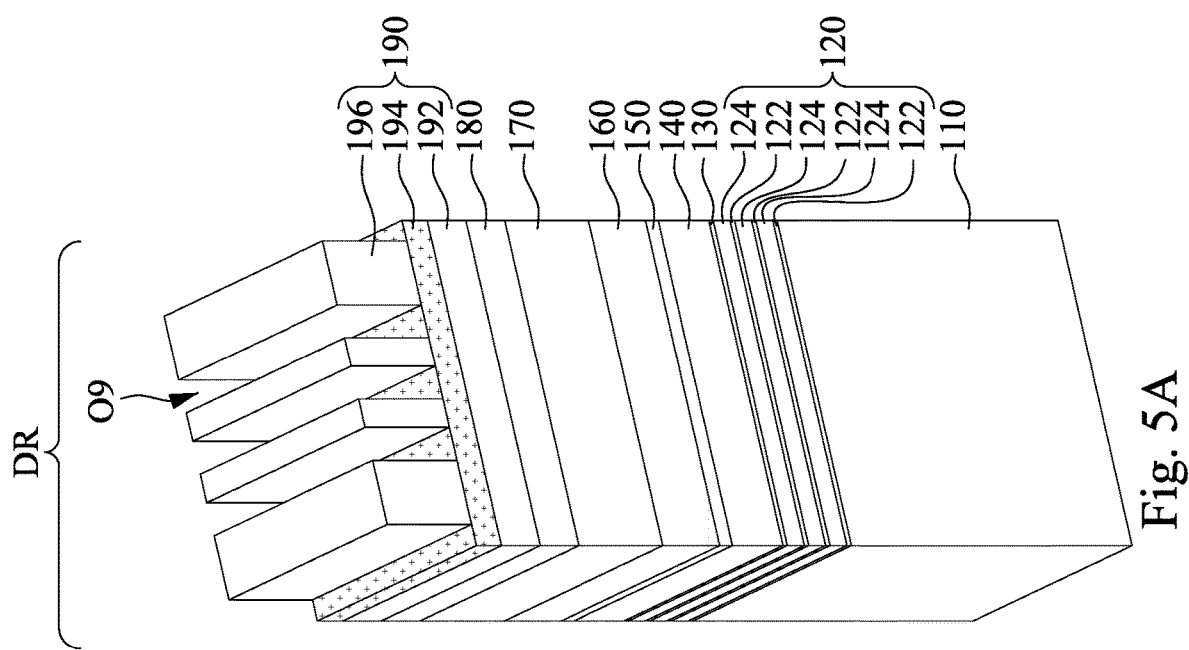
FIGS. 5A-19B illustrate perspective views and cross-sectional views of intermediate stages in formation of an integrated circuit structure having multi-gate devices, in accordance with some embodiments of the present disclosure.
Figure 5B:
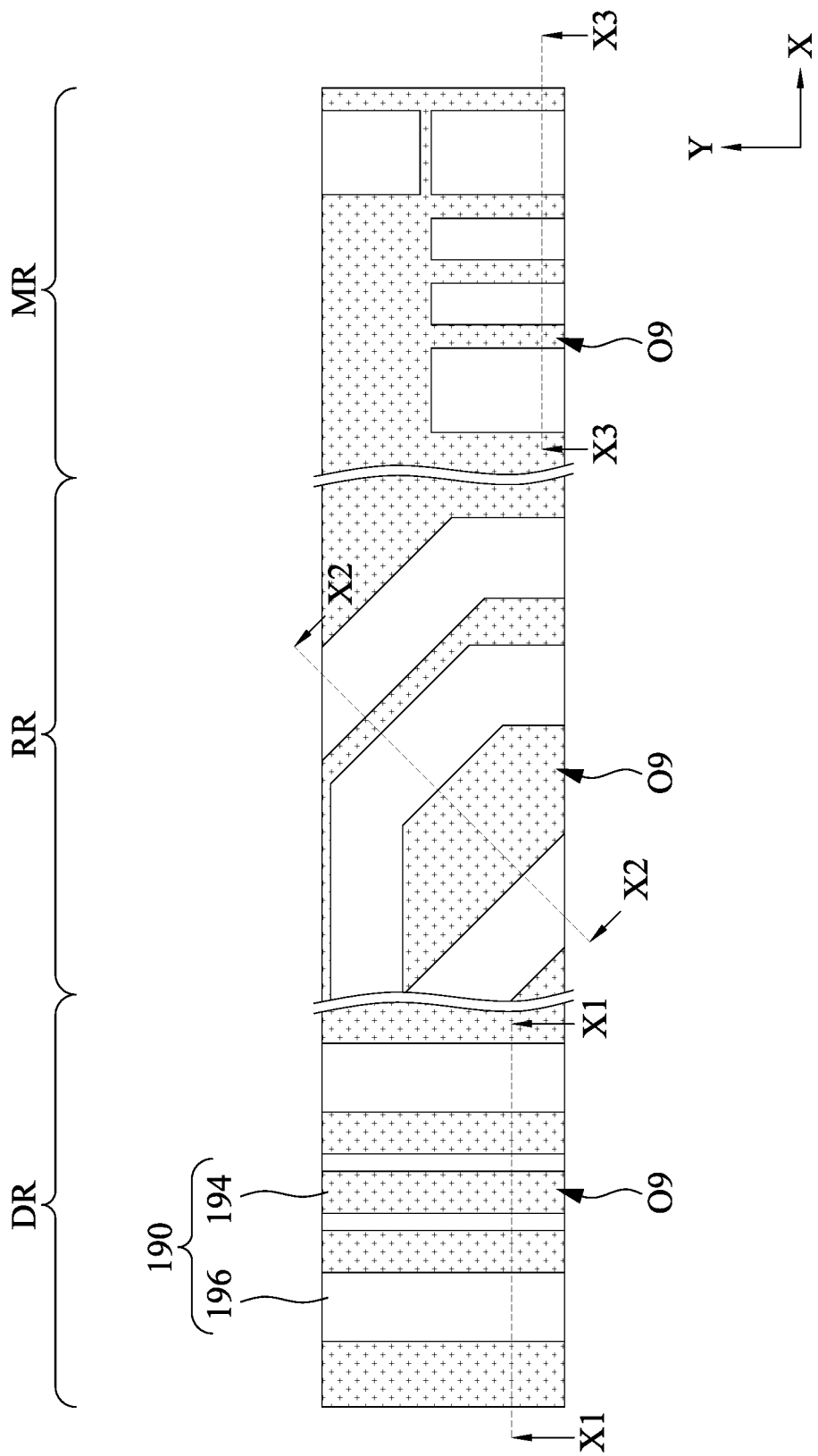
Figure 5C:
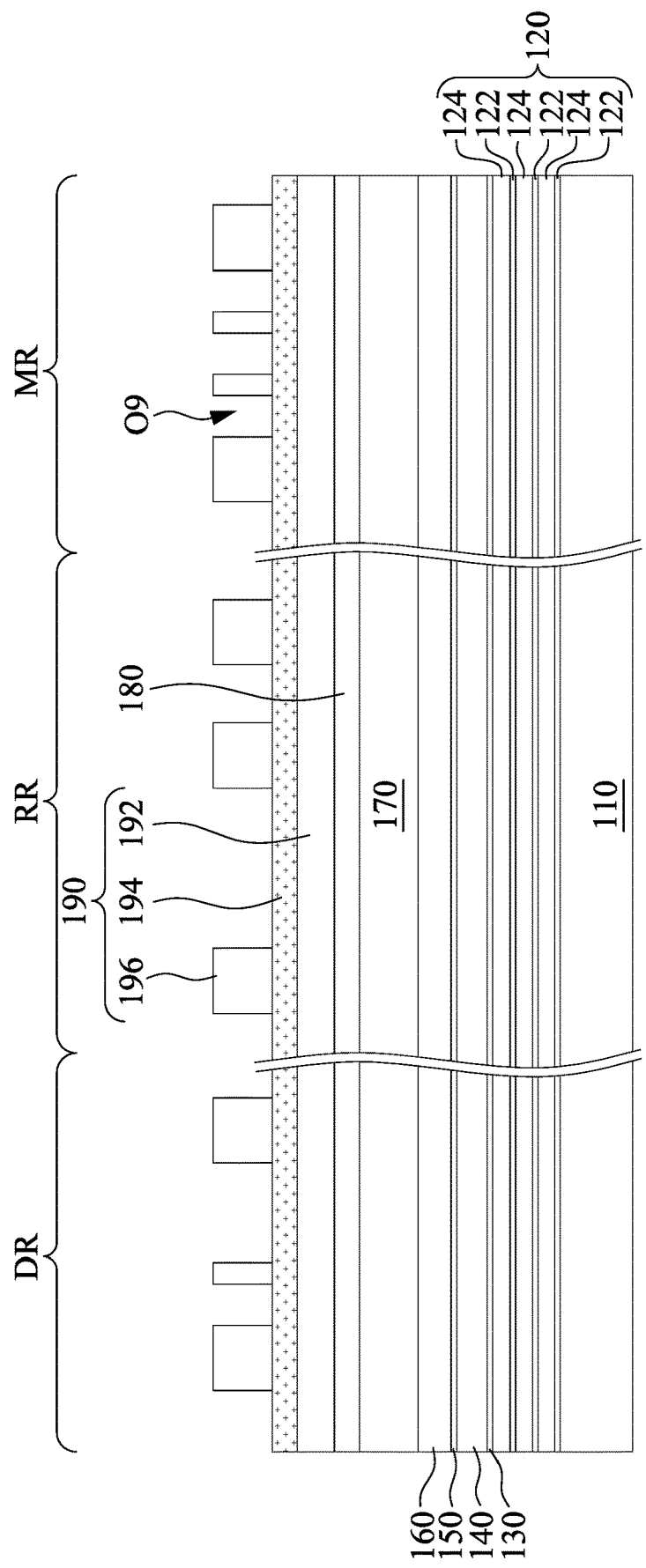

FIGS. 5A-5C shows an initial structure. The initial structure includes a substrate 110. In some embodiments, the substrate 110 may include silicon (Si). Alternatively, the substrate 110 may include germanium (Ge), silicon germanium (SiGe), a III-V material (e.g., GaAs, GaP, GaAsP, AlInAs, AlGaAs, GaInAs, InAs, GaInP, InP, InSb, and/or GaInAsP; or a combination thereof) or other appropriate semiconductor materials. In some embodiments, the substrate 110 may include a semiconductor-on-insulator (SOI) structure such as a buried dielectric layer. The substrate 110 may have a device region DR, a seal ring region RR, and a mark region MR as illustrated in FIG. 1. In the context, the perspective view (e.g., FIG. 5A) shows the configuration of the device region DR of the substrate 110, and the top view and the cross-sectional view (e.g., FIGS. 5B and 5C) shows all the device region DR, the seal ring region RR, and the mark region MR, in which the seal ring region RR and the mark region MR may include similar perspective configuration as the perspective view (e.g., FIG. 5A).

An epitaxial stack 120 is formed over the device region DR, the seal ring region RR, and the mark region MR of the substrate 110. The epitaxial stack 120 includes epitaxial layers 122 of a first composition interposed by epitaxial layers 124 of a second composition. The first and second compositions can be different. In some embodiments, the epitaxial layers 122 are SiGe and the epitaxial layers 124 are silicon (Si). However, other embodiments are possible including those that provide for a first composition and a second composition having different oxidation rates and/or etch selectivity. In some embodiments, the epitaxial layers 122 include SiGe and where the epitaxial layers 124 include Si, the Si oxidation rate of the epitaxial layers 124 is less than the SiGe oxidation rate of the epitaxial layers 122.

The epitaxial layers 124 or portions thereof may form nanosheet channel(s) of the multi-gate transistor. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The use of the epitaxial layers 124 to define a channel or channels of a device is further discussed below. It is noted that three layers of the epitaxial layers 122 and three layers of the epitaxial layers 124 are alternately arranged as illustrated in FIGS. 5A-5C. It can be appreciated that any number of epitaxial layers can be formed in the epitaxial stack 120; the number of layers depending on the desired number of channels regions for the transistor. In some embodiments, the number of epitaxial layers 124 is between 2 and 10.

In some embodiments, the epitaxial layers 122 may be substantially uniform in thickness, and the epitaxial layers 124 of the stack are substantially uniform in thickness. As described in more detail below, the epitaxial layers 124 may serve as channel region(s) for a subsequently-formed multi-gate device and the thickness is chosen based on device performance considerations. The epitaxial layers 122 in channel regions(s) may eventually be removed and serve to define a vertical distance between adjacent channel region(s) for a subsequently-formed multi-gate device and the thickness is chosen based on device performance considerations.

Accordingly, the epitaxial layers 122 may also be referred to as sacrificial layers, and epitaxial layers 124 may also be referred to as channel layers.

By way of example, epitaxial growth of the layers of the stack 120 may be performed by a molecular beam epitaxy (MBE) process, a metalorganic chemical vapor deposition (MOCVD) process, and/or other suitable epitaxial growth processes. In some embodiments, the epitaxially grown layers such as, the epitaxial layers 124 include the same material as the substrate 110. In some embodiments, the epitaxially grown layers 122 and 124 include a different material than the substrate 110. As stated above, in at least some examples, the epitaxial layers 122 include an epitaxially grown silicon germanium (SiGe) layer and the epitaxial layers 124 include an epitaxially grown silicon (Si) layer. Alternatively, in some embodiments, either of the epitaxial layers 122 and 124 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 122 and 124 may be chosen based on providing differing oxidation and/or etching selectivity properties. In some embodiments, the epitaxial layers 122 and 124 are substantially dopant-free (i.e., having an extrinsic dopant concentration from about 0 $cm^{-3}$ to about $1 \times 10^{18}$ $cm^{-3}$), where for example, no intentional doping is performed during the epitaxial growth process.

A pad oxide layer 130 and a hard mask layer 140 are formed over the epitaxial stack 120. The pad oxide layer 130 may include oxides, such as $SiO_2$. The hard mask layer 140 may include nitrides, such as $Si_3N_4$. The pad oxide layer 130 may act as an adhesion layer between the epitaxial stack 120 and the hard mask layer 140 and may act as an etch stop layer for etching the hard mask layer 140. In some examples, the pad oxide layer 130 includes thermally grown oxide, chemical vapor deposition (CVD)-deposited oxide, and/or atomic layer deposition (ALD)-deposited oxide. In some embodiments, the hard mask layer 140 is deposited on the pad oxide layer 130 by CVD and/or other suitable techniques.

Subsequently, a thin semiconductor layer 150, a thick oxide layer 160, a thick semiconductor layer 170, and a hard mask layer 180 may be formed over the hard mask layer 140 in a sequence. The thin semiconductor layer 150 and thick semiconductor layer 170 may include semiconductor materials, such as silicon. The thick oxide layer 160 may include oxides, such as $SiO_2$. The hard mask layer 180 may include nitrides, such as $Si_3N_4$. In some embodiments, the thin semiconductor layer 150, the thick oxide layer 160, the thick semiconductor layer 170, and the hard mask layer 180 are deposited by ALD, CVD and/or other suitable techniques.

A photoresist mask 190 is formed over the hard mask layer 180. In some embodiments, the photoresist mask 190 may be a tri-layer photoresist. For example, the photoresist mask 190 includes a bottom layer 192, a middle layer 194 over the bottom layer 192, and a photoresist layer 196 over the middle layer 194. The bottom layer 192 may include organic or inorganic material. The middle layer 194 may include silicon nitride, silicon oxynitride, SiOC, or the like. The photoresist layer 196 may include a photosensitive material. The photoresist layer 196 may be formed by suitable photolithography process, and have openings O9 (or trenches) therein. The photolithography process may include coating a photoresist layer (not shown), exposing the photoresist to a pattern, performing post-exposure bake processes, and developing the resist to form a patterned mask including the resist. After the photolithography process, an after-develop inspection (ADI) may be performed to inspect the positions of the openings O9 in the photoresist layer 196 for checking mask alignment. In some embodiments, ADI may be performed with optical systems, such as an optical microscope.

Figure 6A:
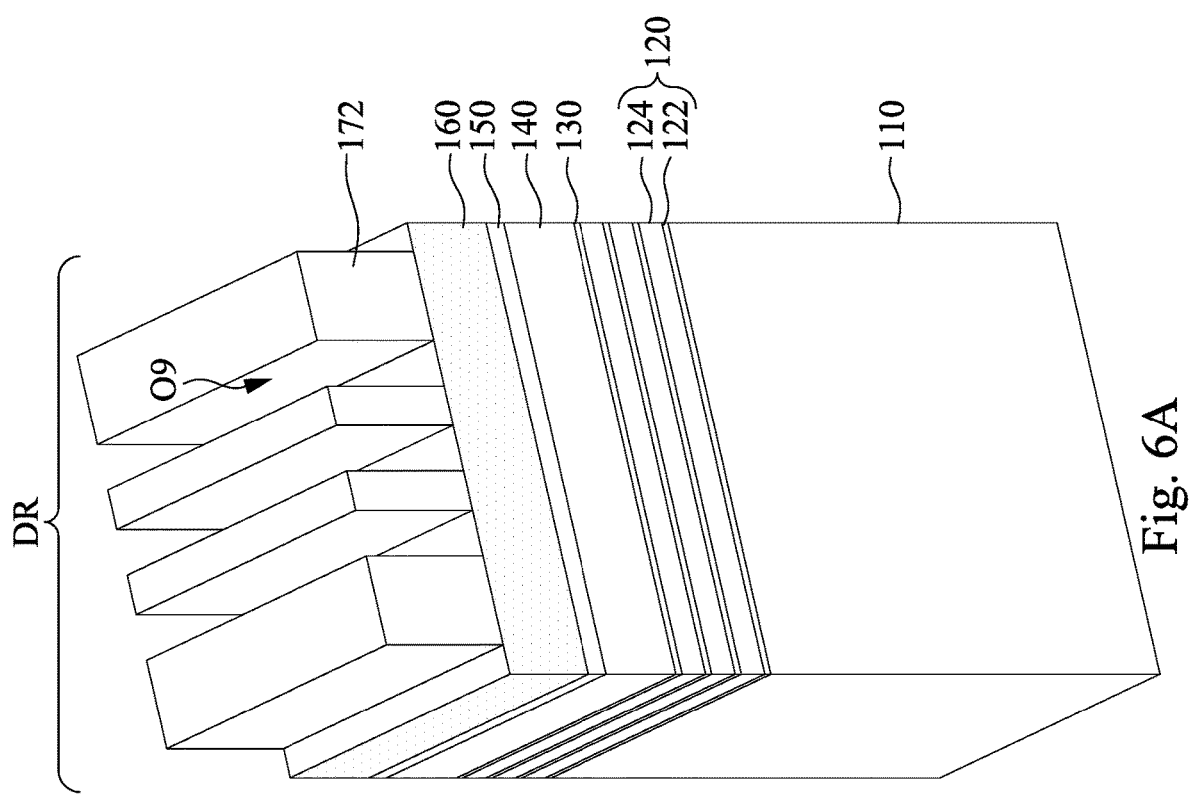
Figure 6B:
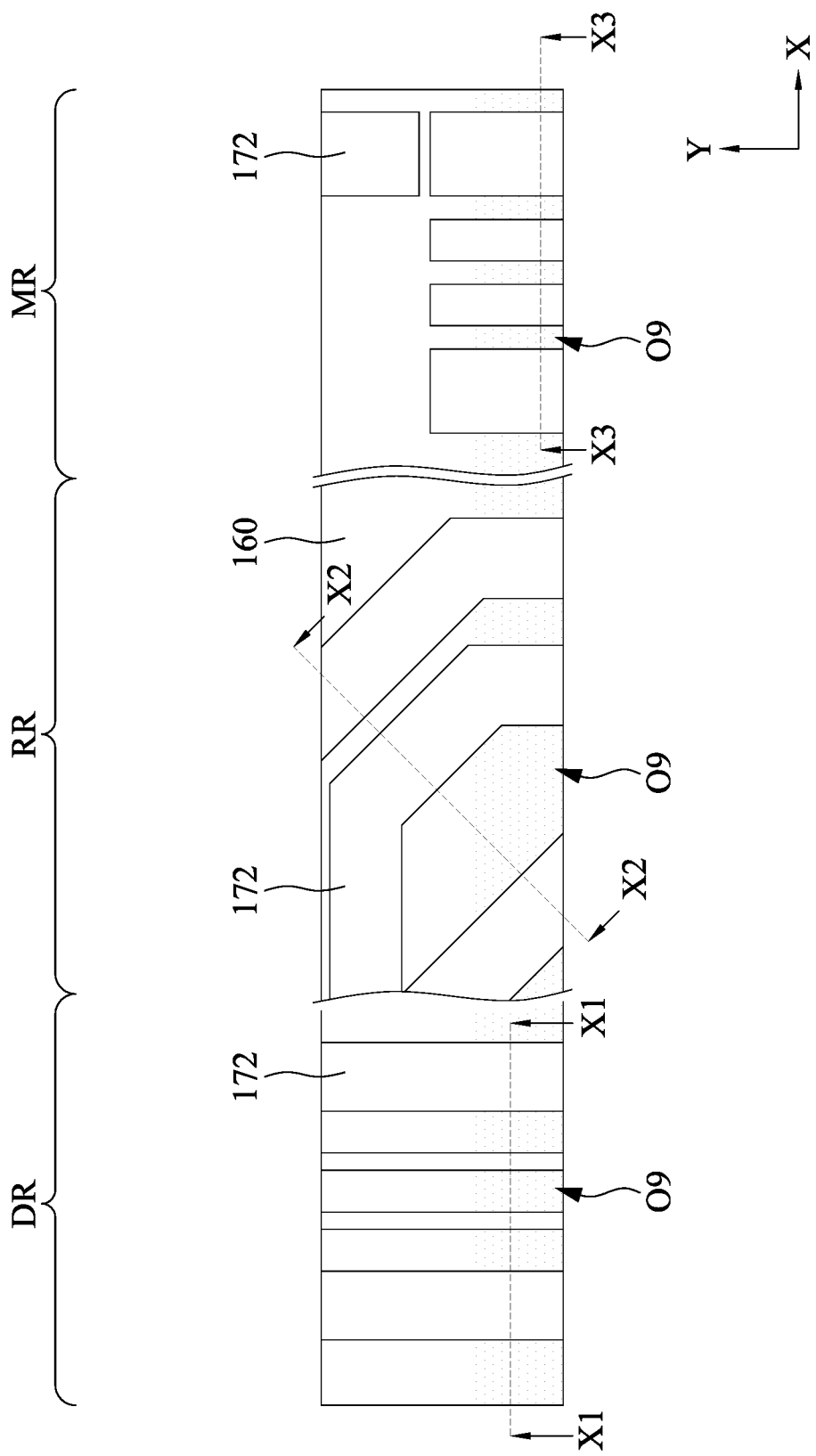
Figure 6C:
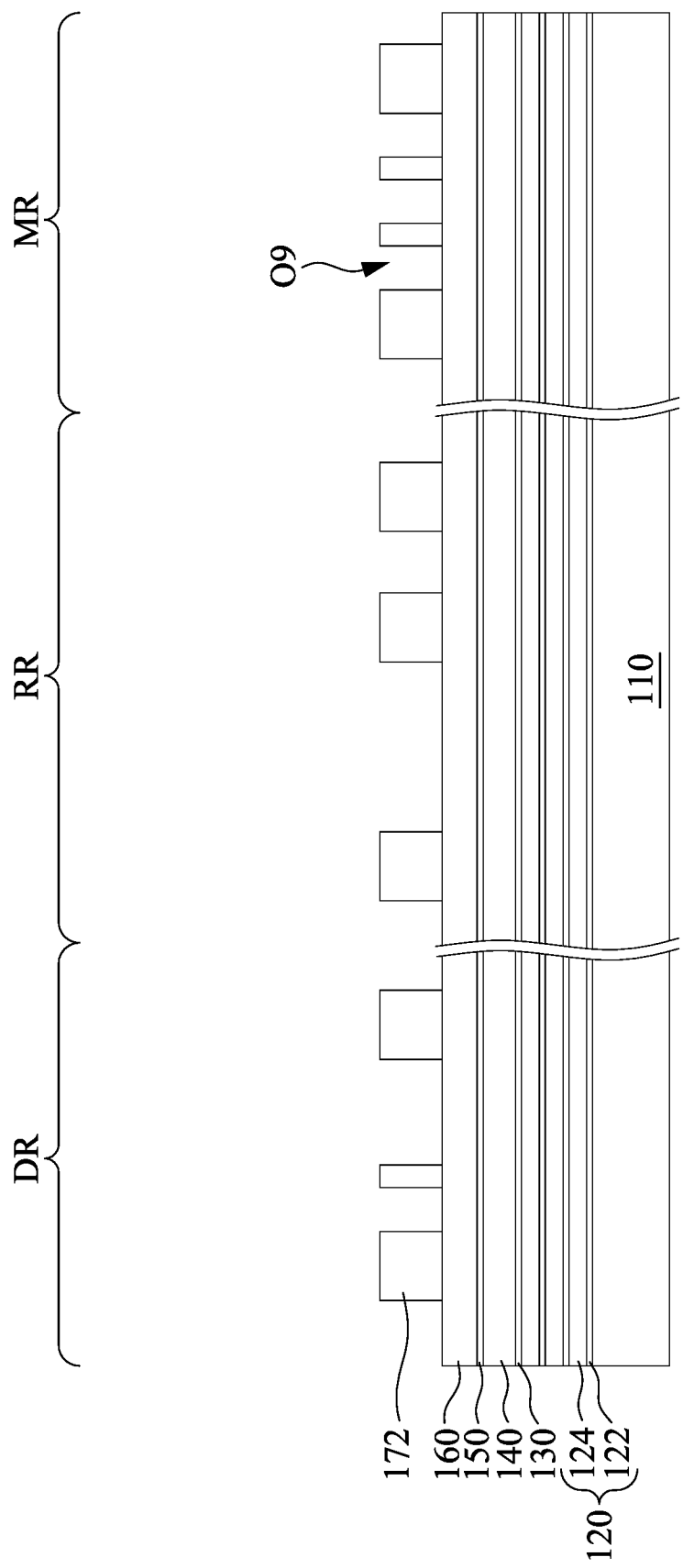

Reference is made to FIGS. 6A-6C. The opening O9 in the photoresist layer 196 (referring to FIGS. 5A-5C) is extended through the middle layer 194, the bottom layer 192, the hard mask layer 180, and the thick semiconductor layer 170 (referring to FIGS. 5A-5C) using, for example, plural etching processes. By the etching processes, the thick semiconductor layer 170 (referring to FIGS. 5A-5C) is patterned into plural semiconductor masks 172. The pattern of the photoresist layer 196 (referring to FIGS. 5A-5C) may be transferred to the thick semiconductor layer 170 (referring to FIGS. 5A-5C) by the etching processes, such that the semiconductor masks 172 have the same pattern as the lines of the photoresist layer 196 (referring to FIGS. 5A-5C). In some embodiments, after the etching processes, the openings O9 expose the thick oxide layer 160 that is present underneath the opening O9. The middle layer 194, the bottom layer 192, the hard mask layer 180 may be etched and consumed during the etching processes.

Figure 7A:
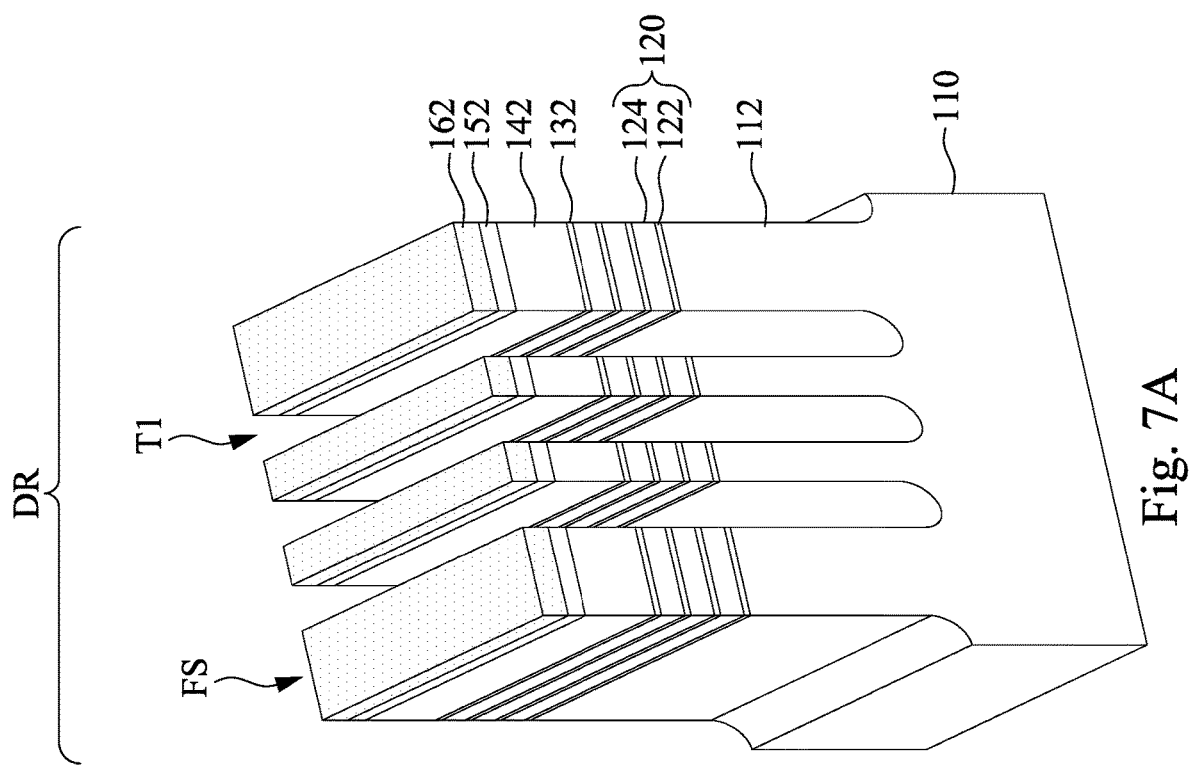
Figure 7B:
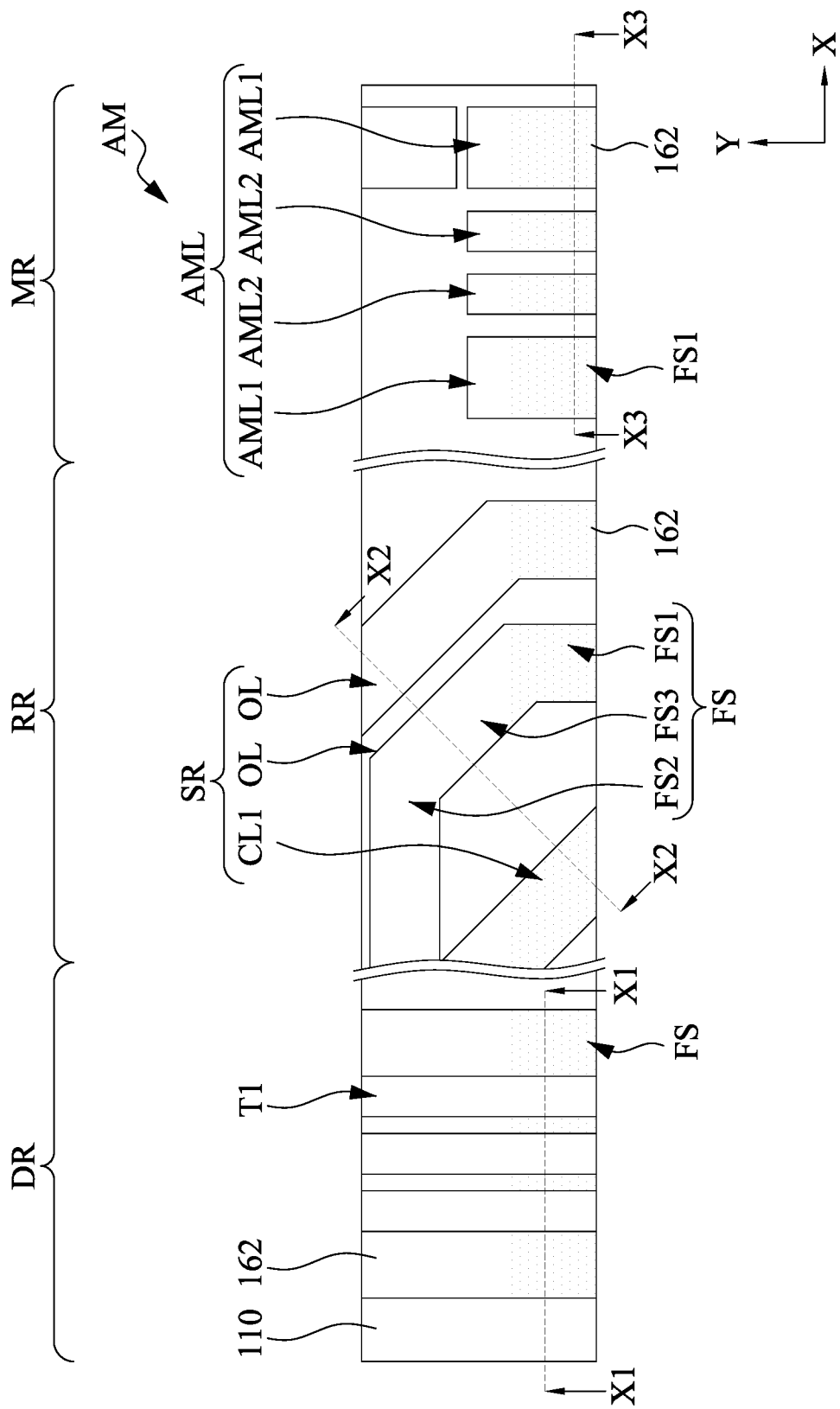
Figure 7C:
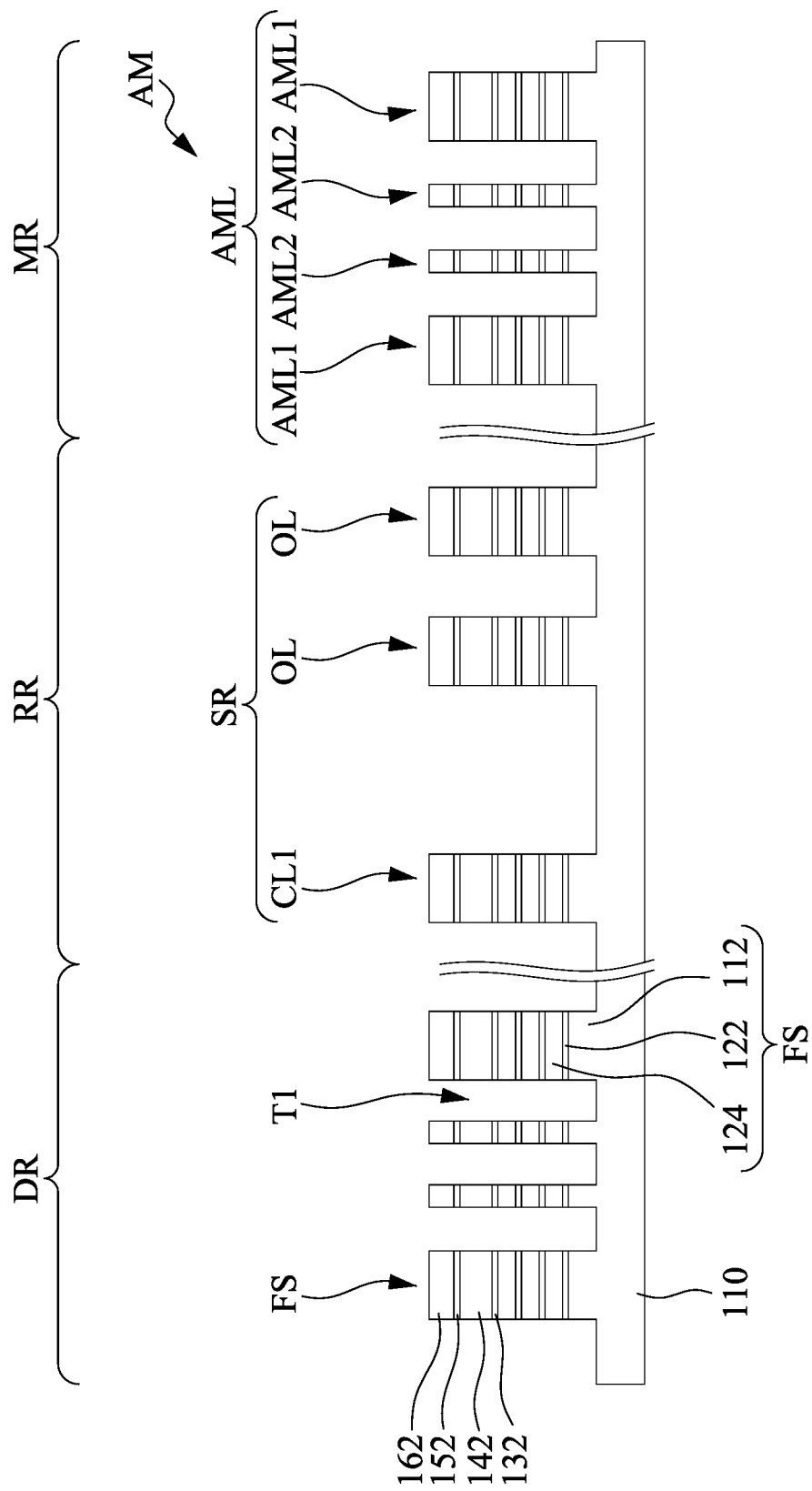

Reference is made to FIGS. 7A-7C. The layers 130-160 and the epitaxial stack 120 (referring to FIGS. 6A-6C) are patterned using the semiconductor masks 172 (referring to FIGS. 6A-6C) as etch masks, thereby forming plural fins FS. For example, the semiconductor masks 172 (referring to FIGS. 6A-6C) are used to protect regions of the substrate 110 and layers formed thereupon, while etch processes form trenches T1 in unprotected regions through the layers 130-160, through the epitaxial stack 120, and into the substrate 110, thereby leaving the plurality of extending fins FS. The patterned layers 130-160 may be respectively referred to as layers 132-162 hereinafter. The trenches T1 may be etched using a dry etch (e.g., reactive ion etching), a wet etch, and/or combination thereof. The formed fins FS may have the same pattern as the lines of the photoresist layer 196 (referring to FIGS. 5A-5C) and pattern of the semiconductor masks 172 (referring to FIGS. 6A-6C).

As shown in the top view of FIG. 7B, in the seal ring region RR, a fin FS may have fin lines FS1-FS3, in which the fin lines FS1 and FS2 respectively extend along the directions X and Y, and the fin line FS3 is slanted and connecting the fin line FS1 to the fin line FS2. The fins FS in the seal ring region RR may correspond to the lines of the seal ring SR in FIGS. 2A and 2B, for example, the lines of outer ring OL and the corner portion CL1. As shown in the top view of FIG. 7B, in the mark region MR, the fins FS corresponds to the alignment lines AML of the alignment mark AM in FIG. 3, for example, the main lines AML1 and dummy lines AML2. In the device region DR, the fins FS may extend along a fin direction (e.g., the direction X) and serve as active regions of devices subsequently formed. In the figures, the widths of the fins FS in the regions DR, RR, and MR are not drawn to scale. For example, the smallest width of the fins FS in the regions RR and MR may be greater than the smallest width of the fins FS in the region DR.

In some alternative embodiments, the fins FS may be fabricated using suitable processes including double-patterning or multi-patterning processes. The double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins FS by etching initial epitaxial stack 120 (illustrated in FIGS. 6A-6C). The etching process can include dry etching, wet etching, reactive ion etching (RIE), and/or other suitable processes.

Numerous other embodiments of methods to form the fins on the substrate may also be used including, for example, defining the fin region (e.g., by mask or isolation regions) and epitaxially growing the epitaxial stack 120 in the form of the fins FS. In various embodiments, each of the fins FS includes a base portion 112 patterned from the semiconductor substrate 110 and portions of each of the epitaxial layers 122 and 124 of the epitaxial stack 120.

Figure 8:
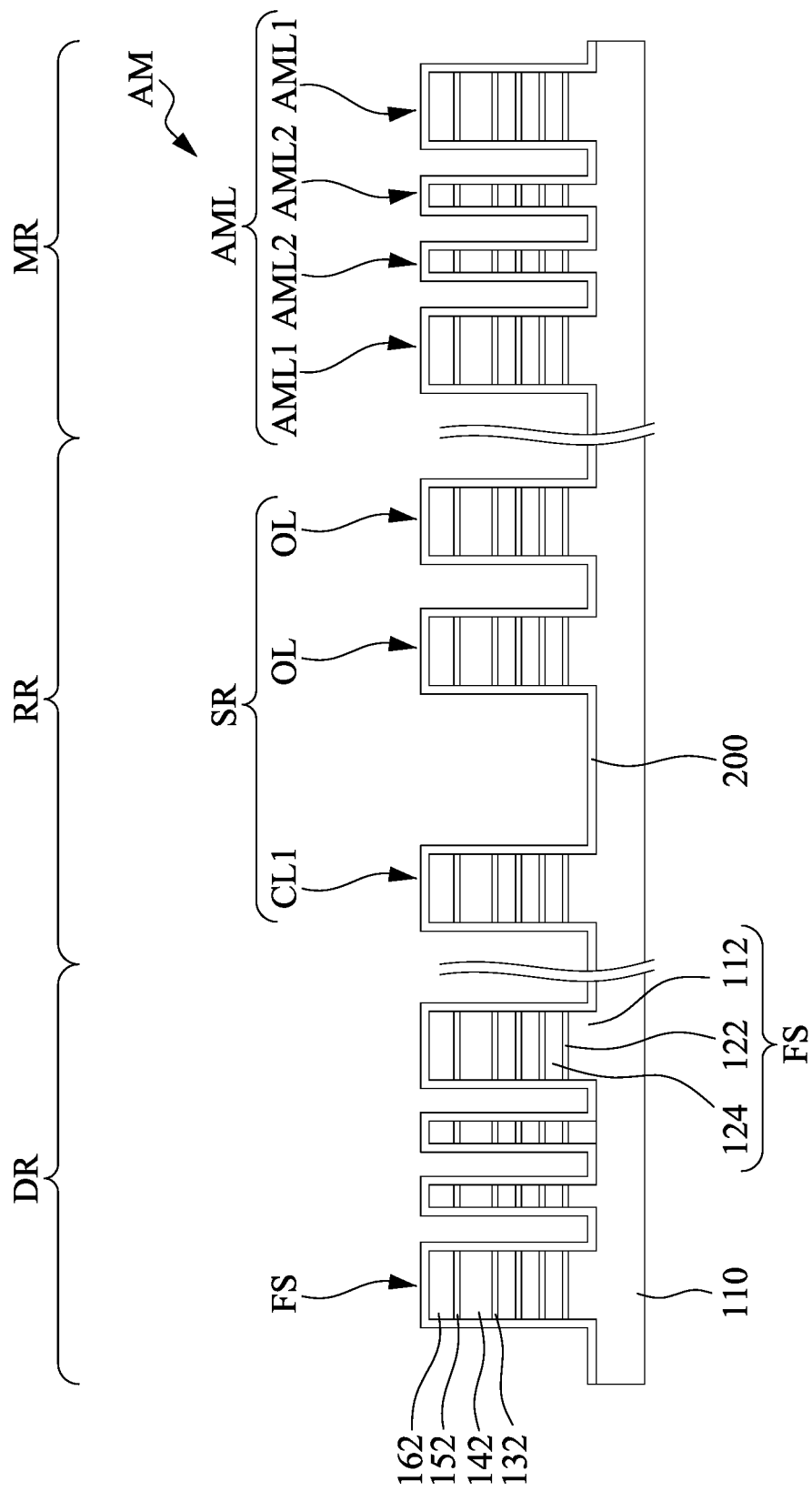

Reference is made to FIG. 8. A liner layer 200 is deposited conformally over the structure of FIG. 7C. The liner layer 200 may include semiconductor material (e.g., silicon), dielectric material (e.g., silicon oxide), or the like. The liner layer 200 can serve as a protective liner to protect the fins FS against subsequent etching and/or cleaning process.

Figure 9A:
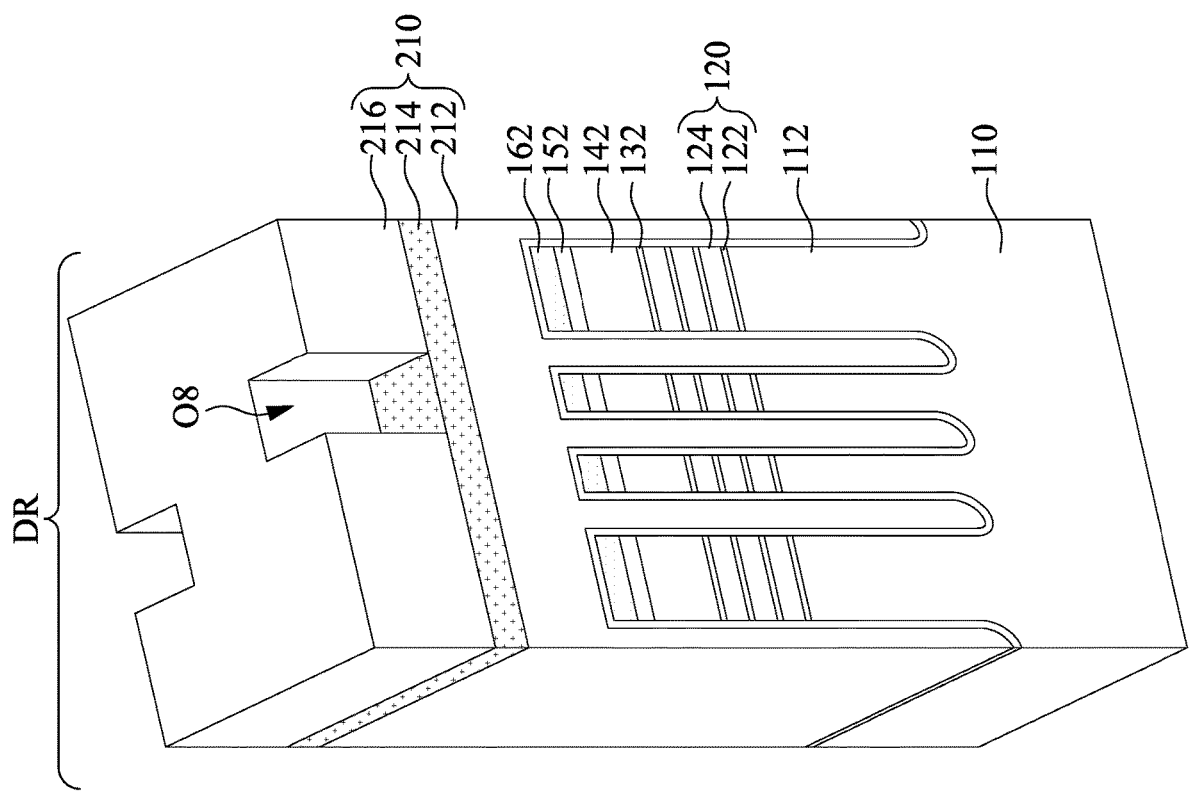
Figure 9B:
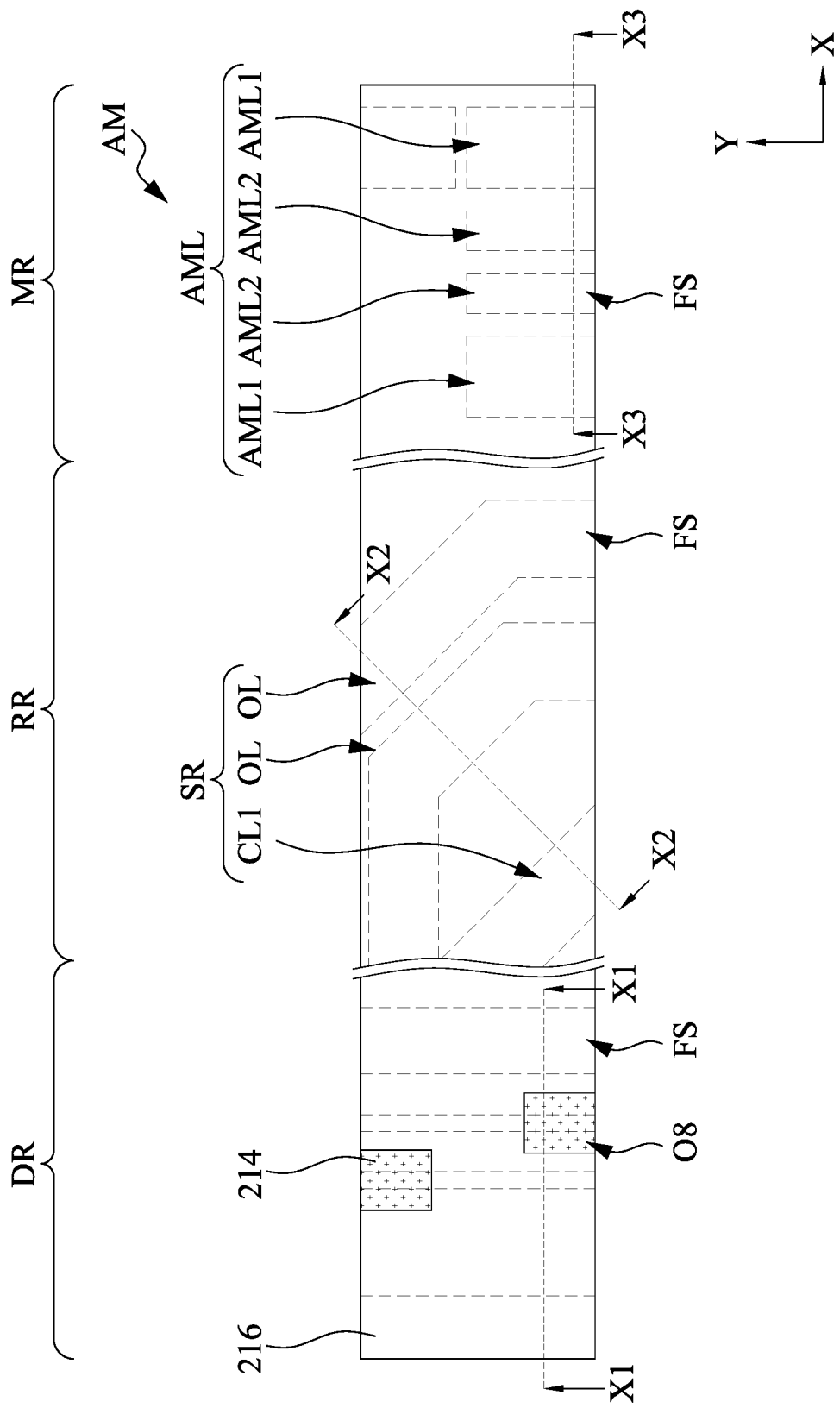
Figure 9C:
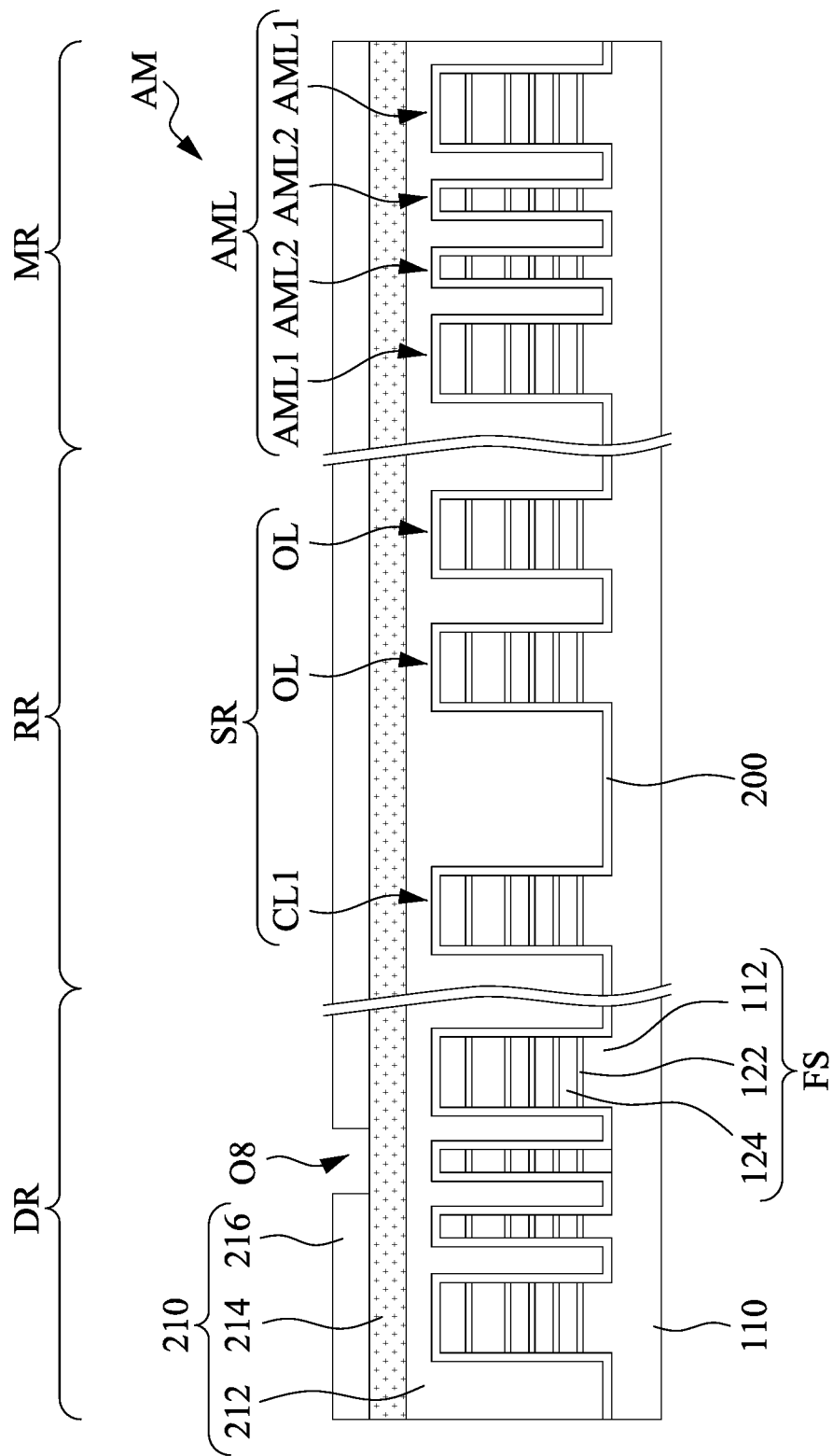

Reference is made to FIGS. 9A-9C. A photoresist mask 210 is formed over the structure of FIG. 8. In some embodiments, the photoresist mask 210 may be a tri-layer photoresist. For example, the photoresist mask 210 includes a bottom layer 212, a middle layer 214 over the bottom layer 212, and a photoresist layer 216 over the middle layer 214. The bottom layer 212 may include organic or inorganic material. The middle layer 214 may include silicon nitride, silicon oxynitride, SiOC, or the like. The photoresist layer 216 may include a photosensitive material. The photoresist layer 216 may be formed by suitable photolithography process, and have openings O8 (or trenches) therein. The photolithography process may include coating a photoresist layer (not shown), exposing the photoresist to a pattern, performing post-exposure bake processes, and developing the resist to form a patterned mask including the resist. In some embodiments, the photolithography process may further include performing a pattern recognition technique to align a mask (or reticle) with the alignment mark AM, and exposing the photoresist to the pattern. For example, an after-develop inspection (ADI) may be performed to inspect positions of the openings O8 in the photoresist layer 216 for checking mask alignment.

Figure 10A:
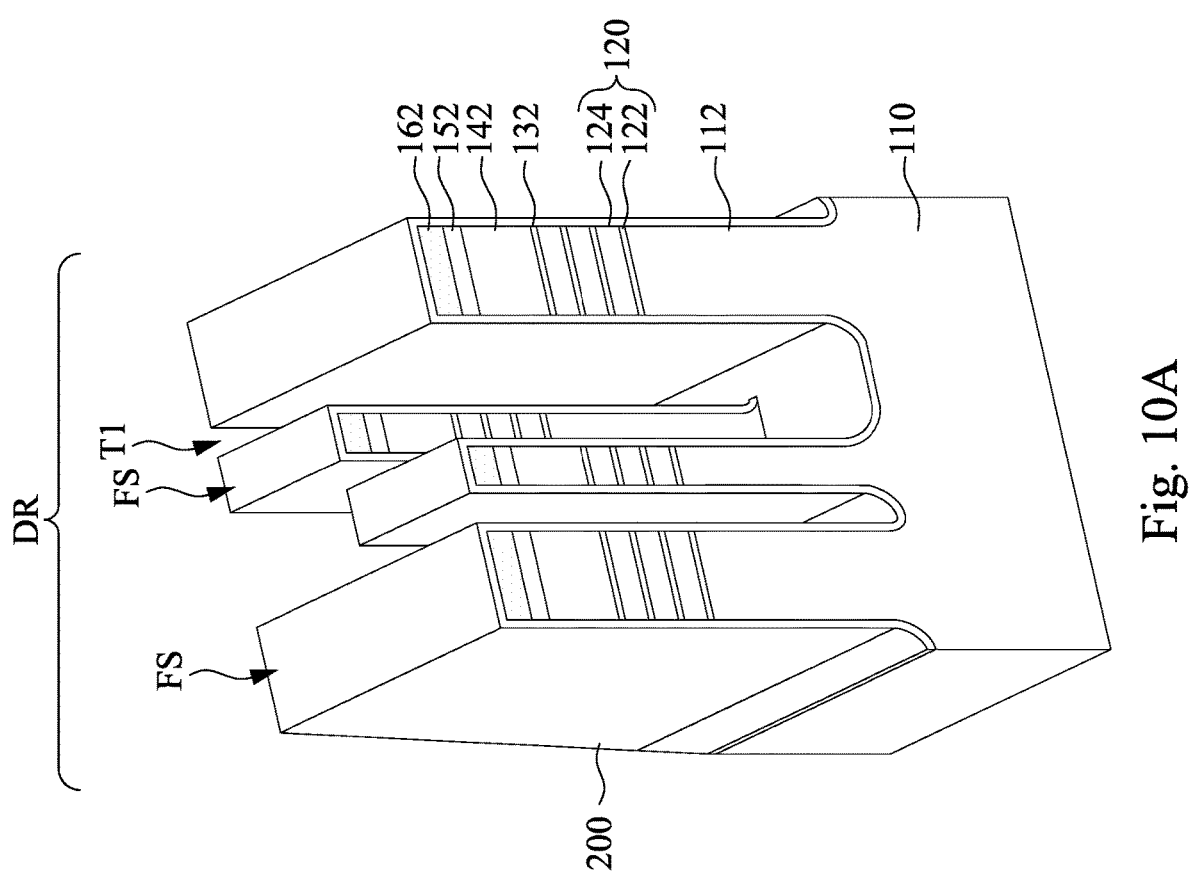
Figure 10B:
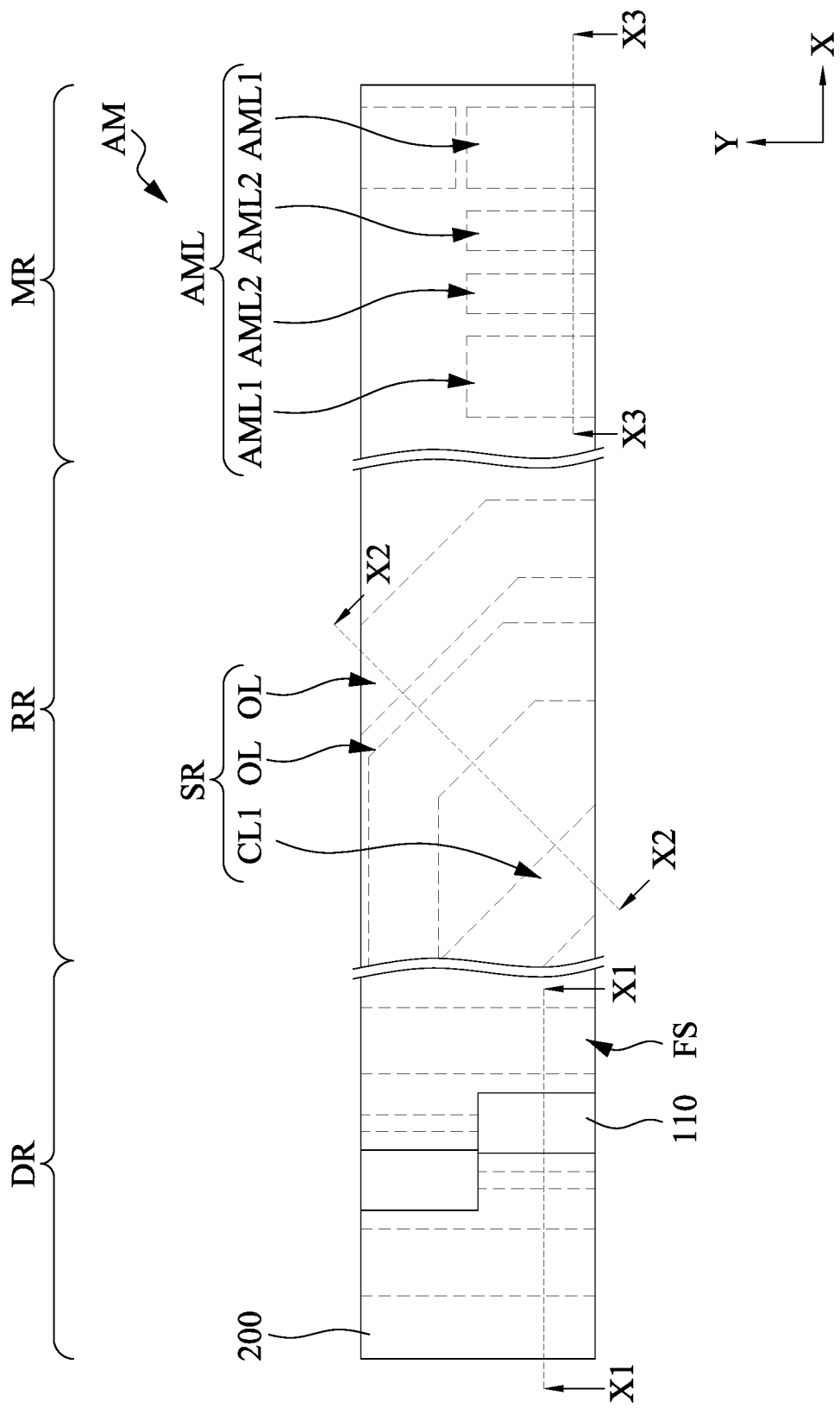
Figure 10C:
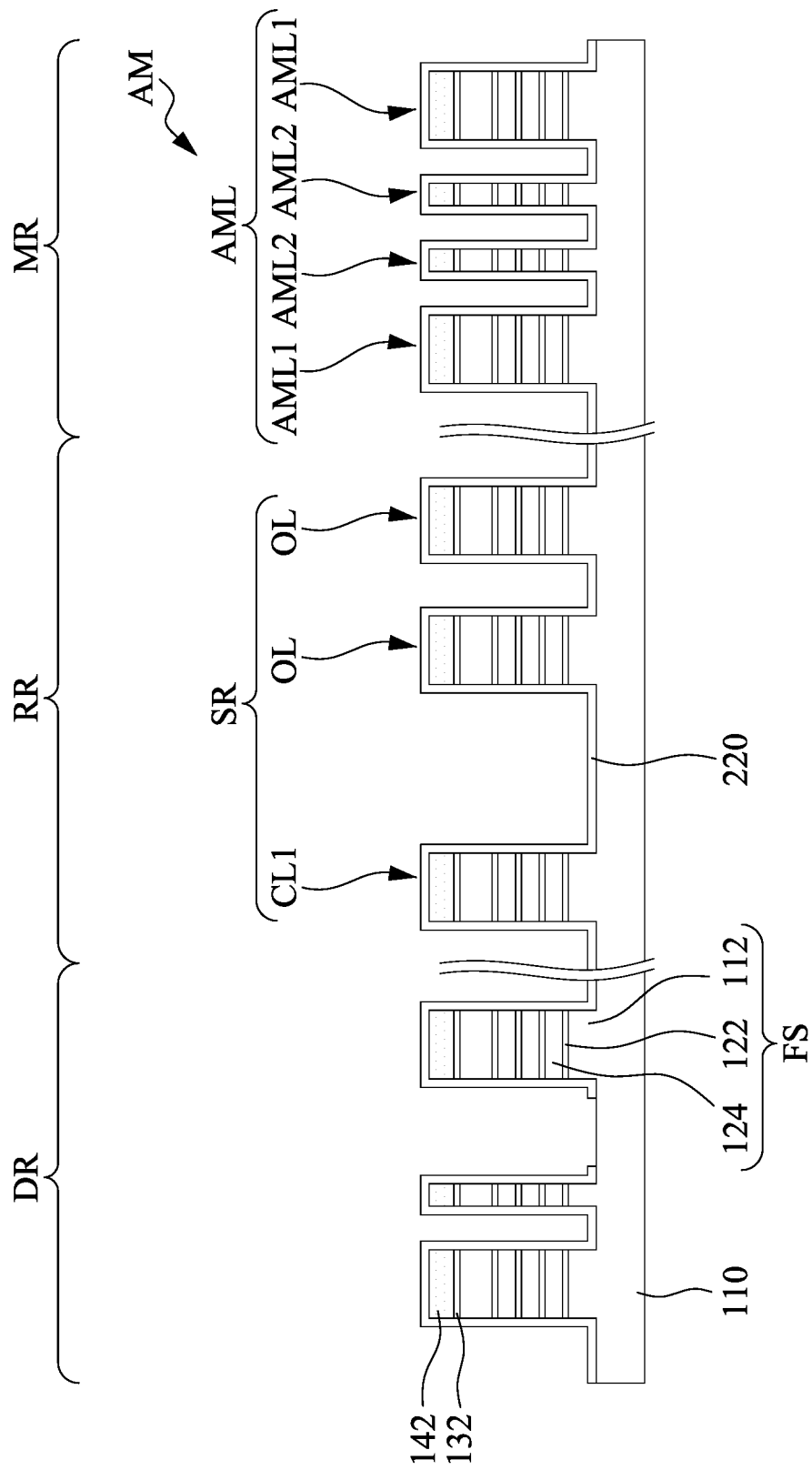

Reference is made to FIGS. 10A-10C. The opening O8 in the photoresist layer 216 (referring to FIGS. 9A-9C) is extended through the middle layer 214, the bottom layer 212 (referring to FIGS. 9A-9C) and the fins FS using, for example, plural etching processes. By the etching processes, one of the fins FS in the device region DR is cut into plural separated fins FS. As the photoresist layer 216 (referring to FIGS. 9A-9C) covers the entire seal ring region SR and the entire mark region MR, the fins FS in the seal ring region SR and the mark region MR are not cut at this step. In some embodiments, after the etching processes, the openings O8 expose the substrate 110 that is present underneath the opening O8. The middle layer 214 and the bottom layer 212 may be removed by suitable stripping process after the etching processes.

Figure 11A:
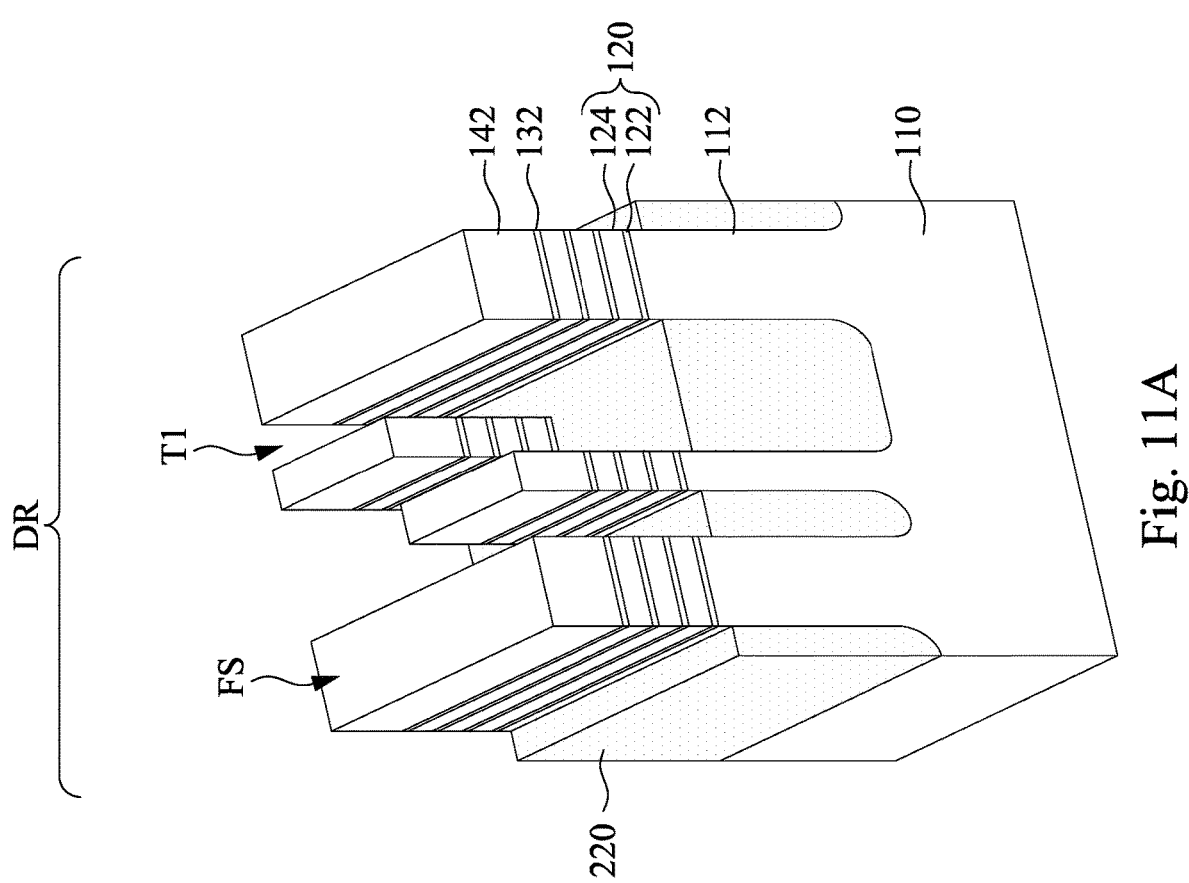
Figure 11B:
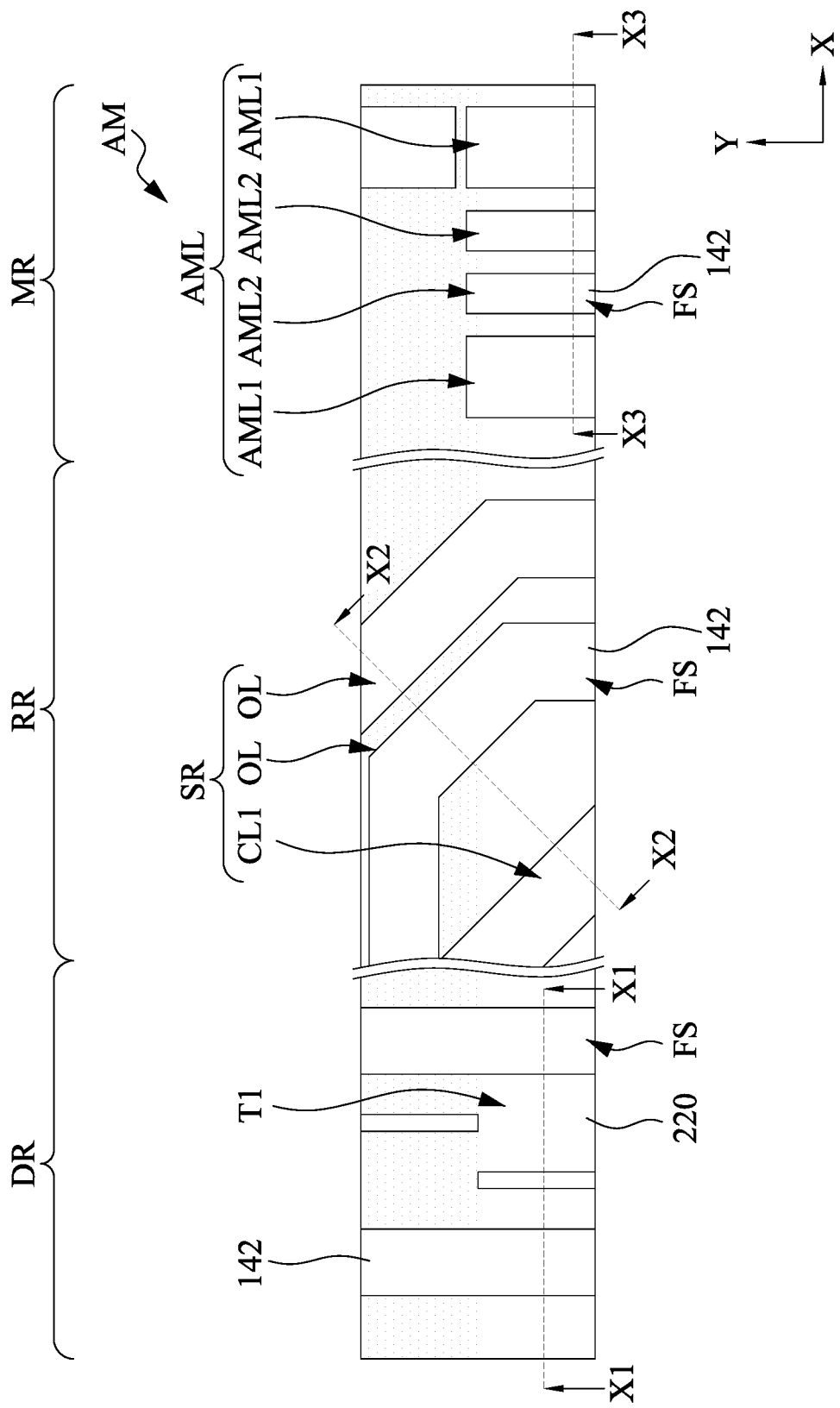
Figure 11C:
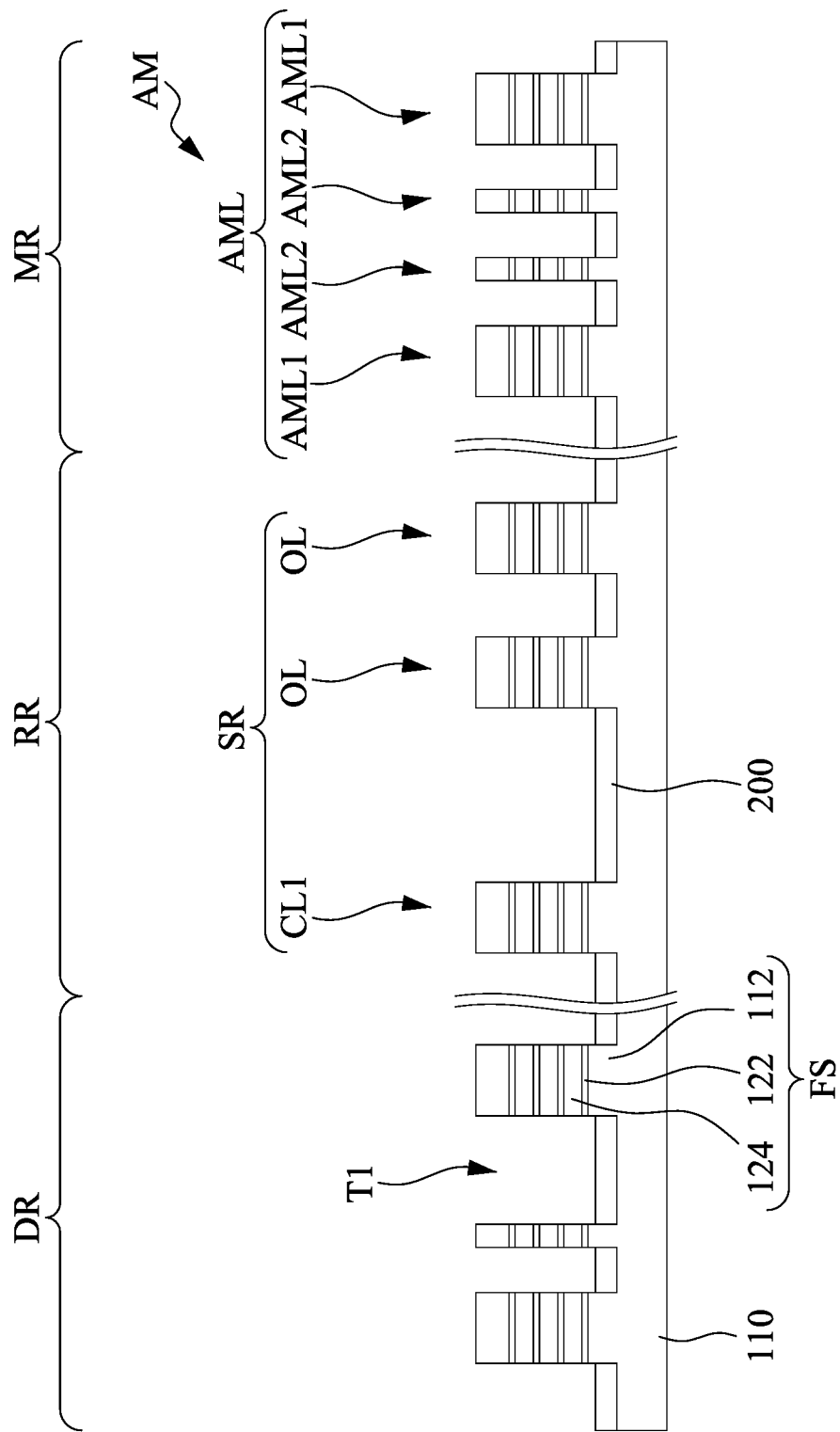

Reference is made to FIGS. 11A-11C. Shallow trench isolation (STI) structures 220 are formed in the trenches T1 between the fins FS. By way of example and not limitation, a dielectric layer is first deposited over the substrate 110, filling the trenches T1 with the dielectric material. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a sub-atmospheric CVD (SACVD) process, a flowable CVD process, an ALD process, a physical vapor deposition (PVD) process, and/or other suitable processes. In some embodiments, after deposition of the dielectric layer, the integrated circuit structure may be annealed, for example, to improve the quality of the dielectric layer. Through the annealing process, the silicon liner layer 200 may be oxidized into silicon oxide, serving as a portion of the STI structure 220. In some embodiments, the dielectric layer (and subsequently formed STI structure 220) may include a multi-layer structure, for example, having one or more liner layers.

In some embodiments of forming the isolation (STI) features, after deposition of the dielectric layer, the deposited dielectric material is thinned and planarized, for example by a chemical mechanical polishing (CMP) process. In some embodiments, the hard mask layer 142 functions as a CMP stop layer, so that the top surface of the STI structure 220 may be substantially coplanar with the top surface of the hard mask layer 142 after the CMP process is completed. Next, the STI structures 220 are recessed in an etch back process, such that the fins FS has exposed sidewall extending above the STI structure 220. In some embodiments, the recessing process may include a dry etching process, a wet etching process, and/or a combination thereof. The hard mask layer 142 remains covering top surfaces of the fins FS during and after the recessing of the STI structure 220. In some embodiments, a recessing depth is controlled (e.g., by controlling an etching time) so as to result in a target height of the exposed upper portion of the fins FS. In the illustrated embodiments, the target height exposes each of the epitaxial layers 122 and 124 of the epitaxial stack 120 in the fins FS.

Figure 12A:
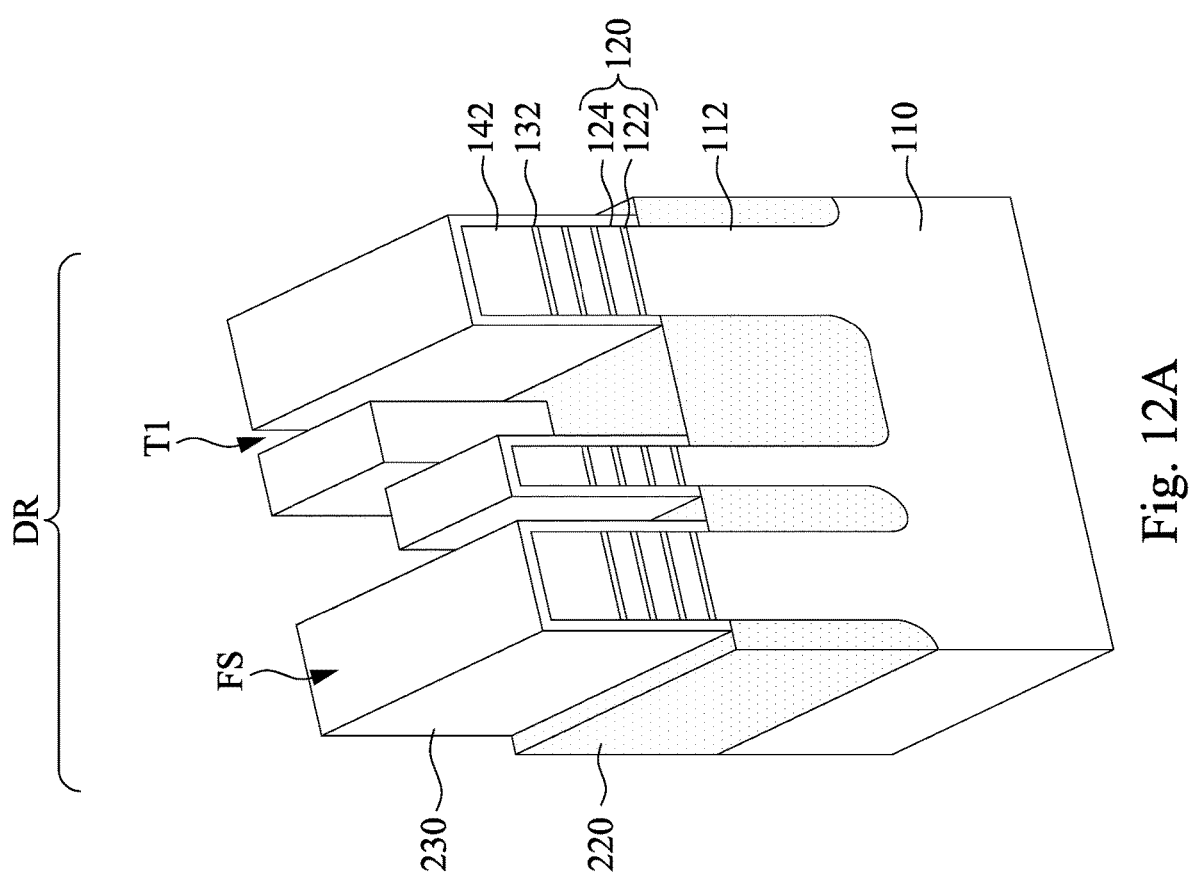
Figure 12B:
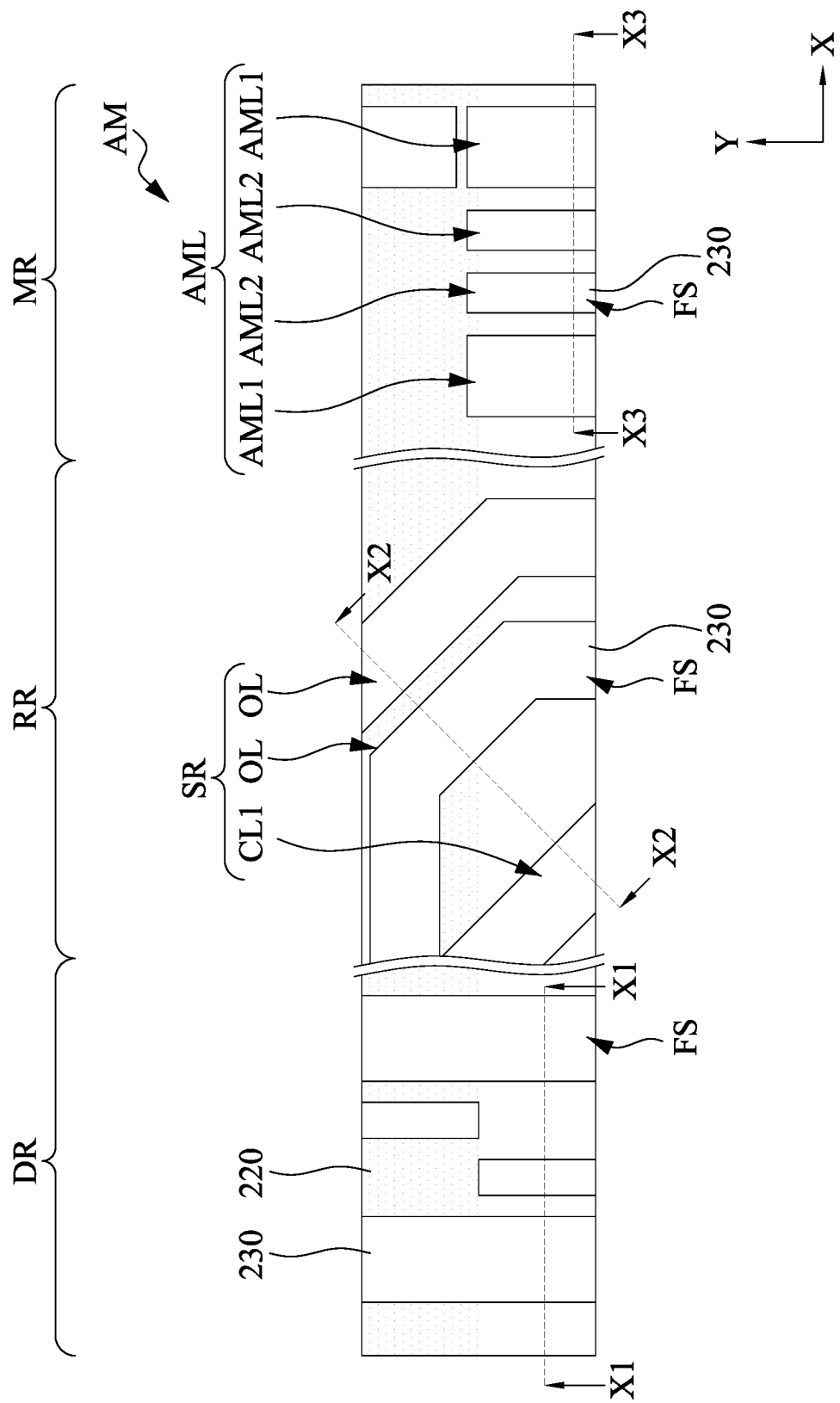
Figure 12C:
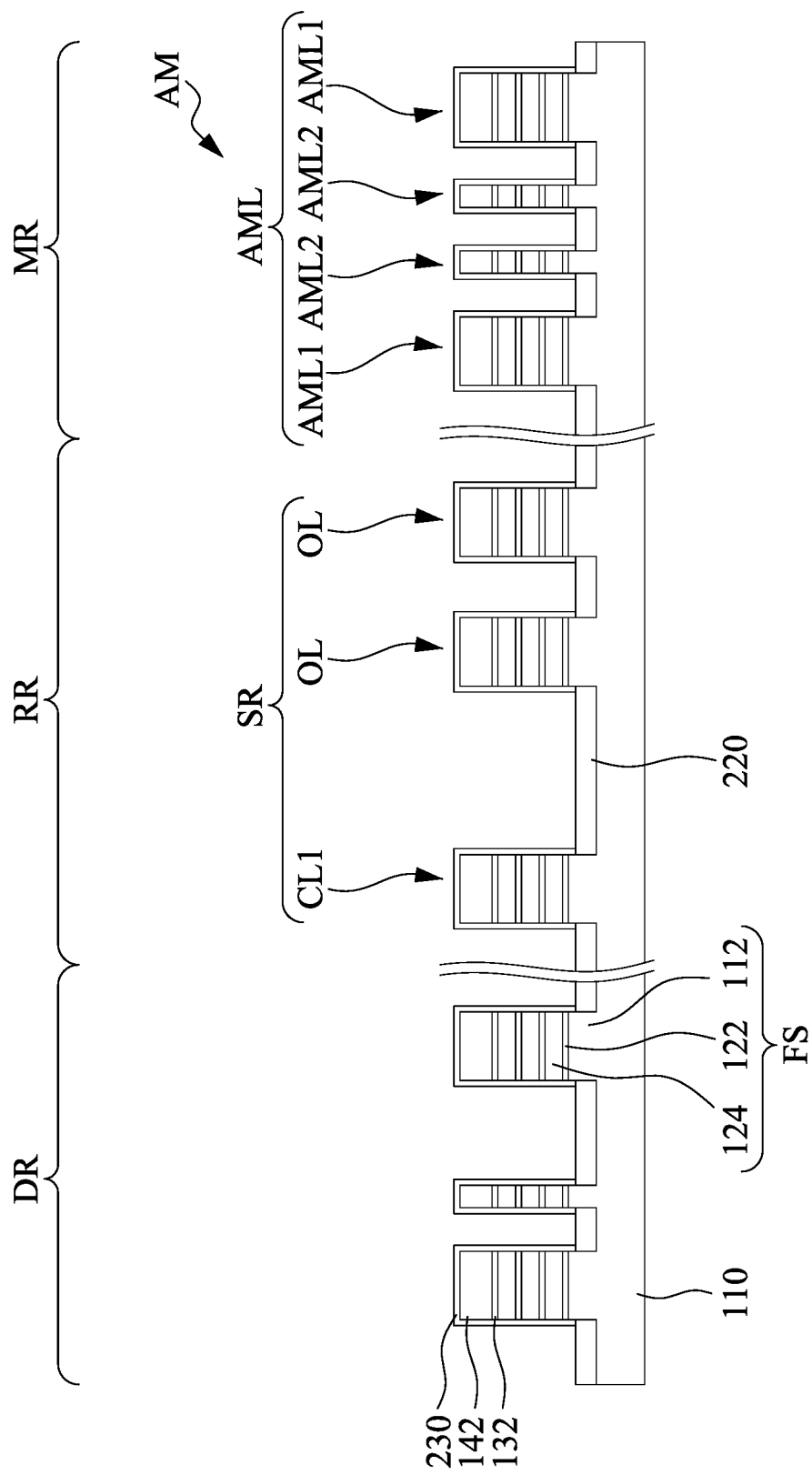

Reference is made to FIGS. 12A-12C. Sacrificial epitaxial structures 230 are respectively formed over the respective fins FS. In some embodiments, the sacrificial epitaxial structures 230 are of the same composition as the epitaxial layers 122 in the fins FS and thus different composition than the epitaxial layers 124 in the fins FS. Therefore, the sacrificial epitaxial structures 230 and the epitaxial layers 122 can be removed together in a following channel release step. By way of example and not limitation, the sacrificial epitaxial structures 230 are SiGe.

In some embodiments, the sacrificial epitaxial structures 230 may be cladding epitaxial structures formed using one or more epitaxy or epitaxial (epi) processes, such that SiGe features and/or other suitable features can be formed in a crystalline state on the fins FS. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the exposed epitaxial layers 122, 124 (e.g., Si and/or SiGe) in the fins FS.

Figure 13A:
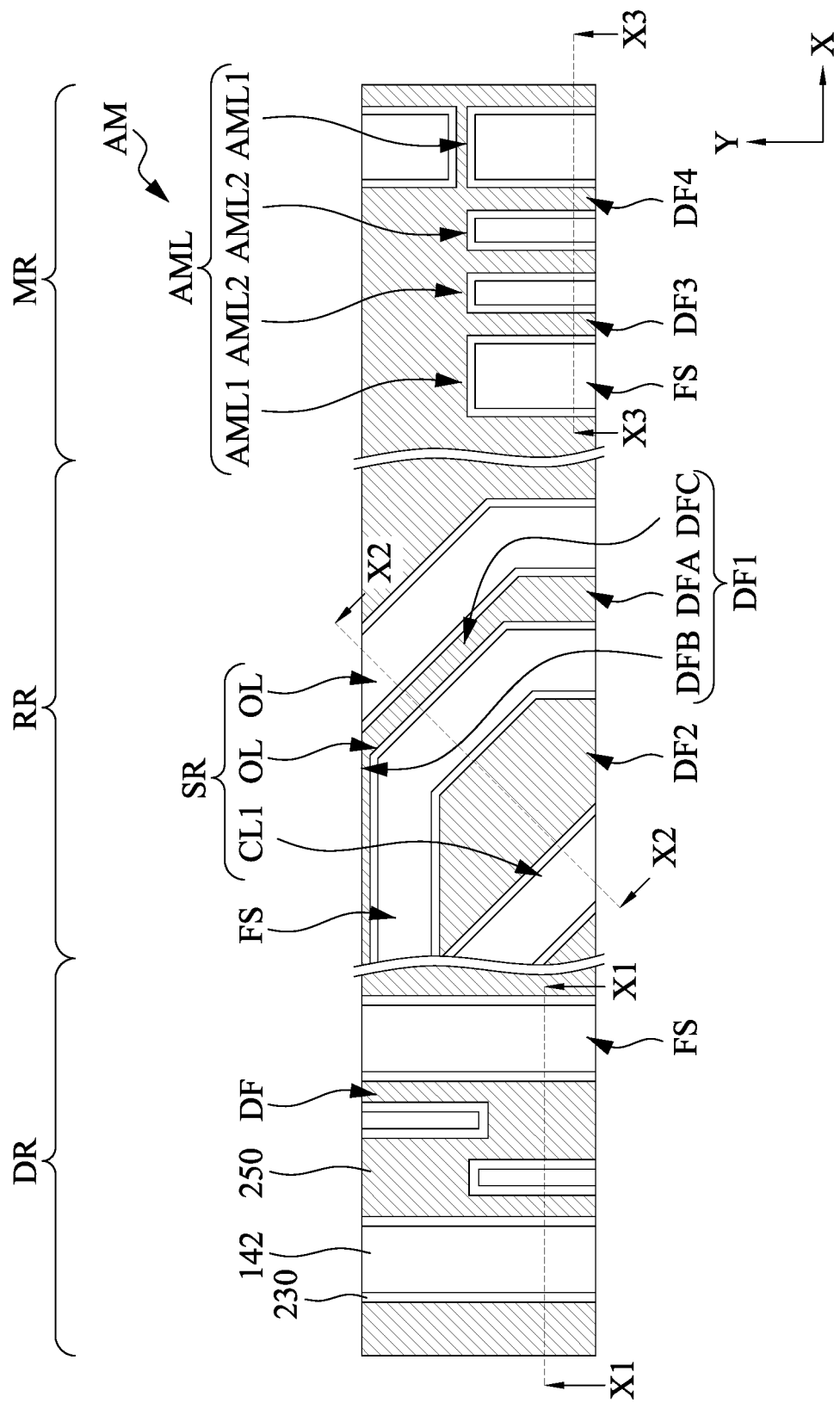
Figure 13B:
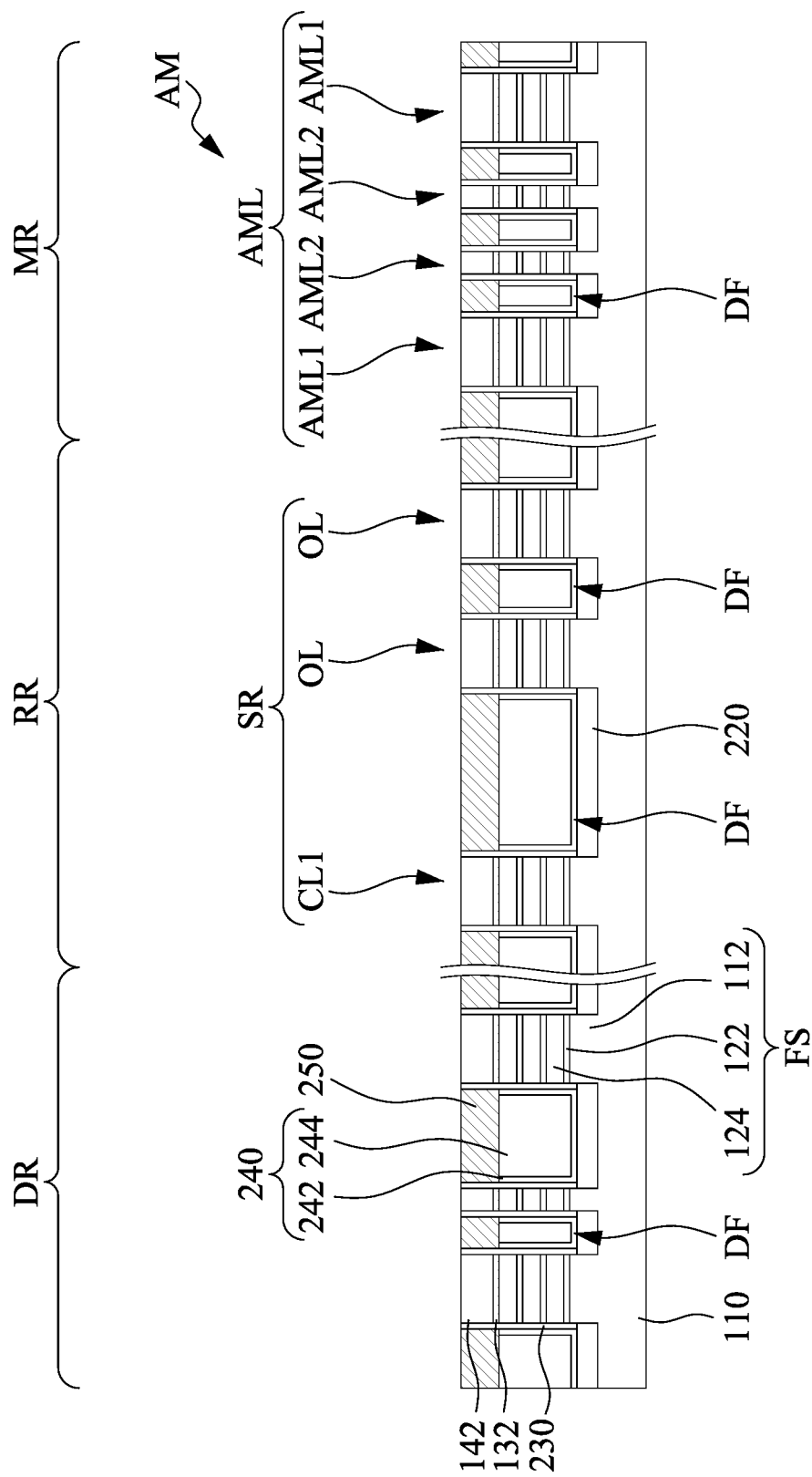

FIGS. 13A-13B illustrate a perspective view and a cross-sectional view of formation of hybrid fins 240 alternately arranged with the fins FS. A liner layer 242 is deposited conformally over the sacrificial epitaxial structures 230 and the STI structure 220. The liner layer 242 may serve to prevent subsequently formed source/drain epitaxial structures and metal gate structures from oxidation. In some embodiments, the liner layer 242 may include, for example, a low-k dielectric material (with dielectric constant lower than about 7) such as $SiO_2$, SiN, SiCN, SiOC, SiOCN, the like, or combinations thereof. In some embodiments, the liner layer 242 includes a high-k dielectric material (with dielectric constant higher than about 7) such as $HfO_2$, $ZrO_2$, $HfAlO_x$, $HfSiO_x$ and $Al_2O_3$, the like or combinations thereof. The liner layer 242 may be formed by depositing one or more dielectric materials conformally over the sacrificial epitaxial structures 230 using processes such as, CVD process, a subatmospheric CVD (SACVD) process, an ALD process, a PVD process, or other suitable process.

A fill dielectric (e.g., $SiO_2$) 244 is then deposited over the liner layer 242 until trenches in the liner layer 242 are overfilled. A CMP process is then performed on the fill dielectric 244 until top surfaces of the sacrificial epitaxial structures 230 are exposed. Remaining portions of the liner layer 242 and the fill dielectric 244 serve as hybrid fins 240 interposing the fins FS. Next, the hybrid fins 240 are etched back to below the top surfaces of the sacrificial epitaxial structures 230, such that the sacrificial epitaxial structures 230 protrude above the etched-back hybrid fins 240. The etch back process may include a wet etch, a dry etch, or a combination thereof. Etchant used in the etch back process is chosen to selectively etch the hybrid fins 240 (e.g., nitride and/or oxide) without substantially etching sacrificial epitaxial structures 230 (e.g., SiGe structures). In some embodiments where the selective etch back process is wet etching, the etchant used to selectively each back the hybrid fins 240 includes, for example, dilute HF. In some embodiments where the selective etch back process is dry etching, the etchant used to selectively etch back the hybrid fins 240 includes, for example, $NF_3$, $NH_3$, the like, or combinations thereof. The etch back depth is controlled (e.g., by controlling an etching time) so as to result in a target height of the protruding portions of the fins FS. In the illustrated embodiments, the target height is selected such that the top surfaces of the etched-back hybrid fins 240 are substantially level with a top surface of a topmost one of the epitaxial layers 124 (i.e., channel layers serving as channels of GAA transistors). However, in some other embodiments, the top surfaces of the etched-back hybrid fins 240 may be higher than or lower than the top surface of the topmost one of the channel layers 124.

Dielectric caps 250 are then formed over the hybrid fins 240. In some embodiments, one or more dielectric layers is first deposited over the hybrid fins 240 and the sacrificial epitaxial structures 230, followed by performing a CMP process on the deposited one or more dielectric layers until the hard mask layer 142 is exposed. In some embodiments, the dielectric caps 250 include a high-k dielectric material (with dielectric constant higher than about 7) such as $HfO_2$, $ZrO_2$, $HfAlO_x$, $HfSiO_x$ and $Al_2O_3$, the like or combinations thereof. In some embodiments, a hybrid fin 240 and a dielectric cap 250 over the hybrid fin 240 in combination may be referred to as a dielectric hybrid fin DF.

In some embodiments, the dielectric hybrid fin DF are formed alongside the fins FS (e.g., the lines of the seal ring SR and the lines of alignment marks in FIGS. 2A-3), and may space two adjacent fins FS (e.g., the lines of the seal ring SR and the lines of alignment marks in FIGS. 2A-3) from each other. The dielectric hybrid fin DF in the seal ring region RR may be denoted as dielectric hybrid fins DF1 and DF2. For example, the dielectric hybrid fin DF1 spaces two adjacent outer rings OL (or inner rings IL in FIG. 2A) from each other, the dielectric hybrid fin DF2 spaces a line of the corner portions CL1 from a neighboring outer ring OL. As shown in FIG. 13A, in the top view, the dielectric hybrid fin DF1 may have dielectric lines DFA-DFC, in which the dielectric lines DFA and DFB respectively extend along the directions X and Y, and the dielectric line DFC is slanted and connecting the dielectric line DFA to the dielectric line DFB. The dielectric hybrid fin DF in the mark region MR may be denoted as dielectric hybrid fins DF3 and DF4. For example, the dielectric hybrid fin DF3 spaces a main line AML1 from a neighboring dummy line AML2, and the dielectric hybrid fin DF4 spaces two adjacent dummy lines AML2 from each other.

Figure 14A:
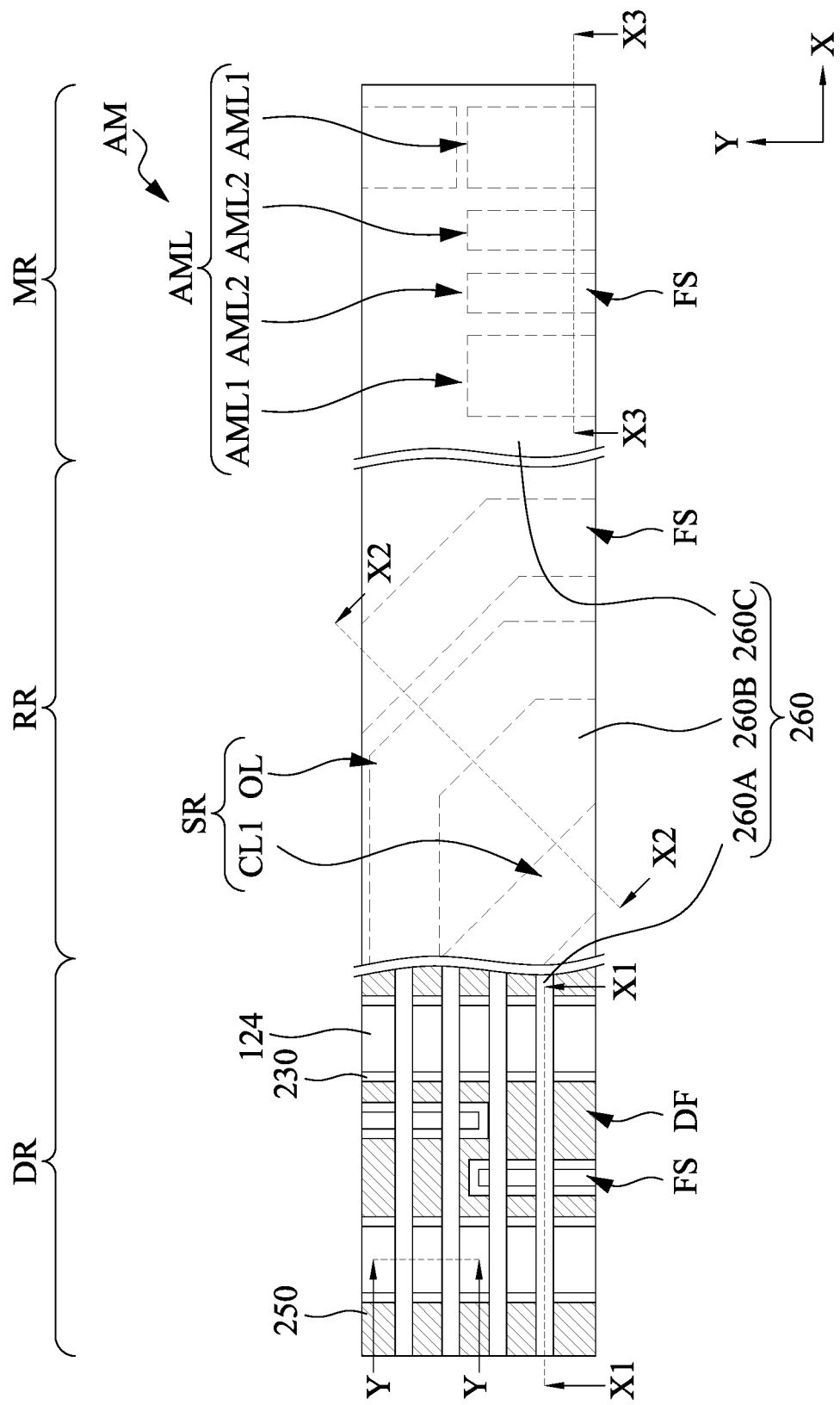
Figure 14B:
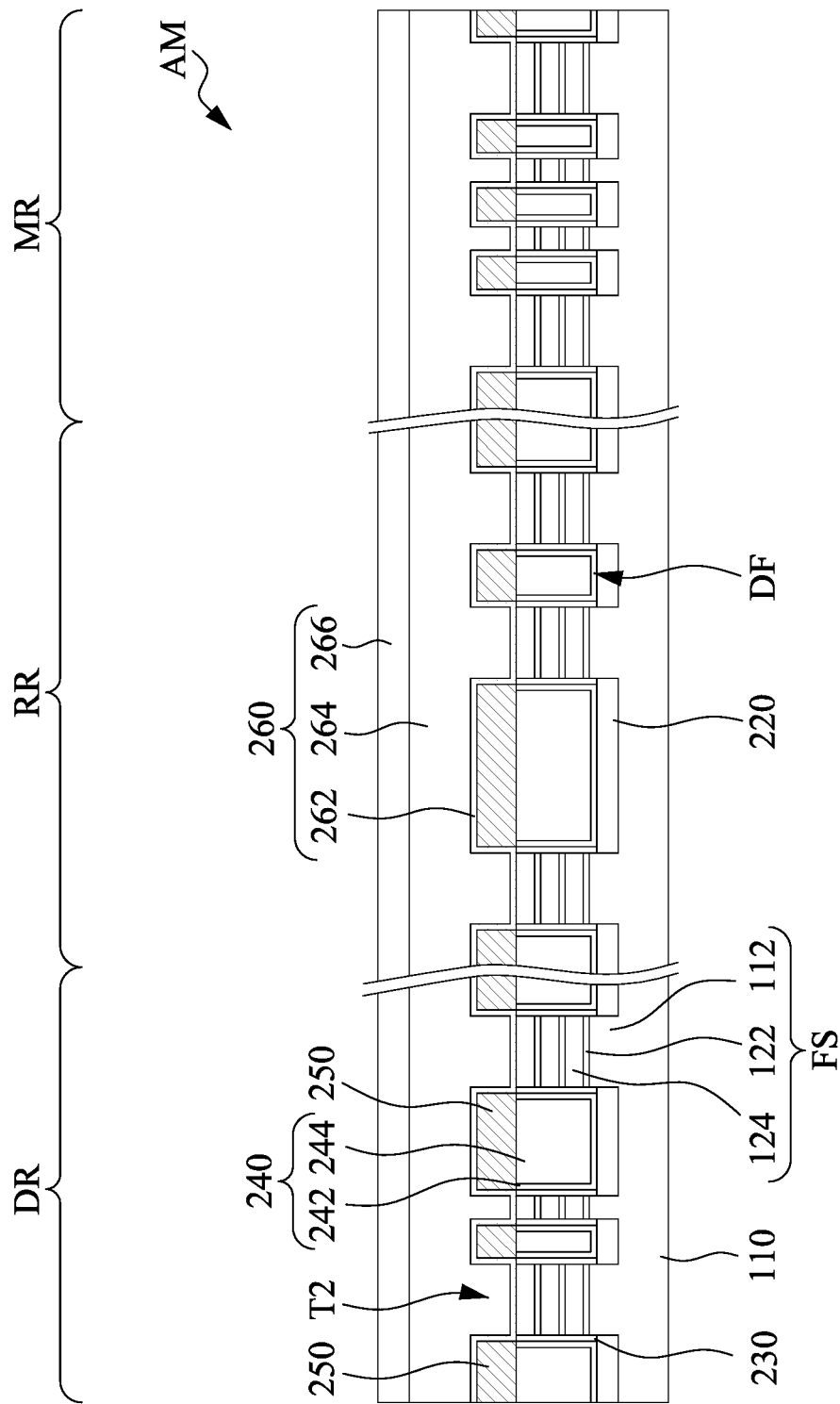
Figure 14C:
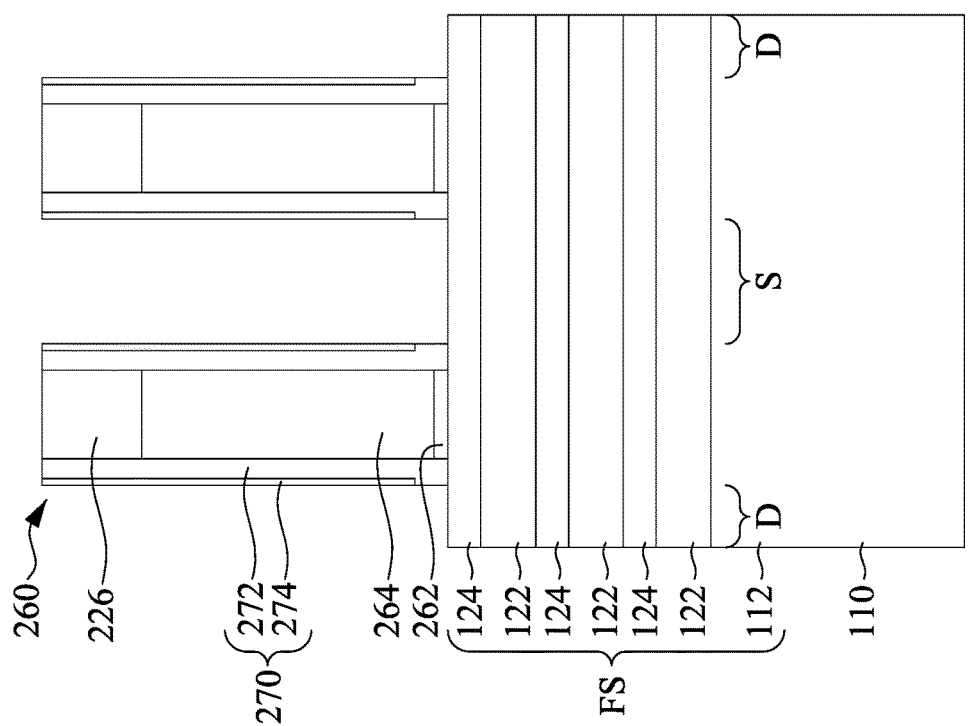

FIG. 14A illustrates a perspective view of the formation of dummy gate structures. FIG. 14B illustrates a cross-sectional view of the formation of dummy gate structures taken along cuts X1-X1, X2-X2, and X3-X3 of FIG. 14A. FIG. 14C illustrates a cross-sectional view of the formation of dummy gate structures taken along cut Y-Y of FIG. 14A. The hard mask layer 142, the pad oxide layer 132, and upper portions of the sacrificial epitaxial structures 230 (referring to FIGS. 13A and 13B) are removed by using one or more etching processes, resulting in trenches T2 between corresponding dielectric caps 250. In some embodiments, the hard mask layer 142 (referring to FIGS. 13A and 13B) including nitrides may be removed, for example, by a wet etching process using $H_3PO_4$ or other suitable etchants that selectively etches nitride at a faster etch rate than etching other materials. After the hard mask layer 142 (referring to FIGS. 13A and 13B) is removed, the pad oxide layer 132 (referring to FIGS. 13A and 13B) can be removed by a wet etching process using diluted hydrofluoric acid (HF) or other suitable etchants that selectively etches oxide at a faster etch rate than etching other materials. Before or after the removal of the hard mask layer 142 and the pad oxide layer 132 (referring to FIGS. 13A and 13B), the sacrificial epitaxial structures 230 are removed by suitable etching process. In some embodiments where the sacrificial epitaxial structures 230 are formed of SiGe, they can be etched using a selective wet etching includes an APM etch (e.g., ammonia hydroxide-hydrogen peroxide-water mixture) that etches SiGe at a faster etch rate than it etches Si. In this way, the Si channel layers 124 can remain substantially intact after the sacrificial epitaxial structures 230 is removed.

Subsequently, a dummy gate dielectric layer 262 is then conformally deposited in the trenches T2 and over the dielectric caps 250. In some embodiments, the dummy gate dielectric layer 262 may include $SiO_2$, silicon nitride, a high-k dielectric material and/or other suitable material. In various examples, the dummy gate dielectric layer 262 may be deposited by a CVD process, a subatmospheric CVD (SACVD) process, a flowable CVD process, an ALD process, a PVD process, or other suitable process. By way of example, the dummy gate dielectric layer 262 may be used to prevent damages to the fins FS by subsequent processes (e.g., subsequent formation of the dummy gate structures).

Dummy gate structures 260 are formed in accordance with some embodiments of the present disclosure. In some embodiments, the dummy gate structures 260 each include the dummy gate dielectric layer 262, a dummy gate electrode layer 264 and a hard mask 266. In some embodiments, the dummy gate structures 260 are formed by various process steps such as layer deposition, patterning, etching, as well as other suitable processing steps. Exemplary layer deposition processes include CVD (including both low-pressure CVD and plasma-enhanced CVD), PVD, ALD, thermal oxidation, e-beam evaporation, or other suitable deposition techniques, or combinations thereof. In forming the gate structures for example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In some embodiments, the dummy gate electrode layer 264 may include polycrystalline silicon (polysilicon). In some embodiments, the hard mask 266 includes an oxide layer such as a pad oxide layer that may include $SiO_2$, and a nitride layer such as a pad nitride layer that may include $Si_3N_4$ and/or silicon oxynitride. In some embodiments, after patterning the dummy gate electrode layer 264, exposed portions of the dummy gate dielectric layer 262 not covered under the patterned dummy gate electrode layer 264 are removed from source/drain regions of the fins FS. The etch process may include a wet etch, a dry etch, and/or a combination thereof. The etch process is chosen to selectively etch the dummy gate dielectric layer 262 without substantially etching the fins FS, the dummy gate electrode layer 264 and the hard mask 266.

In FIG. 14A, the dummy gate structures 260 may include dummy gate structures 260A-260C respectively in the regions DR, RR, and MR. The dummy gate structures 260A may extend along a gate direction (e.g., the direction Y) intersecting or orthogonal to the fin direction (e.g., the direction X) and expose portions of the semiconductor fins FS in the device region DR. The dummy gate structure 260B may cover the entire seal ring region RR. The dummy gate structure 260C may cover the entire mark region RR. Thus, the dummy gate structure 260A-260C can protect portions of the semiconductor fins FS in the device region DR, the entire seal ring region RR, and the entire seal ring region RR from being etched in subsequent etching processes.

In some embodiments, gate spacers 270 are formed on sidewalls of the dummy gate structures 260. In some embodiments of formation of the gate spacers 270, a spacer material layer is first deposited over the substrate 110. The spacer material layer may be a conformal layer that is subsequently etched to form gate sidewall spacers on sidewalls of the dummy gate structures 260. In the illustrated embodiments, a spacer material layer is disposed conformally on top and sidewalls of the dummy gate structures 260. The spacer material layer may include a dielectric material such as silicon oxide, silicon nitride, silicon oxynitride, SiCN films, silicon oxycarbide, SiOCN films, and/or combinations thereof. In some embodiments, the spacer material layer includes multiple layers, such as a first spacer layer 272 and a second spacer layer 274 formed over the first spacer layer 272. By way of example, the spacer material layer may be formed by depositing a dielectric material over the gate structures 260 using processes such as, CVD process, a subatmospheric CVD (SACVD) process, a flowable CVD process, an ALD process, a PVD process, or other suitable process. An anisotropic etching process is then performed on the deposited spacer material layer to expose portions of the fins FS not covered by the dummy gate structures 260 (e.g., in source/drain regions of the fins FS denoted as "S" and "D").

Portions of the spacer material layer directly above the dummy gate structures 220 may be completely removed by this anisotropic etching process. Portions of the spacer material layer on sidewalls of the dummy gate structures 260 may remain, forming gate sidewall spacers, which are denoted as the gate spacers 270, for the sake of simplicity. It is noted that although the gate spacers 270 are multi-layer structures in the cross-sectional view of FIG. 14C, they are omitted in the top view of FIG. 14A for the sake of simplicity.

Figure 15A:
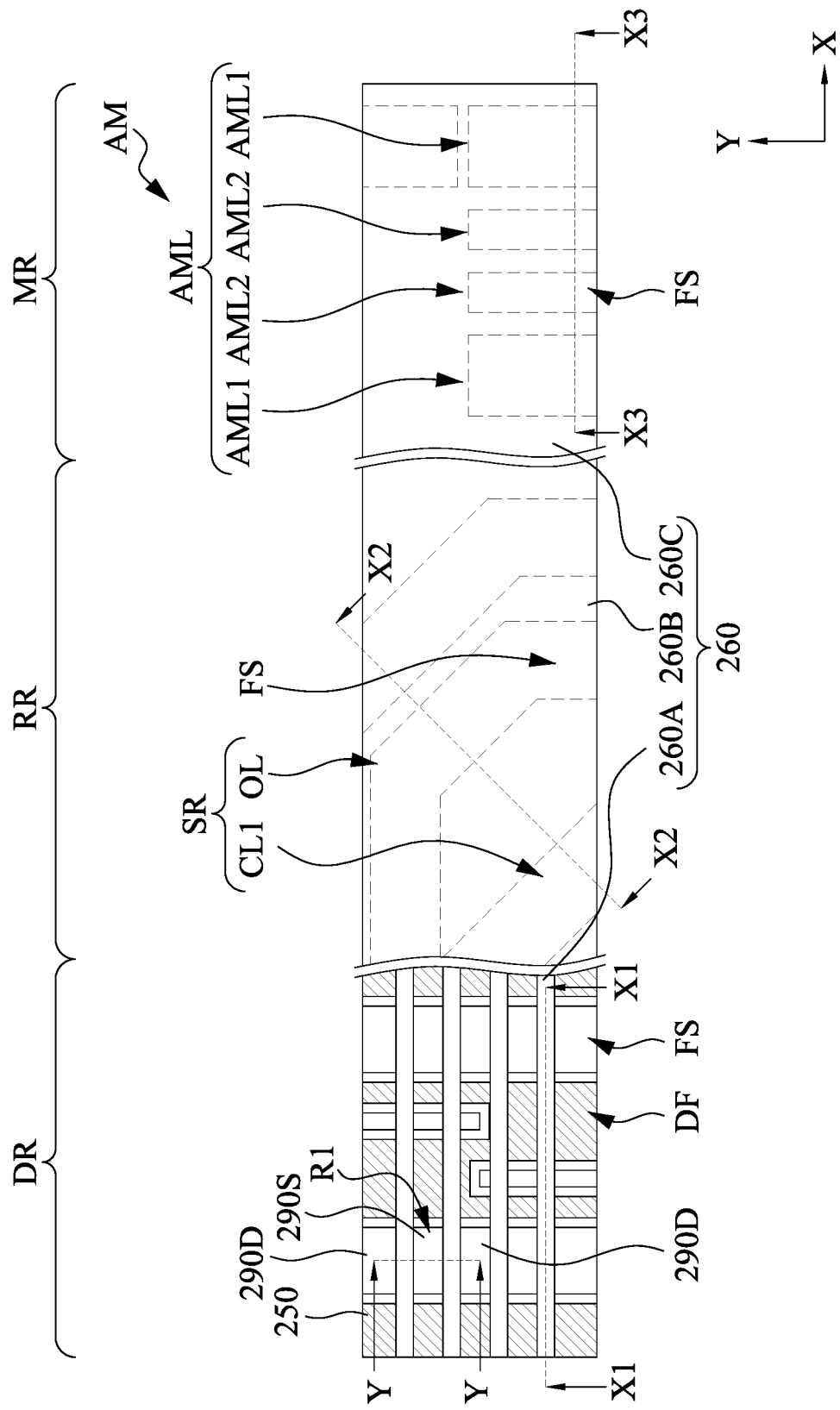
Figure 15B:
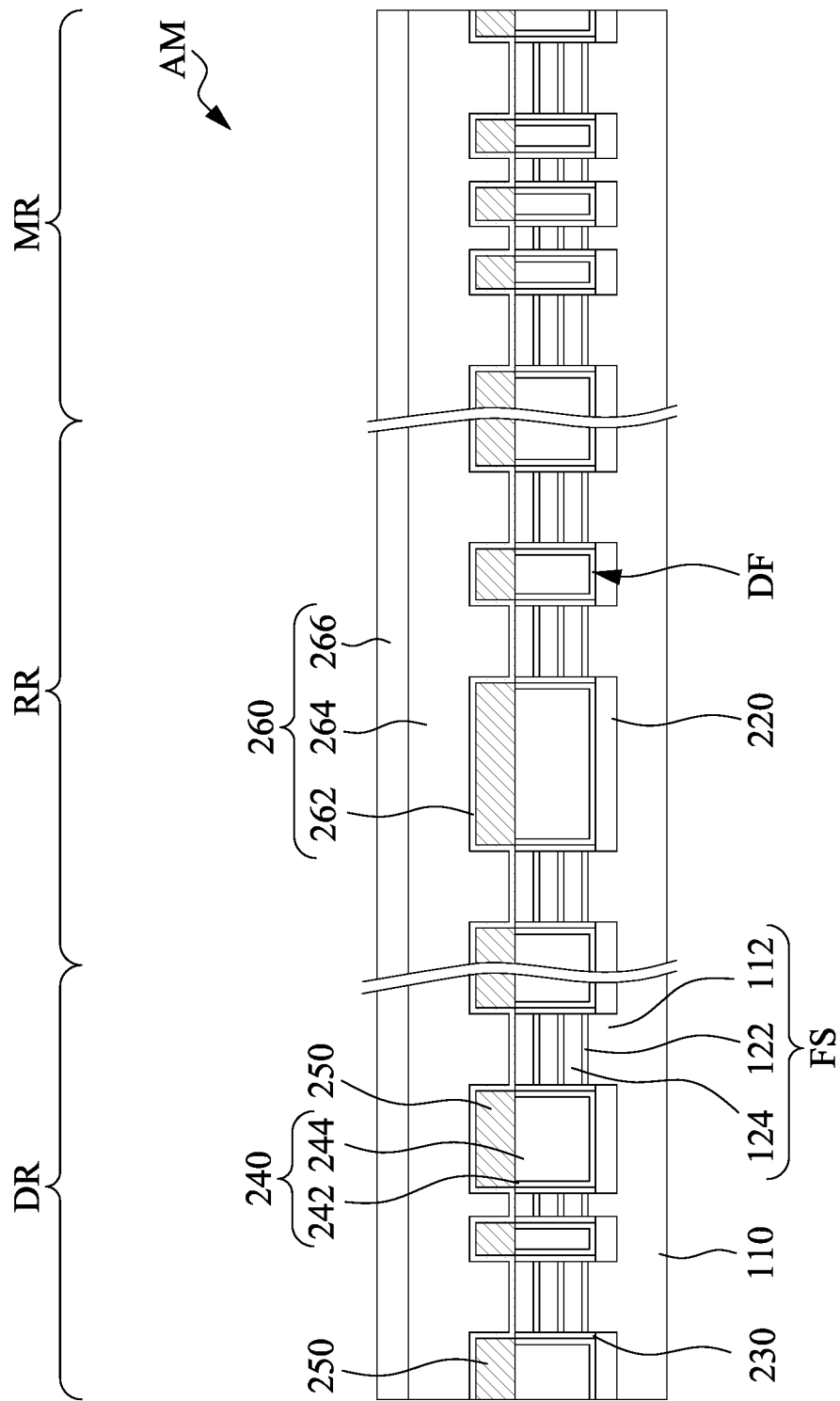
Figure 15C:
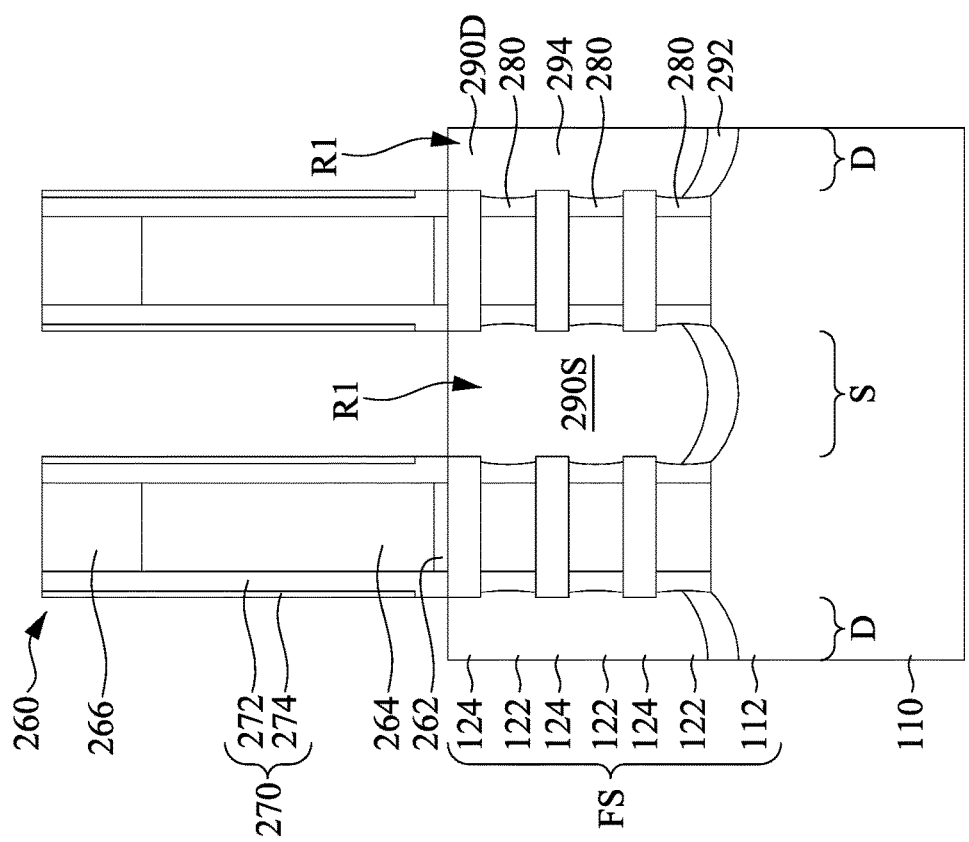

FIG. 15A illustrates a perspective view of the formation of source/drain structures. FIG. 15B illustrates a cross-sectional view taken along cuts X1-X1, X2-X2, and X3-X3 of FIG. 15A. FIG. 15C illustrates a cross-sectional view taken along cut Y-Y of FIG. 15A. Exposed portions of the semiconductor fins FS that extend laterally beyond the gate spacers 270 (e.g., in source/drain regions S/D of the fins FS) are etched by using, for example, an anisotropic etching process that uses the dummy gate structures 260 and the gate spacers 270 as an etch mask, resulting in recesses R1 into the semiconductor fins FS and between corresponding dummy gate structures 260. After the anisotropic etching, end surfaces of the sacrificial layers 122 and channel layers 124 are substantially aligned with respective outermost sidewalls of the gate spacers 270, due to the anisotropic etching. In some embodiments, the anisotropic etching may be performed by a dry chemical etch with a plasma source and a reaction gas. The plasma source may be an inductively coupled plasma (ICR) source, a transformer coupled plasma (TCP) source, an electron cyclotron resonance (ECR) source or the like, and the reaction gas may be, for example, a fluorine-based gas (such as $SF_6$, $CH_2F_2$, $CH_3F$, $CHF_3$, or the like), chloride-based gas (e.g., $Cl_2$), hydrogen bromide gas (HBr), oxygen gas ($O_2$), the like, or combinations thereof.

The sacrificial layers 122 may be laterally or horizontally recessed by using suitable etch techniques, resulting in lateral recesses each vertically between corresponding channel layers 124. This step may be performed by using a selective etching process. By way of example and not limitation, the sacrificial layers 122 are SiGe and the channel layers 124 are silicon allowing for the selective etching of the sacrificial layers 122. In some embodiments, the selective wet etching includes an APM etch (e.g., ammonia hydroxide-hydrogen peroxide-water mixture) that etches SiGe at a faster etch rate than it etches Si. In some embodiments, the selective etching includes SiGe oxidation followed by a $SiGeO_x$ removal. For example, the oxidation may be provided by $O_3$ clean and then $SiGeO_x$ removed by an etchant such as $NH_4OH$ that selectively etches $SiGeO_x$ at a faster etch rate than it etches Si. Moreover, because oxidation rate of Si is much lower (sometimes 30 times lower) than oxidation rate of SiGe, the channel layers 124 remain substantially intact during laterally recessing the sacrificial layers 122. As a result, the channel layers 124 laterally extend past opposite end surfaces of the sacrificial layers 122.

After the sacrificial layers 122 have been laterally recessed, an inner spacer material layer is formed to fill the recesses left by the lateral etching of the sacrificial layers 122. The inner spacer material layer may be a low-k dielectric material (with dielectric constant lower than about 7), such as $SiO_2$, SiN, SiCN, or SiOCN, and may be formed by a suitable deposition method, such as ALD. After the deposition of the inner spacer material layer, an anisotropic etching process may be performed to trim the deposited inner spacer material, such that only portions of the deposited inner spacer material that fill the recesses left by the lateral etching of the sacrificial layers 122 are left. After the trimming process, the remaining portions of the deposited inner spacer material are denoted as inner spacers 280. The inner spacers 280 serve to isolate metal gates from source/drain epitaxial structures formed in subsequent processing. In the example of FIG. 15C, sidewalls of the inner spacers 280 are laterally set back from sidewalls of the channel layers 124. In some other embodiments, sidewalls of the inner spacers 280 may be vertically aligned with sidewalls of the channel layers 124.

Source/drain epitaxial structures 290S/290D are formed in the recesses R1 in the fins FS. In greater detail, the source epitaxial structure 290S is formed in the recessed source region S of the fin FS, and drain epitaxial structure 290D is formed over the drain region D of the fin FS. The source/drain epitaxial structures 290S/290D may be formed by performing an epitaxial growth process that provides an epitaxial material on the fins FS. During the epitaxial growth process, the dummy gate structures 260 and gate spacers 270 limit the source/drain epitaxial structures 290S/290D to the source/drain regions S/D. Suitable epitaxial processes include CVD deposition techniques (e.g., vapor-phase epitaxy (VPE) and/or ultra-high vacuum CVD (UHV-CVD)), molecular beam epitaxy, and/or other suitable processes. The epitaxial growth process may use gaseous and/or liquid precursors, which interact with the composition of semiconductor materials of the fins FS and the channel layers 124.

In some embodiments, the source/drain epitaxial structures 290S/290D may include Ge, Si, GaAs, AlGaAs, SiGe, GaAsP, SiP, or other suitable material. The source/drain epitaxial structures 290S/290D may be in-situ doped during the epitaxial process by introducing doping species including: p-type dopants, such as boron; n-type dopants, such as phosphorus or arsenic; and/or other suitable dopants including combinations thereof. If the source/drain epitaxial structures 290S/290D are not in-situ doped, an implantation process (i.e., a junction implant process) is performed to dope the source/drain epitaxial structures 290S/290D. In some exemplary embodiments, the source/drain epitaxial structures 290S/290D in an NFET device include SiP, while those in a PFET device include GeSnB and/or SiGeSnB. In some embodiments, the source/drain epitaxial structures 290S/290D each include a first epitaxial layer 292 and a second epitaxial layer 294 over the first epitaxial layer 292. The first and second epitaxial layers 292 and 294 may be different at least in germanium atomic percentage (Ge %) or phosphorus concentration (P %). In some embodiments, the first epitaxial layer 292 may be not only grown from top surfaces of the fins FS, but also grown from end surfaces of the channel layers 124.

Figure 16A:
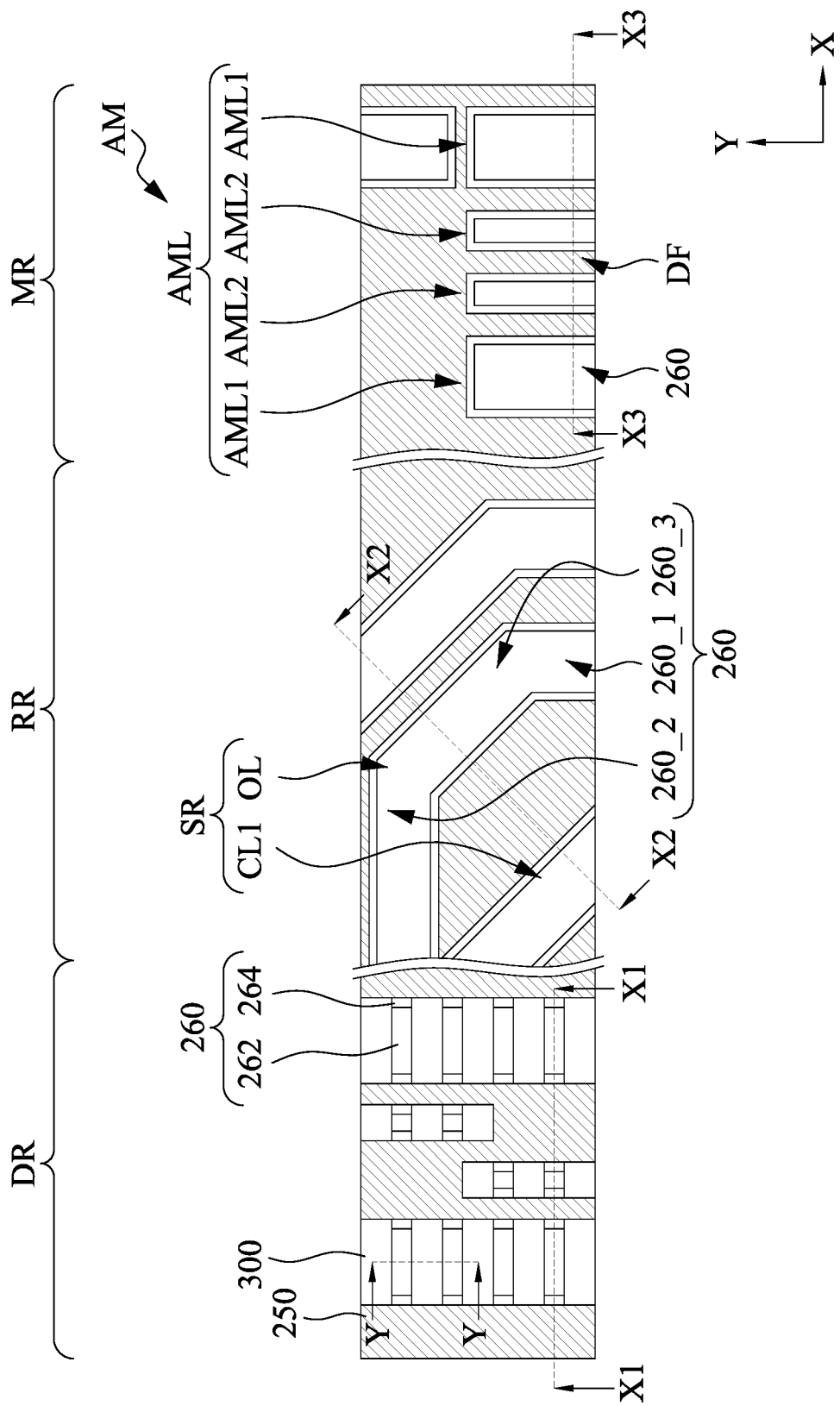
Figure 16B:
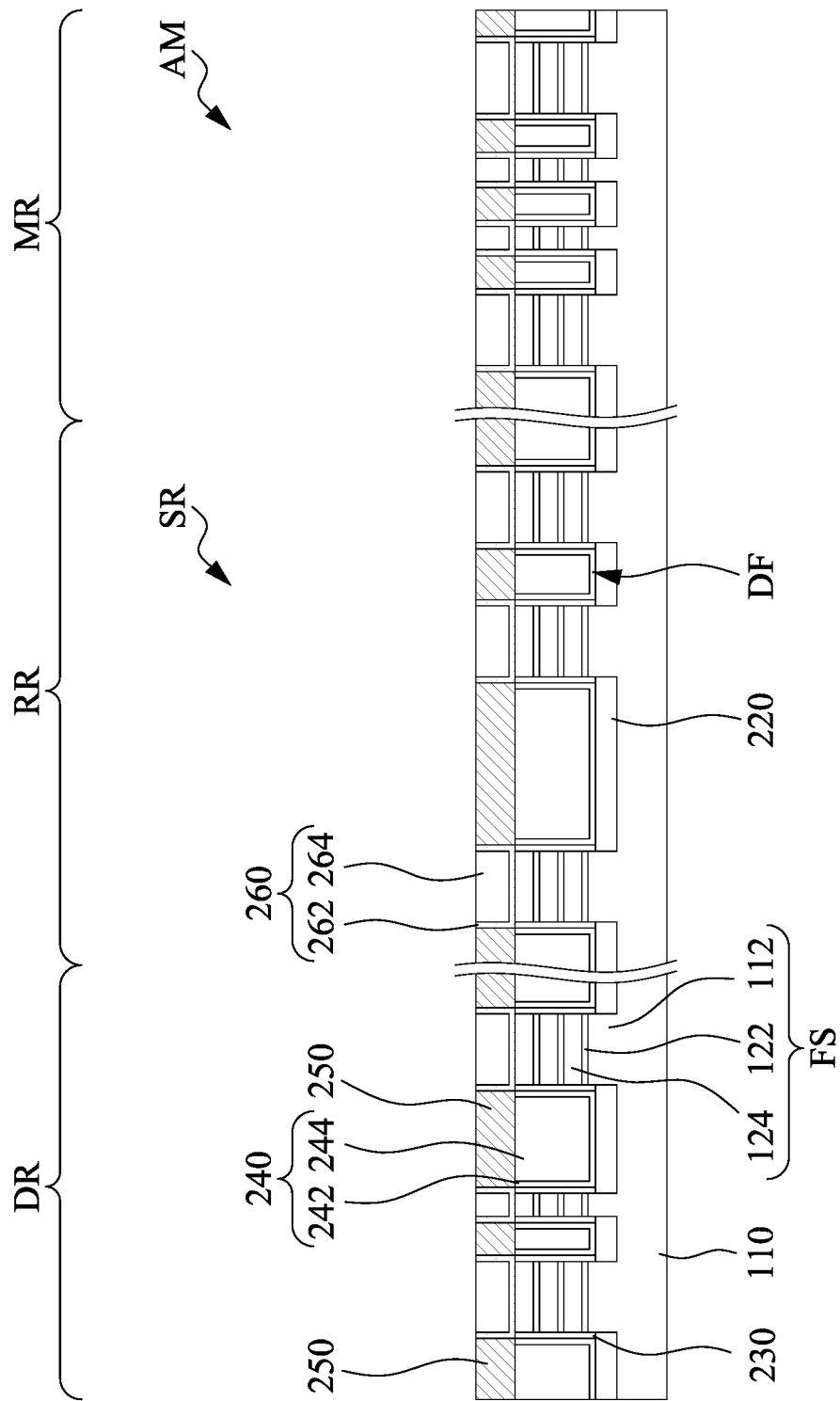
Figure 16C:
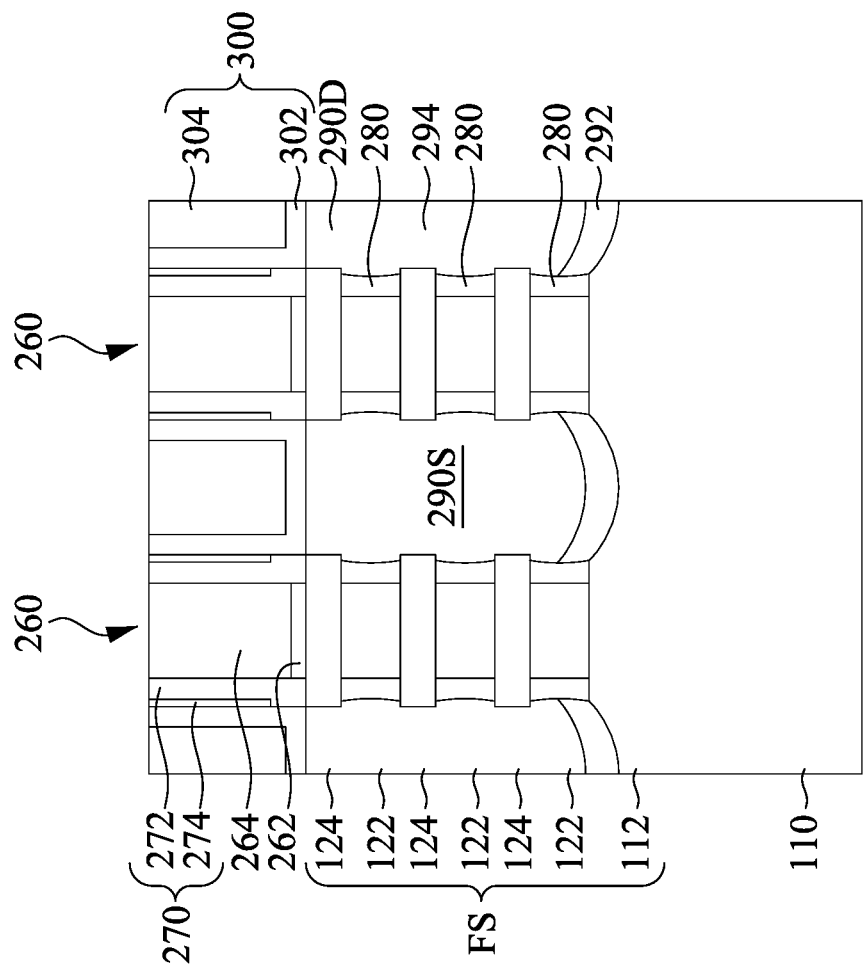

Reference is made to FIGS. 16A-16C. FIG. 16B is a cross-sectional view taken along cuts X1-X1, X2-X2, and X3-X3 in FIG. 16A, and FIG. 16C is a cross-sectional view taken along cut Y-Y in FIG. 16A. A dielectric material 300 is formed over the substrate 110 and filling the space between the dummy gate structures 260. In some embodiments, the dielectric material 300 includes a contact etch stop layer (CESL) 302 and an interlayer dielectric (ILD) layer 304 formed in sequence. In some examples, the CESL 302 includes a silicon nitride layer, silicon oxide layer, a silicon oxynitride layer, and/or other suitable materials having a different etch selectivity than the ILD layer 304. The CESL 302 may be formed by plasma-enhanced chemical vapor deposition (PECVD) process and/or other suitable deposition or oxidation processes. The ILD layer 304 is then deposited over the CESL 302. In some embodiments, the ILD layer 304 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials having a different etch selectivity than the CESL 302. The ILD layer 304 may be deposited by a PECVD process or other suitable deposition technique. In some embodiments, after formation of the ILD layer 304, the integrated circuit structure may be subject to a high thermal budget process to anneal the ILD layer 304.

After depositing the ILD layer 304, a planarization process may be performed to remove excessive materials of the ILD layer 304. For example, a planarization process includes a chemical mechanical planarization (CMP) process which removes portions of the ILD layer 304 and the CESL layer 302 overlying the dummy gate structures 260 and planarizes a top surface of the integrated circuit structure. In some embodiments, the CMP process also removes hard mask layer 266 in the dummy gate structures 260 (as shown in FIGS. 15B and 15C) and exposes the dummy gate electrode layer 264. Moreover, as illustrated in FIGS. 16A-16C, the CMP process is performed until the top surfaces of the dielectric caps 250 are exposed, thus breaking a single continuous dummy gate structure 260 into multiple dummy gate structures 260 separated by the dielectric caps 250. As a result, an additional gate cut process can be skipped.

As shown in FIG. 16A, in the top view, the dummy gate structure 260 in the seal ring region RR may have dummy gate lines 260_1, 260_2, and 260_3, in which the dummy gate lines 260_1 and 260_2 respectively extend along the directions X and Y, and the dummy gate line 260_3 is slanted and connecting the dummy gate line 260_1 to the dummy gate line 260_2. The dummy gate structures 260 in the seal ring region RR may correspond to the lines of the seal ring SR in FIGS. 2A and 2B, for example, the lines of outer ring OL and the corner portion CL1. As shown in the top view of FIG. 7B, in the mark region MR, the dummy gate structures 260 corresponds to the alignment lines AML of the alignment mark AM in FIG. 3, for example, the main lines AML1 and dummy lines AML2. In the figures, the widths of the dummy gate structures 260 in the regions DR, RR, and MR are not drawn to scale. For example, the smallest width of the dummy gate structures 260 in the regions RR and MR may be greater than the smallest width of the dummy gate structures 260 in the region DR.

Figure 17A:
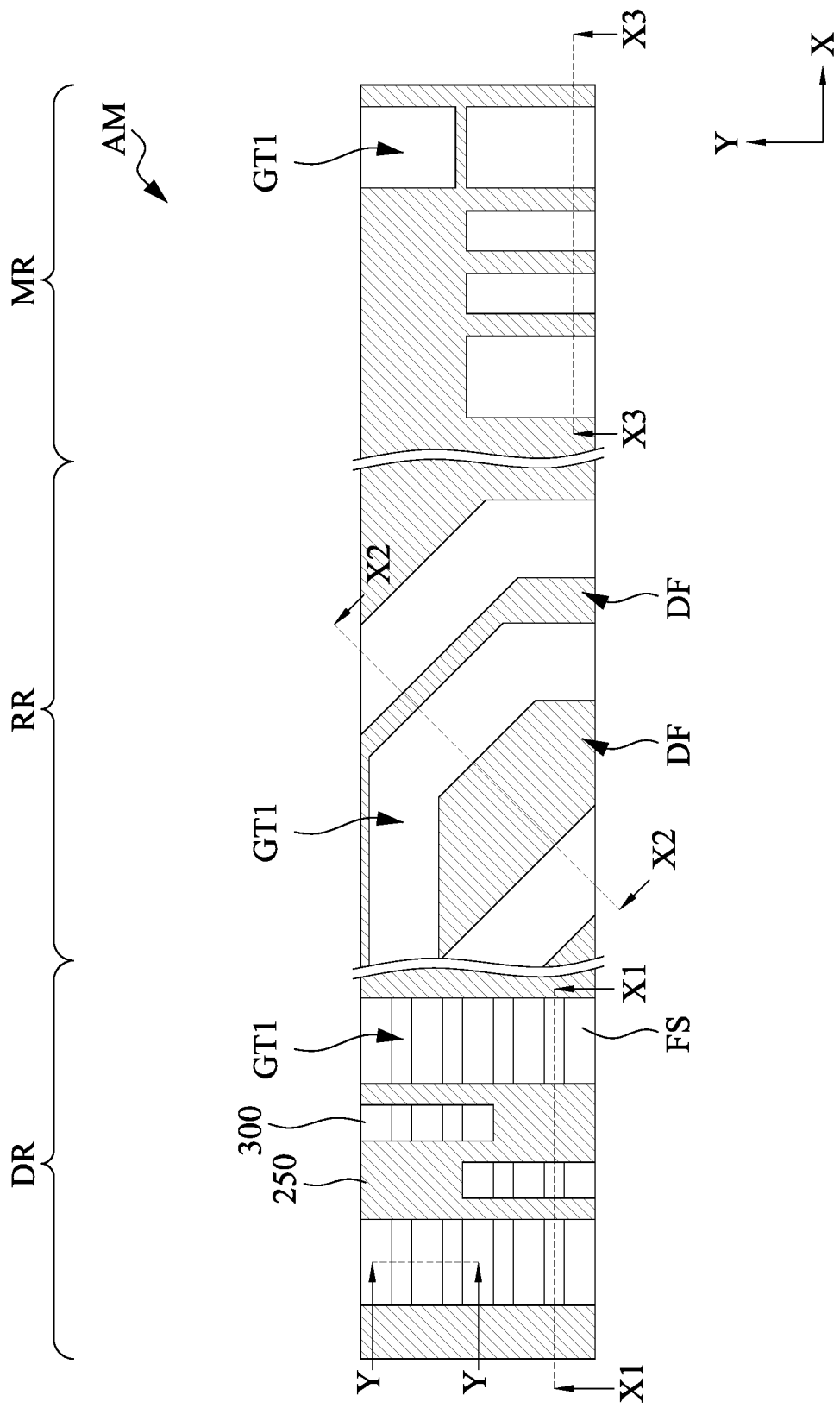
Figure 17B:
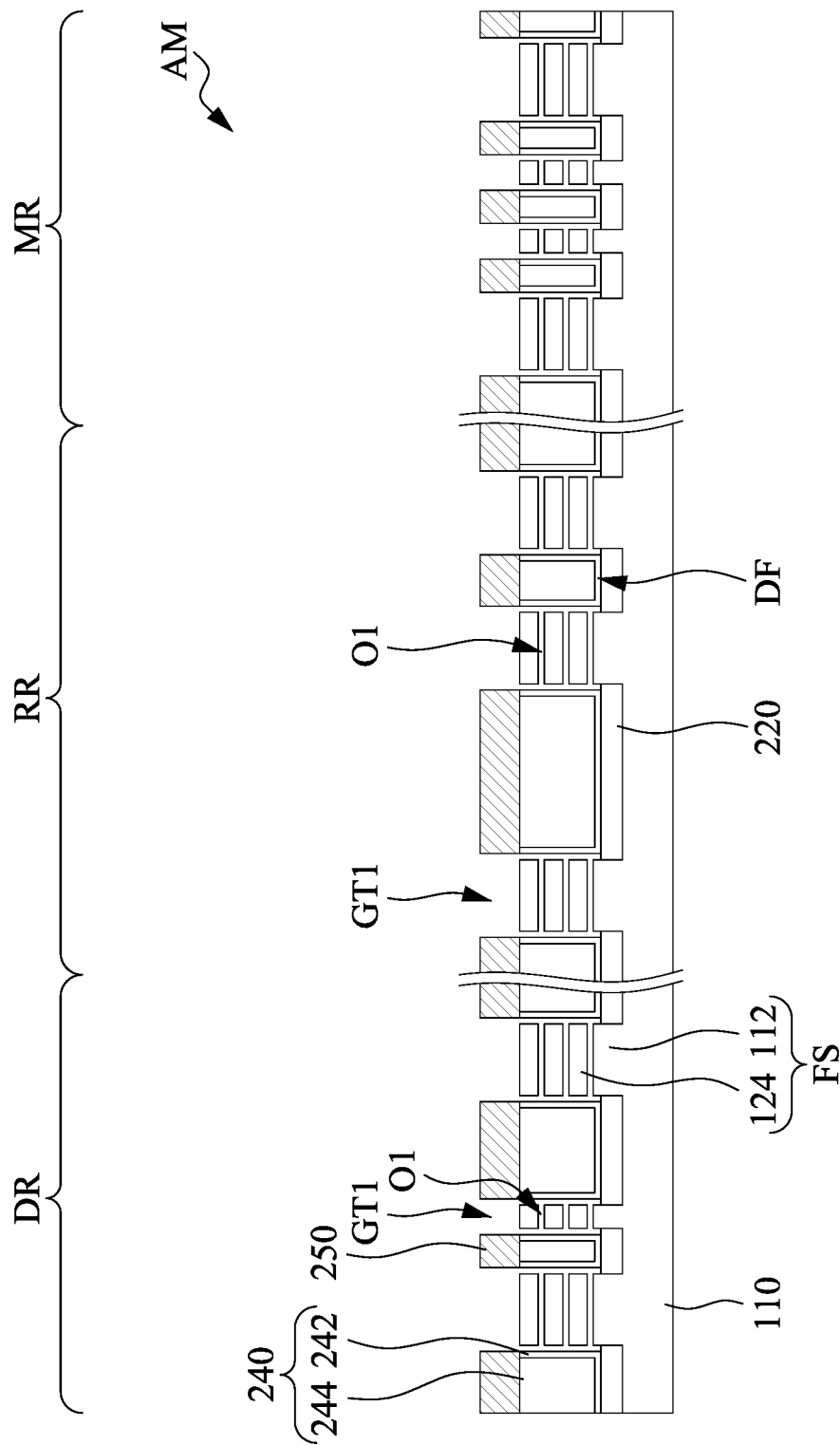
Figure 17C:
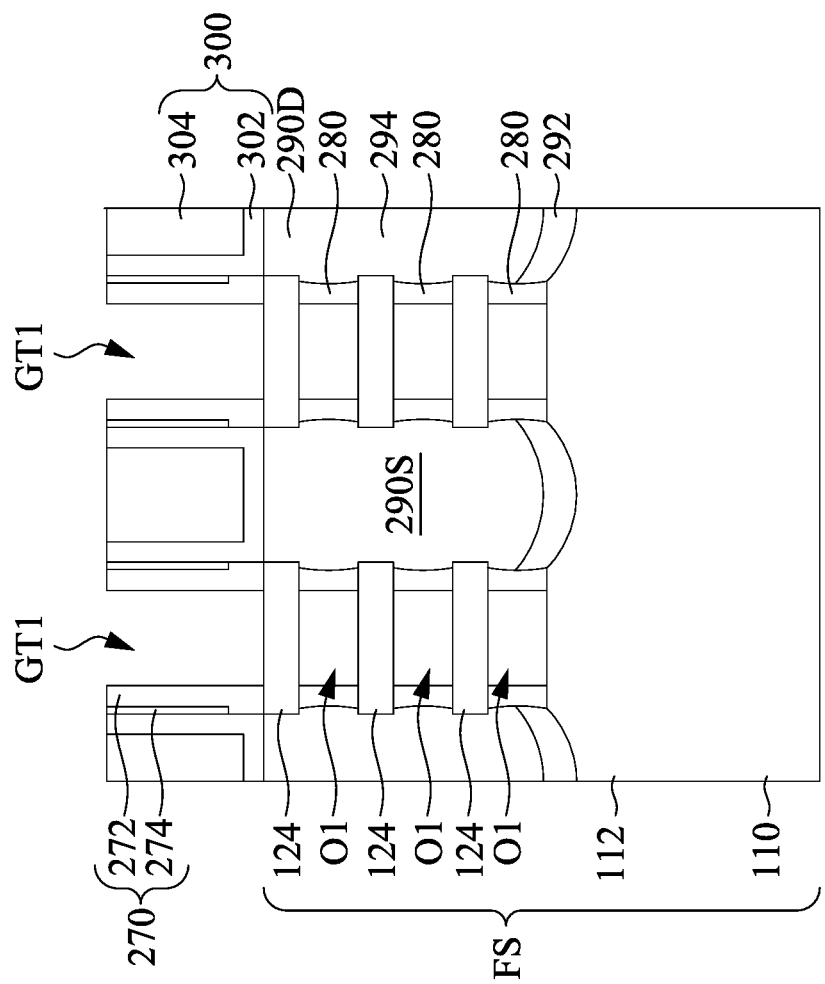

Reference is made to FIGS. 17A-17C. FIG. 17B is a cross-sectional view taken along cuts X1-X1, X2-X2, and X3-X3 in FIG. 17A, and FIG. 17C is a cross-sectional view taken along cut Y-Y in FIG. 17A. The dummy gate structures 260 (referring to FIGS. 16A-16C) are removed, followed by removing the sacrificial layers 122 (referring to FIGS. 16B and 16C).

In the illustrated embodiments, the dummy gate structures 260 (referring to FIGS. 16A-16C) are removed by using a selective etching process (e.g., selective dry etching, selective wet etching, or a combination thereof) that etches the materials in dummy gate structures 260 (referring to FIGS. 16A-16C) at a faster etch rate than it etches other materials (e.g., gate spacers 270, CESL 302 and/or ILD layer 304), thus resulting in gate trenches GT1 between corresponding gate spacers 270, with the sacrificial layers 122 and the sacrificial epitaxial structures 230 (referring to FIGS. 16B and 16C) exposed in the gate trenches GT1. Subsequently, the sacrificial layers 122 and the sacrificial epitaxial structures 230 in the gate trenches GT1 are etched by using another selective etching process that etches the sacrificial layers 122 and the sacrificial epitaxial structures 230 at a faster etch rate than it etches the channel layers 124, thus forming openings/spaces O1 between neighboring channel layers 124. In this way, the channel layers 124 become nanosheets suspended over the substrate 110 and between the source/drain epitaxial structures 290S/290D. This step is also called a channel release process. At this interim processing step, the openings O1 between nanosheets 124 may be filled with ambient environment conditions (e.g., air, nitrogen, etc). In some embodiments, the nanosheets 124 can be interchangeably referred to as nanowires, nanoslabs and nanorings, depending on their geometry. For example, in some other embodiments the channel layers 124 may be trimmed to have a substantial rounded shape (i.e., cylindrical) due to the selective etching process for completely removing the sacrificial layers 122. In that case, the resultant channel layers 124 can be called nanowires.

In some embodiments, the sacrificial layers 122 and the sacrificial epitaxial structures 230 are removed by using a selective wet etching process. In some embodiments, the sacrificial layers 122 and the sacrificial epitaxial structures 230 are SiGe and the channel layers 124 are silicon allowing for the selective removal of the sacrificial layers 122 and the sacrificial epitaxial structures 230. In some embodiments, the selective wet etching includes an APM etch (e.g., ammonia hydroxide-hydrogen peroxide-water mixture). In some embodiments, the selective removal includes SiGe oxidation followed by a $SiGeO_x$ removal. For example, the oxidation may be provided by $O_3$ clean and then $SiGeO_x$ removed by an etchant such as $NH_4OH$ that selectively etches $SiGeO_x$ at a faster etch rate than it etches Si. Moreover, because oxidation rate of Si is much lower (sometimes 30 times lower) than oxidation rate of SiGe, the channel layers 124 may remain substantially intact during the channel release process. In some embodiments, both the channel release step and the previous step of laterally recessing sacrificial layers use a selective etching process that etches SiGe at a faster etch rate than etching Si, and therefore these two steps may use the same etchant chemistry in some embodiments. In this case, the etching time/duration of channel release step is longer than the etching time/duration of the previous step of laterally recessing sacrificial layers, so as to completely remove the sacrificial SiGe layers.

Figure 18A:
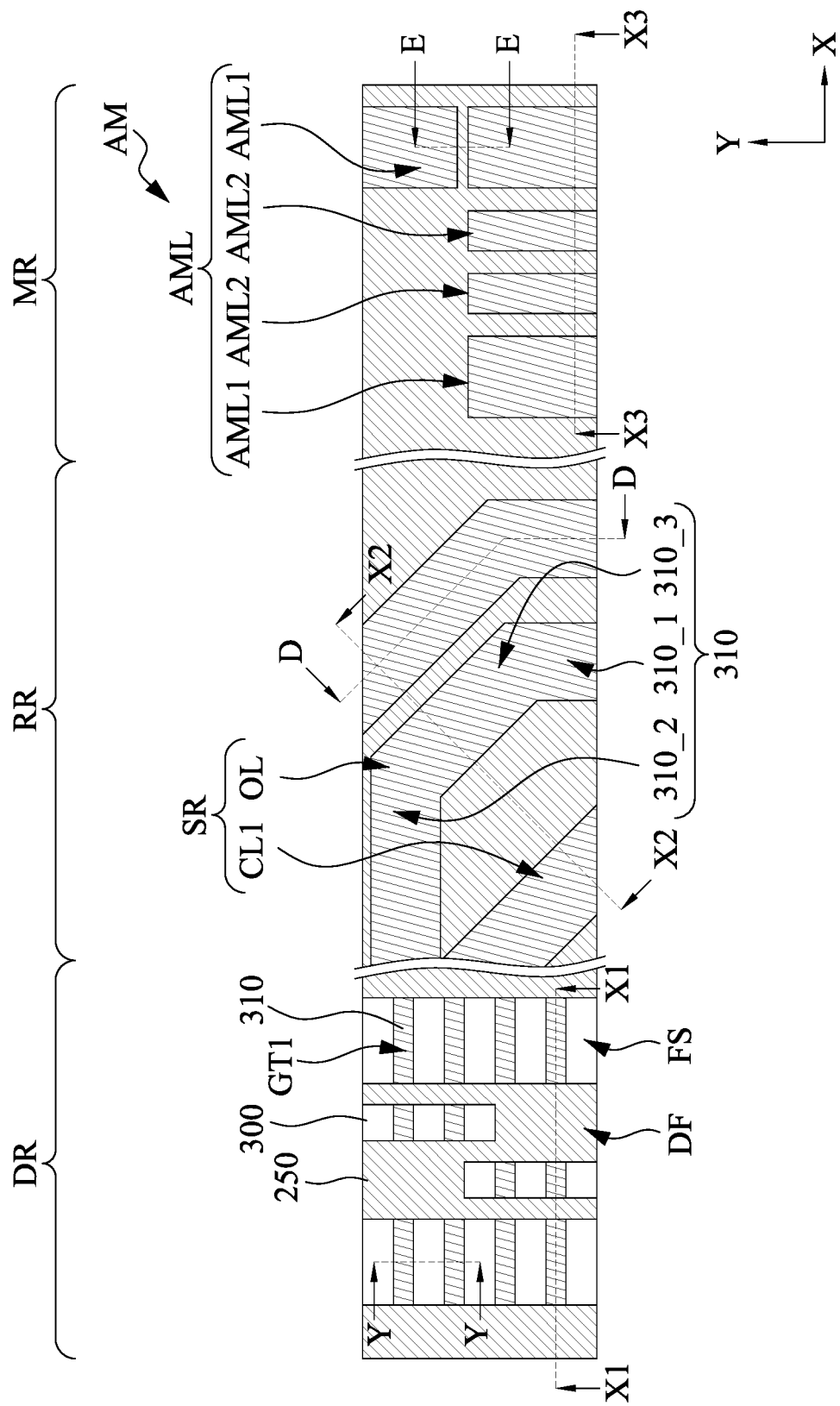
Figure 18B:
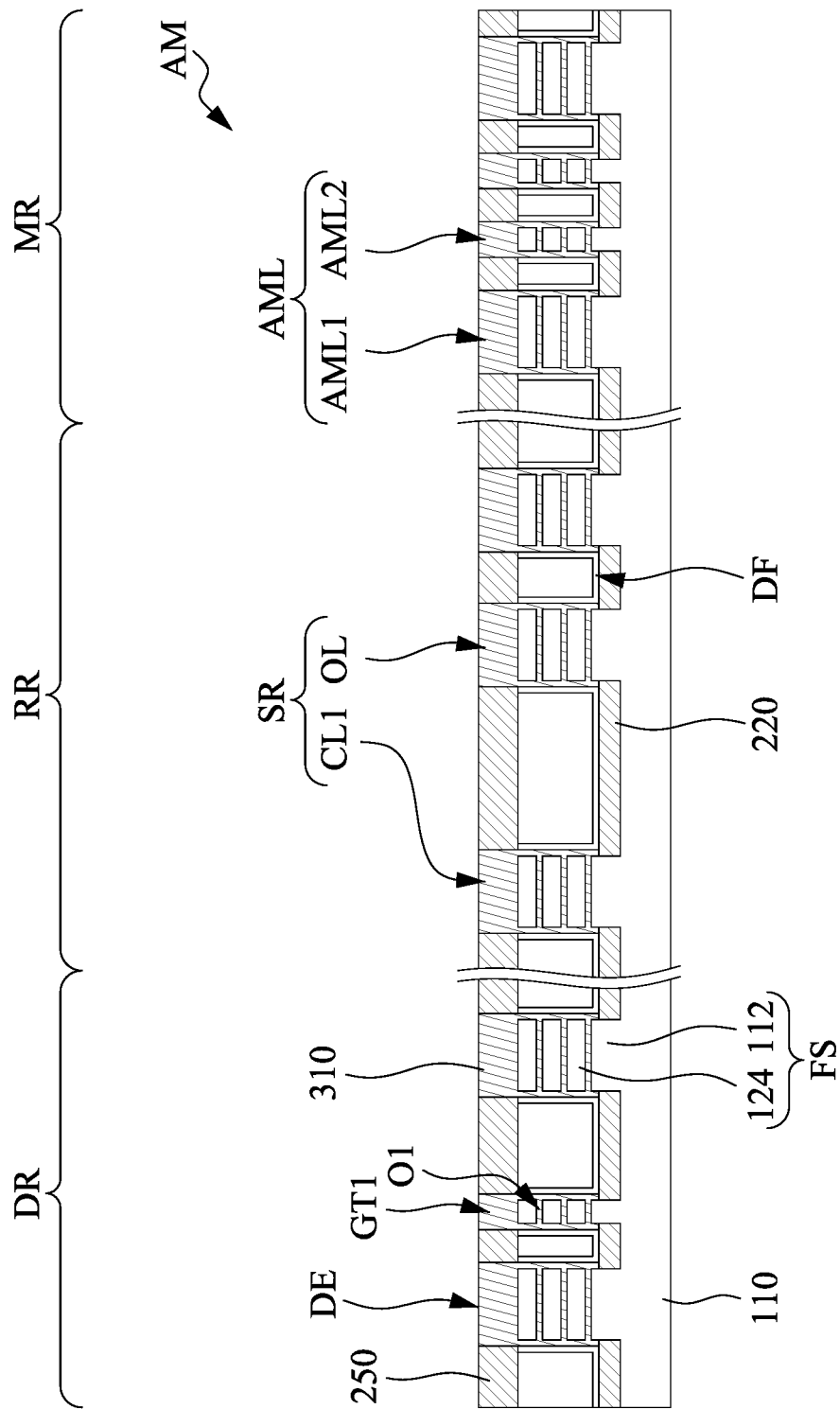
Figure 18C:
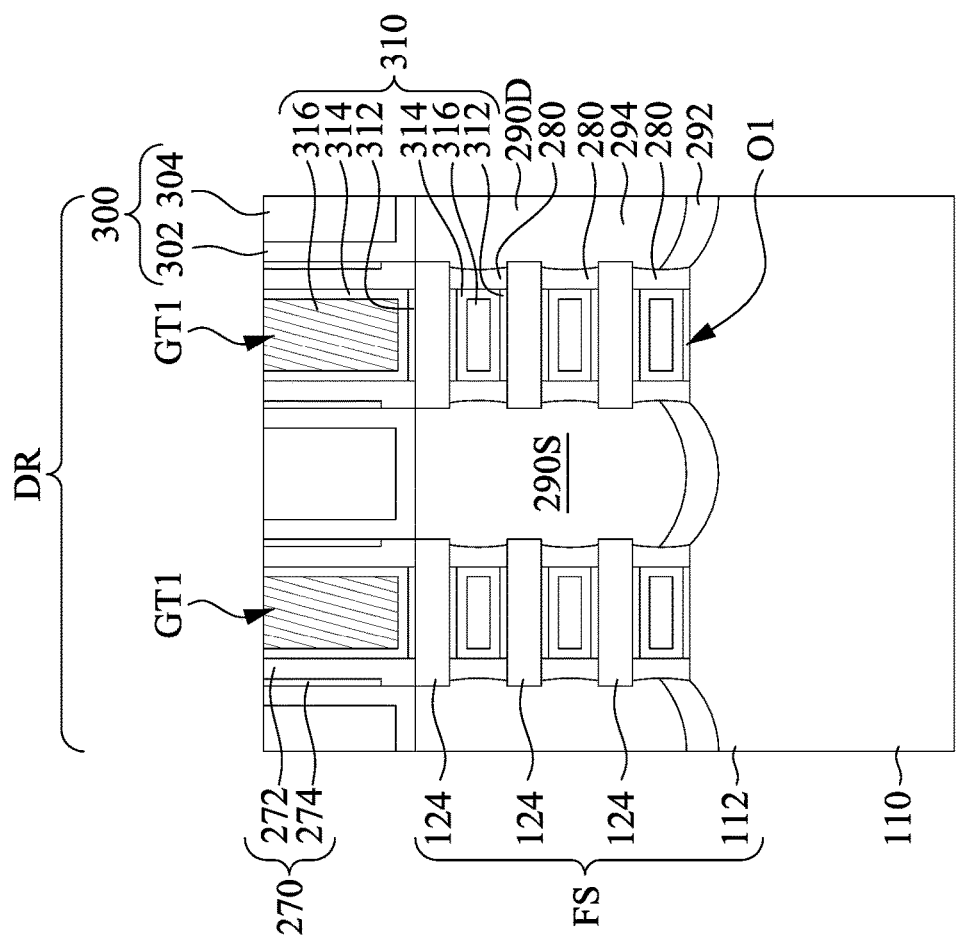
Figure 18D:
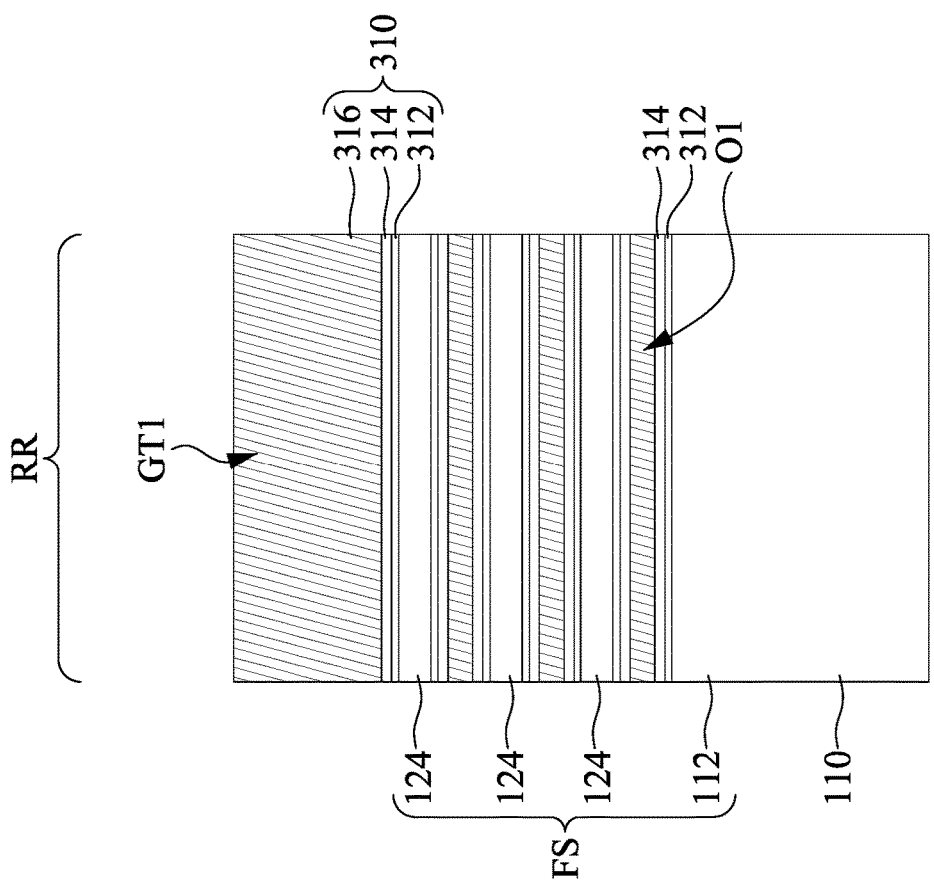
Figure 18E:
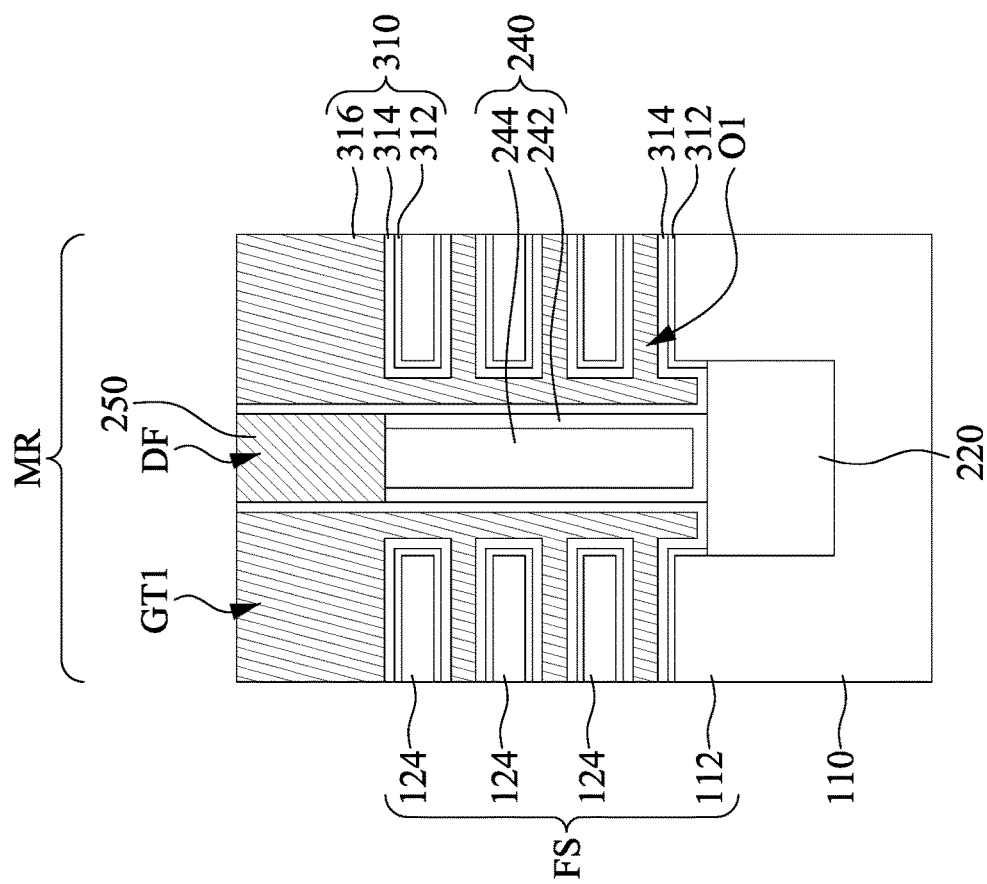

Reference is made to FIGS. 18A-18C. FIG. 18B is a cross-sectional view taken along cut X-X in FIG. 18A, FIG. 18C is a cross-sectional view taken along cut Y-Y in FIG. 18A, FIG. 18D is a cross-sectional view taken along cut D-D in FIG. 18A, and FIG. 18E is a cross-sectional view taken along cut E-E in FIG. 18A. Replacement gate structures 310 are respectively formed in the gate trenches GT1 to surround each of the nanosheets 124 suspended in the gate trenches GT1. The gate structures 310 may be final gates of GAA FETs. The final gate structure may be a high-k/metal gate stack, however other compositions are possible. In some embodiments, each of the gate structures 310 forms the gate associated with the multi-channels provided by the plurality of nanosheets 124. For example, high-k/metal gate structures 310 are formed within the openings O1 provided by the release of nanosheets 124.

As shown in FIG. 18A, in the top view, the gate structure 310 in the seal ring region RR may have gate lines 310_1, 310_2, and 310_3, in which the gate lines 310_1 and 310_2 respectively extend along the directions X and Y, and the gate line 310_3 is slanted and connecting the gate line 310_1 to the gate line 310_2. The gate structures 310 in the seal ring region RR may correspond to the lines of the seal ring SR in FIGS. 2A and 2B, for example, the lines of the outer ring OL and the corner portion CL1. As shown in the top view of FIG. 7B, in the mark region MR, the gate structures 310 corresponds to the alignment lines AML of the alignment mark AM in FIG. 3, for example, the main lines AML1 and dummy lines AML2. In the figures, the widths of the gate structures 310 in the regions DR, RR, and MR are not drawn to scale. For example, the smallest width of the gate structures 310 in the regions RR and MR may be greater than the smallest width of the gate structures 310 in the region DR.

Referring to FIGS. 18C-18E, in various embodiments, the high-k/metal gate structure 310 includes a interfacial layer 312 formed around the nanosheets 124, a high-k gate dielectric layer 314 formed around the interfacial layer 312, and a gate metal layer 316 formed around the high-k gate dielectric layer 314 and filling a remainder of gate trenches GT1. Formation of the high-k/metal gate structures 310 may include one or more deposition processes to form various gate materials, followed by a CMP processes to remove excessive gate materials, resulting in the high-k/metal gate structures 310 having top surfaces level with a top surface of the ILD layer 304. Thus, devices DE (e.g., GAA FET) are formed, and the high-k/metal gate structure 310 surrounds each of the nanosheets 124, and thus is referred to as a gate of the device DE (e.g., GAA FET).

In some embodiments, the interfacial layer 312 is silicon oxide formed on exposed surfaces of semiconductor materials in the gate trenches GT1 by using, for example, thermal oxidation, chemical oxidation, wet oxidation or the like. As a result, surface portions of the nanosheets 124 and the substrate 110 exposed in the gate trenches GT1 are oxidized into silicon oxide to form interfacial layer 312.

In some embodiments, the high-k gate dielectric layer 314 includes dielectric materials such as hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), the like, or combinations thereof.

In some embodiments, the gate metal layer 316 includes one or more metal layers. For example, the gate metal layer 316 may include one or more work function metal layers stacked one over another and a fill metal filling up a remainder of gate trenches GT1. The one or more work function metal layers in the gate metal layer 316 provide a suitable work function for the high-k/metal gate structures 310. For an n-type GAA FET, the gate metal layer 316 may include one or more n-type work function metal (N-metal) layers. The n-type work function metal may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type GAA FET, the gate metal layer 316 may include one or more p-type work function metal (P-metal) layers. The p-type work function metal may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. In some embodiments, the fill metal in the gate metal layer 316 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Figure 19A:
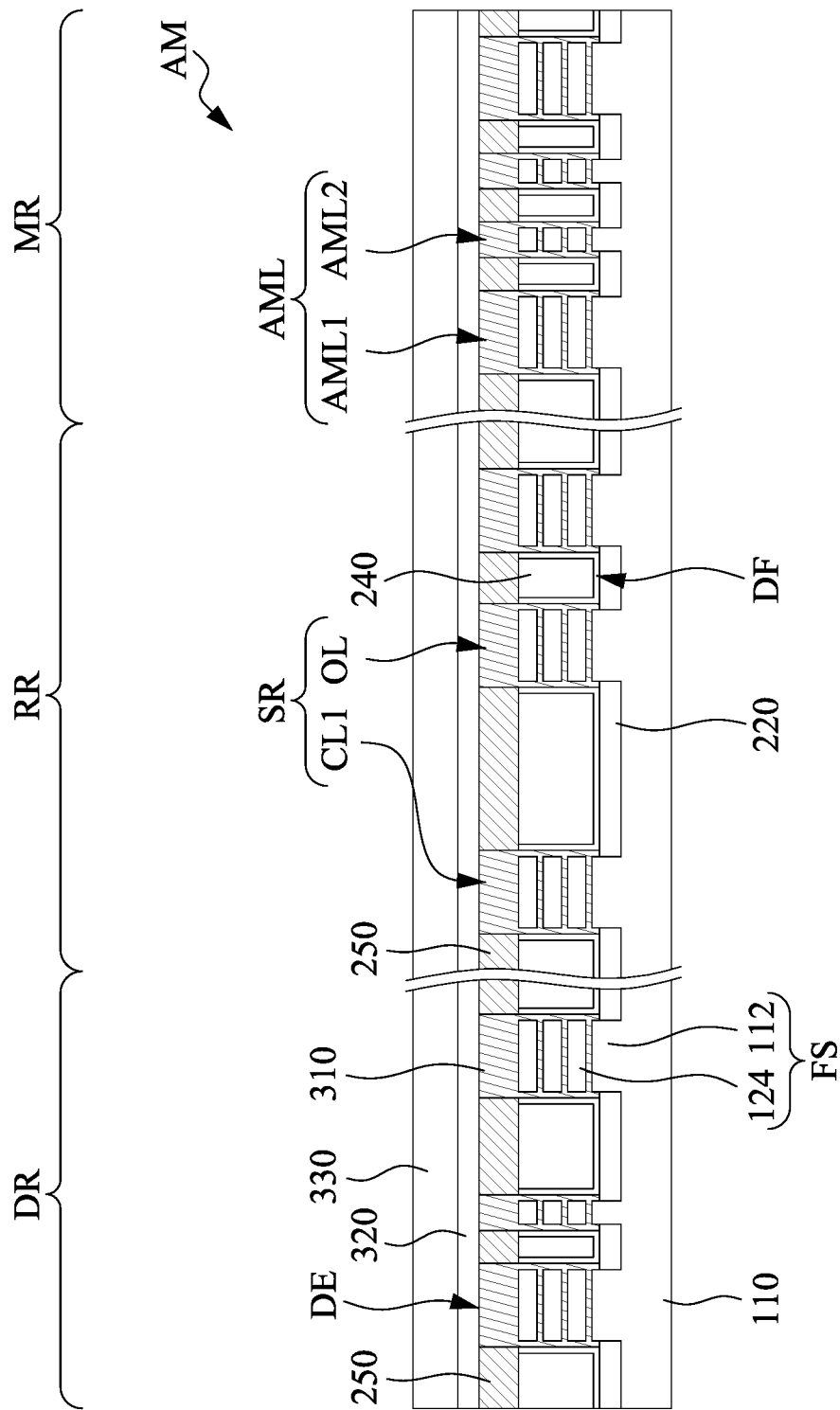
Figure 19B:
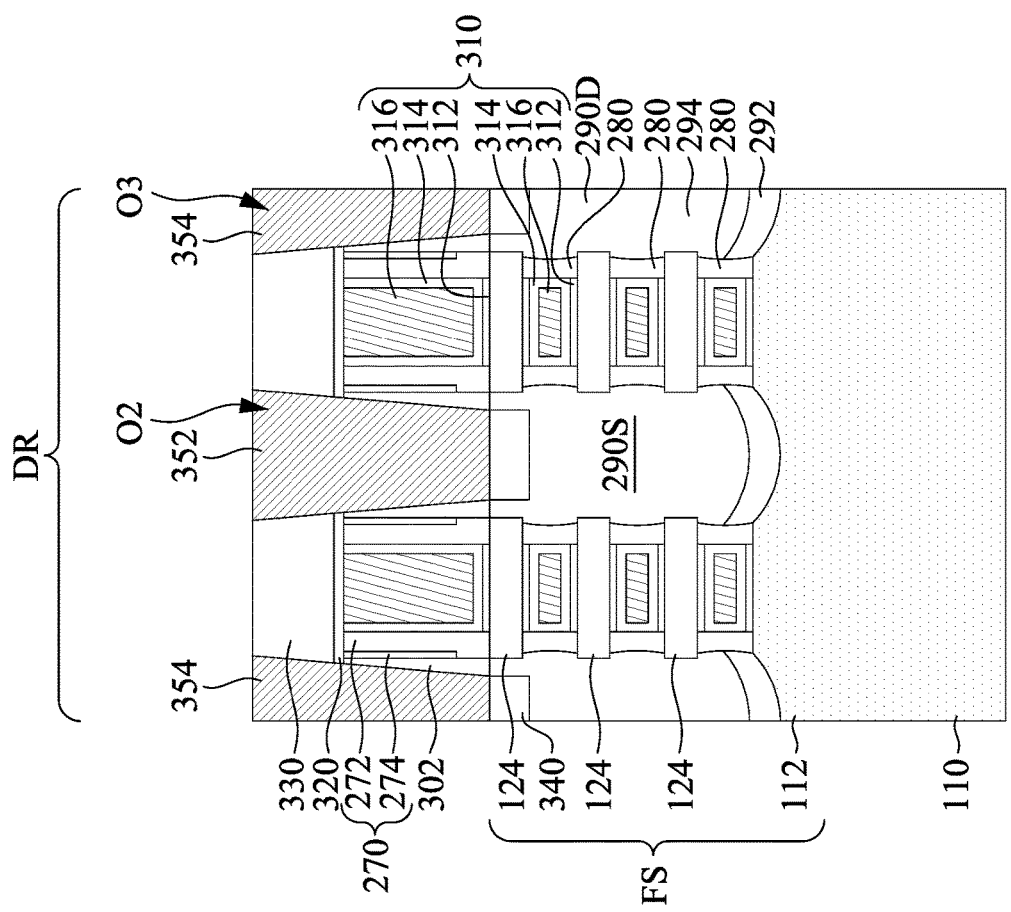

FIGS. 19A and 19B illustrate cross-sectional views of formations of source/drain contacts. Another CESL 320 and another ILD layer 330 are formed over the structure of FIGS. 18B-18C. The CESL 320 may be formed of a similar material to the CESL 302 by using similar deposition techniques to the CESL 302 as discussed previously, and thus are not described again for the sake of brevity. The ILD layer 330 may be formed of a similar material to the ILD layer 304 by using similar deposition techniques to the ILD layer 304 as discussed previously, and thus are not described again for the sake of brevity.

Source/drain contact openings O2/O3 are then formed using one or more etching processes to etch through the ILD layers 330, 304, and the CESL 320, 302. The Source/drain contact openings O2/O3 expose surfaces of the source/drain epitaxial structures 290S/290D. Metal silicide regions 340 are formed on exposed surfaces of the source/drain epitaxial structures 290S/290D by using a silicidation process. Silicidation may be formed by blanket depositing a metal layer over the exposed source/drain epitaxial structures 290S/290D, annealing the metal layer such that the metal layer reacts with silicon (and germanium if present) in the source/drain epitaxial structures 290S/290D to form the metal silicide regions 340, and thereafter removing the non-reacted metal layer. In some embodiments, the metal layer used in the silicidation process includes nickel, cobalt, titanium, tantalum, platinum, tungsten, other noble metals, other refractory metals, rare earth metals or their alloys.

In some embodiments, a source contact 352 is over the source epitaxial structure 250S and drain contacts 354 are formed over the drain epitaxial structure 250D. In some embodiments, the source/drain contact formation step deposits one or more metal materials (e.g., W, Ru, Co, Cu, Ti, TiN, Ta, TaN, Mo, Ni, the like or combinations thereof) to fill the source/drain contact openings O2/O3 by using suitable deposition techniques (e.g., CVD, PVD, ALD, the like or combinations thereof), followed by a CMP process to remove excess metal materials outside the source/drain contact openings, while leaving metal materials in the source/drain contact openings O2/O3 to serve as the source/drain contacts 352 and 354.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the process for fabricating the alignment mark and the seal rings can be integrated with that of the nanosheet device, thereby saving cost for less mask. Another advantage is that the nanosheet structures may have a large critical dimension compared to a fin structure, thereby achieving a better process control for less line collapse. Still another advantage is that the nanosheet structure can also apply for inline monitor patterns, such as physical, optical, electrical measurement patterns.

In some embodiments of the present disclosure, a method for fabricating an integrated circuit structure is provided. The method includes forming an epitaxial stack over a semiconductor substrate, wherein the epitaxial stack comprises a plurality of first epitaxial layers and a plurality of second epitaxial layers alternately arranged over the semiconductor substrate; patterning the epitaxial stack into a first fin and a second fin, wherein from a top view the first fin extends along a first direction, and the second fin has a first fin line extending along the first direction and a second fin line extending along a second direction different from the first direction; forming a first gate structure over a first portion of the first fin; etching a recess in a second portion of the first fin adjacent the first portion of the first fin; and forming a source/drain feature in the recess.

In some embodiments of the present disclosure, a method for fabricating an integrated circuit structure is provided. The method includes depositing an epitaxial stack over a semiconductor substrate, wherein the epitaxial stack comprises a plurality of first epitaxial layers and a plurality of second epitaxial layers alternately arranged over the semiconductor substrate; patterning the epitaxial stack into a first fin and a second fin, wherein the first fin is over a device region of the semiconductor substrate, and the second fin is over a scribe line region of the semiconductor substrate surrounding the device region; forming a first gate structure over a first portion of the first fin; etching a recess in a second portion of the first fin adjacent the first portion of the first fin; and epitaxially growing a source/drain feature in the recess.

In some embodiments of the present disclosure, an integrated circuit structure includes a semiconductor substrate, a transistor, and a first seal ring. The transistor is over the semiconductor substrate. The transistor comprises a first plurality of semiconductor nanostructures and a first gate structure wrapping around the first plurality of semiconductor nanostructures. The first seal ring is over the semiconductor substrate and surrounding the transistor from a top view. The the first seal ring comprises a second plurality of semiconductor nanostructures and a second gate structure wrapping around the second plurality of semiconductor nanostructures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming an epitaxial stack over a semiconductor substrate, wherein the epitaxial stack comprises a plurality of first epitaxial layers and a plurality of second epitaxial layers alternately arranged over the semiconductor substrate;
   patterning the epitaxial stack into a first fin and a second fin, wherein from a top view the first fin extends along a first direction, and the second fin has a first fin line extending along the first direction and a second fin line extending along a second direction different from the first direction;
   forming a first gate structure over a first portion of the first fin;
   etching a recess in a second portion of the first fin adjacent the first portion of the first fin; and
   forming a source/drain feature in the recess, wherein forming the first gate structure comprises:
      depositing gate materials over the first fin and the second fin, wherein the gate materials comprise a gate dielectric layer, a gate electrode layer, and a hard mask layer;
      patterning the gate materials to expose the second portion of the first fin prior to etching the recess in the second portion of the first fin, wherein the patterned gate materials cover an entirety of the second fin; and
      performing a planarization process to the patterned gate materials, wherein a remaining portion of the patterned gate materials form the first gate structure.

2. The method of claim 1, further comprising:
   forming a dielectric fin alongside the second fin prior to forming the first gate structure, the dielectric fin comprising a high-k dielectric cap.

3. The method of claim 2, wherein forming the dielectric fin is performed such that the dielectric fin comprises a first dielectric line extending along the first direction and a second dielectric line extending along the second direction from the top view.

4. The method of claim 1, further comprising:
   forming a second gate structure over the second fin, wherein the second gate structure has a first gate line and a second gate line, the first gate line is over the first fin line of the second fin and extends along the first direction from the top view, and the second gate line is over the second fin line of the second fin and extends along the second direction from the top view.

5. The method of claim 4, further comprising:
   removing the first and second gate structures from the first and second fins to leave a first gate trench and a second gate trench;
   removing the first epitaxial layers in the first and second gate trenches to leave at least one first space between the second epitaxial layers in the first fin and at least one second space between the second epitaxial layers in the second fin;
   forming a first metal gate structure in the first gate trench and the first space; and
   forming a second metal gate structure in the second gate trench and the second space.

6. The method of claim 5, wherein forming the second metal gate structure is performed such that the second metal gate structure has a first metal gate line and a second metal gate line, the first metal gate line is over the first fin line of the second fin and extends along the first direction from the top view, and the second metal gate line is over the second fin line of the second fin and extends along the second direction from the top view.

7. The method of claim 1, wherein etching the recess in the second portion of the first fin uses the hard mask layer of the patterned gate materials as an etch mask.

8. The method of claim 2, wherein forming the dielectric fin further comprises:
   depositing a fill dielectric; and
   forming the high-k dielectric cap over the fill dielectric.

9. A method comprising:
   depositing an epitaxial stack over a semiconductor substrate, wherein the epitaxial stack comprises a plurality of first epitaxial layers and a plurality of second epitaxial layers alternately arranged over the semiconductor substrate;
   patterning the epitaxial stack into a first fin and a second fin, wherein the first fin is over a device region of the semiconductor substrate, and the second fin is over a scribe line region of the semiconductor substrate surrounding the device region;
   forming a first gate structure over a first portion of the first fin;

etching a recess in a second portion of the first fin adjacent the first portion of the first fin; and epitaxially growing a source/drain feature in the recess, wherein forming the first gate structure comprises:

forming a gate material layer over the first fin and the second fin, wherein the gate material layer comprises a gate dielectric layer, a gate electrode layer, and a hard mask layer;

patterning the gate material layer to expose the second portion of the first fin prior to etching the recess in the second portion of the first fin, wherein the patterned gate material layer covers an entirety of the second fin; and performing a planarization process to the patterned gate material layer, wherein a remaining portion of the patterned gate material layer forms the first gate structure.

10. The method of claim 9, further comprising:
forming a second gate structure over the second fin.

11. The method of claim 10, further comprising:
removing the first and second gate structures from the first and second fins to leave a first gate trench and a second gate trench;

removing the first epitaxial layers in the first and second gate trenches to leave at least one first space between the second epitaxial layers in the first fin and at least one second space between the second epitaxial layers in the second fin;

forming a first metal gate structure in the first gate trench and the first space; and forming a second metal gate structure in the second gate trench and the second space.

12. The method of claim 9, wherein etching the recess in the second portion of the first fin uses the hard mask layer of the patterned gate material layer as an etch mask.

13. The method of claim 9, further comprising:
forming a dielectric fin alongside the second fin prior to forming the first gate structure, the dielectric fin comprising a high-k dielectric cap.

14. The method of claim 13, wherein forming the dielectric fin further comprises:
depositing a fill dielectric; and
forming the high-k dielectric cap over the fill dielectric.

15. A method comprising:
forming an epitaxial stack over a semiconductor substrate, wherein the epitaxial stack comprises a plurality of first epitaxial layers and a plurality of second epitaxial layers alternately arranged over the semiconductor substrate;

shaping the epitaxial stack into a first fin and a second fin, wherein from a top view, the second fin comprises a first fin line and a second fin line, the first fin line extends along a first direction, and the second fin line originates from an edge of the first fin line and extends along a second direction different from the first direction;

forming a first gate structure over a first portion of the first fin;

etching a recess in a second portion of the first fin adjacent the first portion of the first fin; and forming a source/drain feature in the recess, wherein forming the first gate structure comprises:

depositing gate materials over the first fin and the second fin, wherein the gate materials comprise a gate dielectric layer, a gate electrode layer, and a hard mask layer;

patterning the gate materials to expose the second portion of the first fin prior to etching the recess in the second portion of the first fin, wherein the patterned gate materials cover an entirety of the second fin; and performing a planarization process to the patterned gate materials, wherein a remaining portion of the patterned gate materials form the first gate structure.

16. The method of claim 15, further comprising:
forming a dielectric fin alongside the second fin prior to forming the first gate structure, the dielectric fin comprising a high-k dielectric cap.

17. The method of claim 16, wherein forming the dielectric fin is performed such that the dielectric fin comprises a first dielectric line extending along the first direction and a second dielectric line extending along the second direction from the top view.

18. The method of claim 15, further comprising:
forming a second gate structure over the second fin, wherein the second gate structure has a first gate line and a second gate line, the first gate line is over the first fin line of the second fin and extends along the first direction from the top view, and the second gate line is over the second fin line of the second fin and extends along the second direction from the top view.

19. The method of claim 15, wherein the second fin further comprises a third fin line, the third fin line originates from another edge of the first fin line and extends along a third direction different from the first and second directions.

20. The method of claim 15, wherein the first fin extends along the first direction.

* * * * *